(12) United States Patent
Hiroyama et al.

(10) Patent No.: US 8,750,343 B2
(45) Date of Patent: Jun. 10, 2014

(54) NITRIDE-BASED SEMICONDUCTOR LIGHT-EMITTING DEVICE, NITRIDE-BASED SEMICONDUCTOR LASER DEVICE, NITRIDE-BASED SEMICONDUCTOR LIGHT-EMITTING DIODE, METHOD OF MANUFACTURING THE SAME, AND METHOD OF FORMING NITRIDE-BASED SEMICONDUCTOR LAYER

(75) Inventors: Ryoji Hiroyama, Kyo-tanabe (JP); Yasuto Miyake, Hirakata (JP); Yasumitsu Kuno, Tottori (JP); Yasuyuki Bessho, Uji (JP); Masayuki Hata, Takatsuki (JP)

(73) Assignee: Future Light, LLC, Mountain View, CA (US)

( * ) Notice: Subject to any disclaimer, the term of this patent is extended or adjusted under 35 U.S.C. 154(b) by 790 days.

(21) Appl. No.: 12/680,412

(22) PCT Filed: Sep. 25, 2008

(86) PCT No.: PCT/JP2008/067238
§ 371 (c)(1),
(2), (4) Date: Mar. 26, 2010

(87) PCT Pub. No.: WO2009/041462
PCT Pub. Date: Apr. 2, 2009

(65) Prior Publication Data
US 2010/0246624 A1     Sep. 30, 2010

(30) Foreign Application Priority Data

| Sep. 28, 2007 | (JP) | 2007-253677 |
| Nov. 7, 2007 | (JP) | 2007-289918 |
| Dec. 21, 2007 | (JP) | 2007-331097 |
| Dec. 28, 2007 | (JP) | 2007-338897 |

(51) Int. Cl.
*H01S 5/22* (2006.01)
*H01S 5/323* (2006.01)
*H01S 5/40* (2006.01)

(52) U.S. Cl.
USPC ............... 372/50.124; 372/43.01; 372/44.01

(58) Field of Classification Search
USPC ............. 372/43.01, 44.011, 46.014, 49.01, 372/50.124; 257/79, 94
See application file for complete search history.

(56) References Cited

U.S. PATENT DOCUMENTS

| 5,814,533 | A | 9/1998 | Shakuda |
| 6,025,213 | A | 2/2000 | Nemoto et al. |
| 6,850,547 | B2 | 2/2005 | Goto |
| 2003/0086459 | A1* | 5/2003 | Momose ............... 372/45 |
| 2006/0131590 | A1* | 6/2006 | Takakura et al. ......... 257/79 |
| 2009/0078944 | A1* | 3/2009 | Kubota et al. ............ 257/88 |
| 2010/0265981 | A1 | 10/2010 | Hiroyama et al. |

FOREIGN PATENT DOCUMENTS

| JP | 6-216468 A | 8/1994 |
| JP | 8-64912 A | 3/1996 |
| JP | 8-186326 A | 7/1996 |
| JP | 8-213692 A | 8/1996 |
| JP | 2000-106470 A | 4/2000 |
| JP | 2001-24222 A | 1/2001 |
| JP | 2002-368332 A | 12/2002 |
| JP | 2003-23215 A | 1/2003 |
| JP | 3505478 B2 | 12/2003 |
| JP | 2005-116926 A | 4/2005 |
| WO | WO 2009/041462 A1 | 4/2009 |

OTHER PUBLICATIONS

Akasaka, T. et al., "An InGaN-based horizontal-cavity surface-emitting laser diode", Applied Physics Letters, vol. 84, No. 20, May 17, 2004, pp. 1-3 Japan.

International Search Report for PCT/JP2008/067238, dated Dec. 9, 2008, pp. 1-9.

Okamoto, K., et al., "Continuous-Wave Operation of m-Plane InGaN Multiple Quantum Well Laser Diodes", Japanese Journal of Applied Physics, vol. 46, No. 9, 2007, pp. L187-L189 Japan.

Okamoto, K., et al., "Pure Blue Laser Diodes Based on Nonpolar m-Plane Gallium Nitride with InGaN Waveguiding Layers", Japanese Journal of Applied Physics, vol. 46, No. 35, 2007, pp. L820-L822 Japan.
Springthorpe, A.J., "A novel double-heterostructure p-n-junction laser", Appled Physics Letters, vol. 31, No. 8, Oct. 15, 1977, pp. 524-525.
Windhorn, T.H., et al. "Monolithic GaAs / AlGaAs diode laser / deflector devices for light emission normal to the surface", Appl. Phys. Lett. vol. 48, No. 24, Jun. 16, 1986.

\* cited by examiner

*Primary Examiner* — Jessica Stultz
*Assistant Examiner* — Michael Carter
(74) *Attorney, Agent, or Firm* — Ditthavong Mori & Steiner, P.C.

(57) ABSTRACT

A nitride-based semiconductor light-emitting device capable of suppressing complication of a manufacturing process and reduction of luminous efficiency is obtained. This nitride-based semiconductor light-emitting device (50) includes a nitride-based semiconductor device layer (23) formed on a main surface of a (1-100) plane of a substrate (21), having a light-emitting layer (26) having a main surface of a (1-100) plane, a facet (50a) formed on an end of a region including the light-emitting layer (26) of the nitride-based semiconductor device layer (23), formed by a (000-1) plane extending in a direction substantially perpendicular to the main surface ((1-100) plane) of the light-emitting layer (26), and a reflection surface (50c) formed on a region opposed to the facet (50a) of the (000-1) plane, formed by a growth surface of the nitride-based semiconductor device layer (23), extending in a direction inclined at an angle $\theta_1$ (about) 62° with respect to the facet (50a).

9 Claims, 31 Drawing Sheets

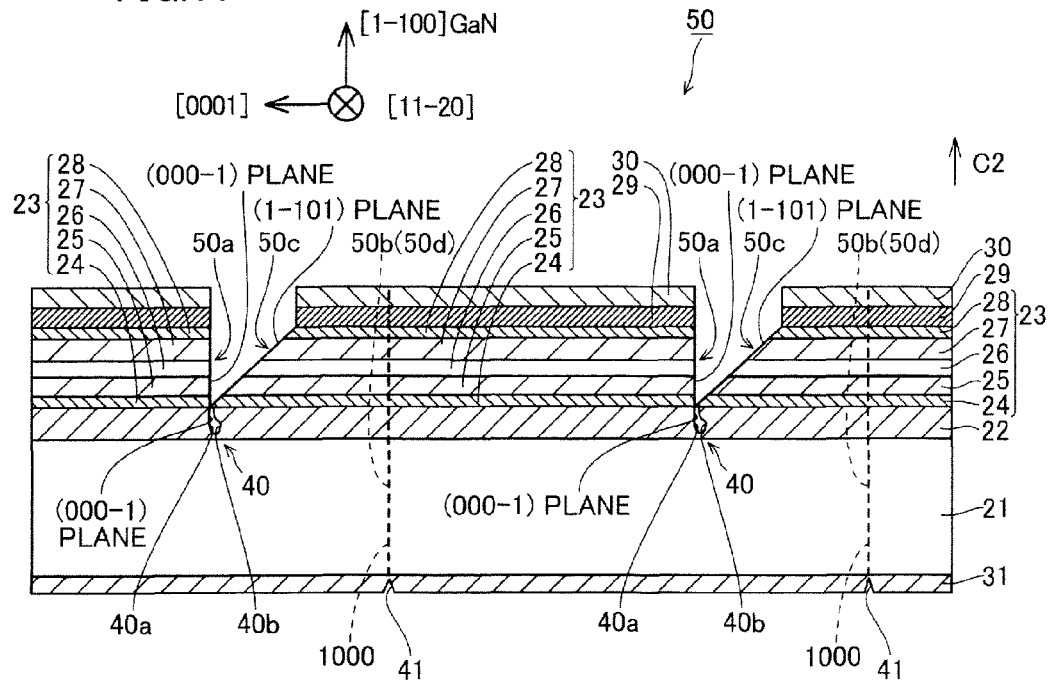
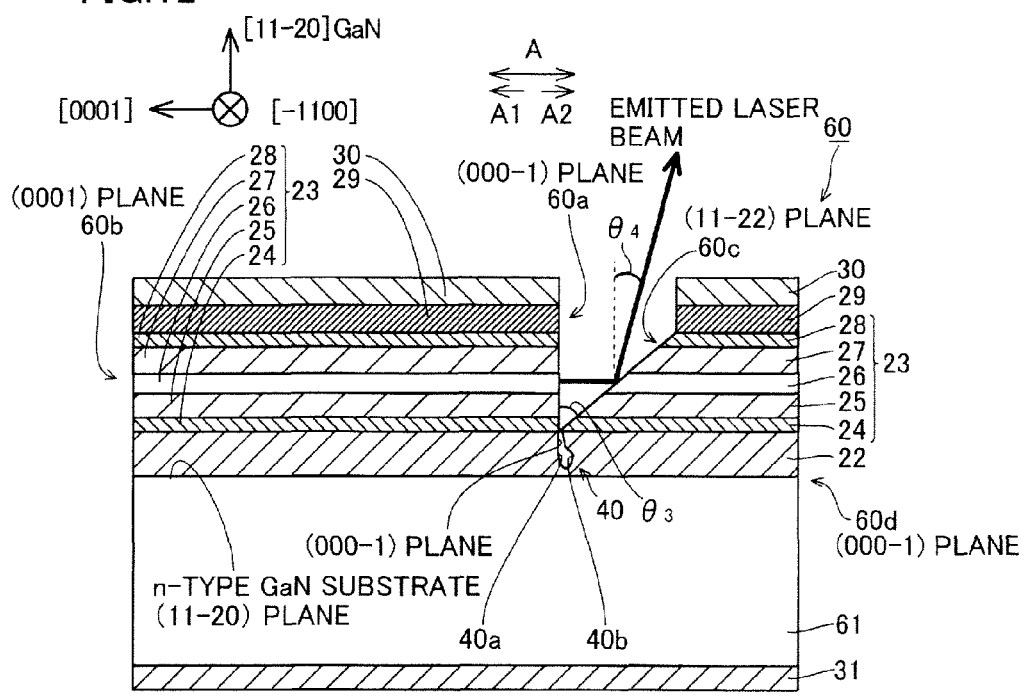

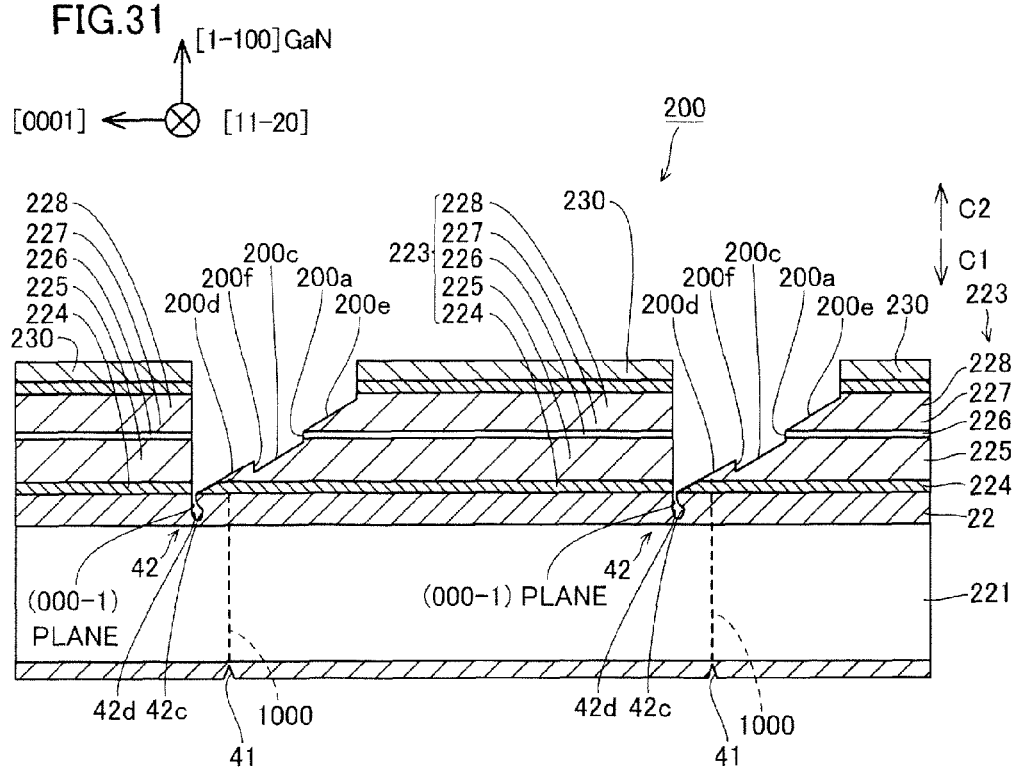
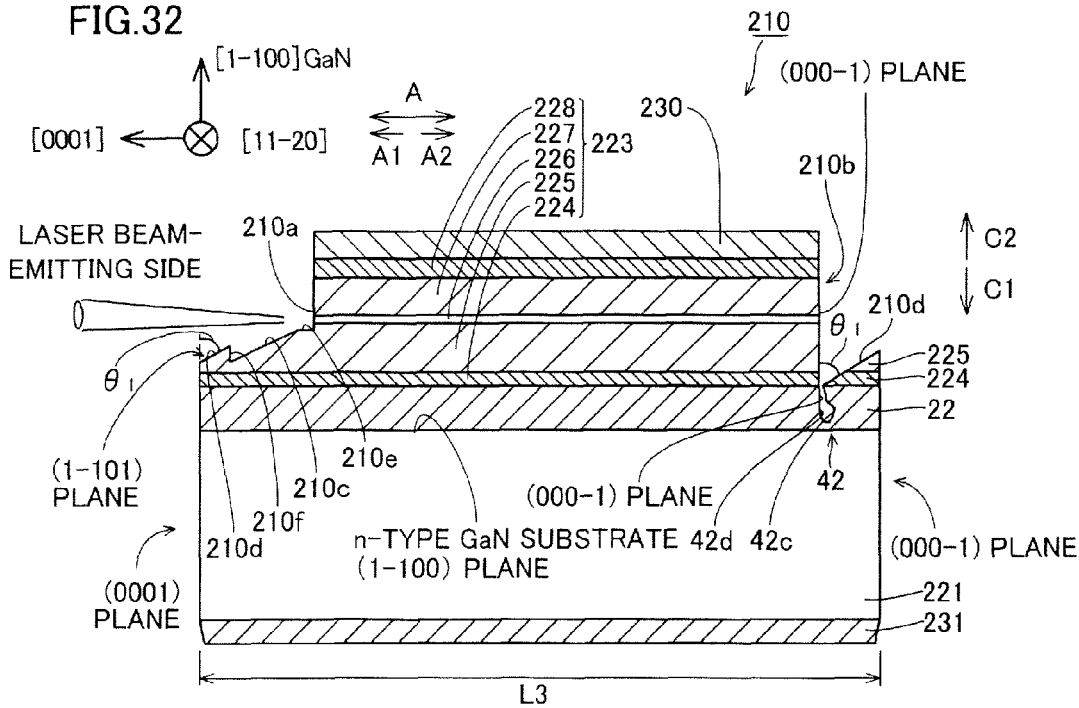

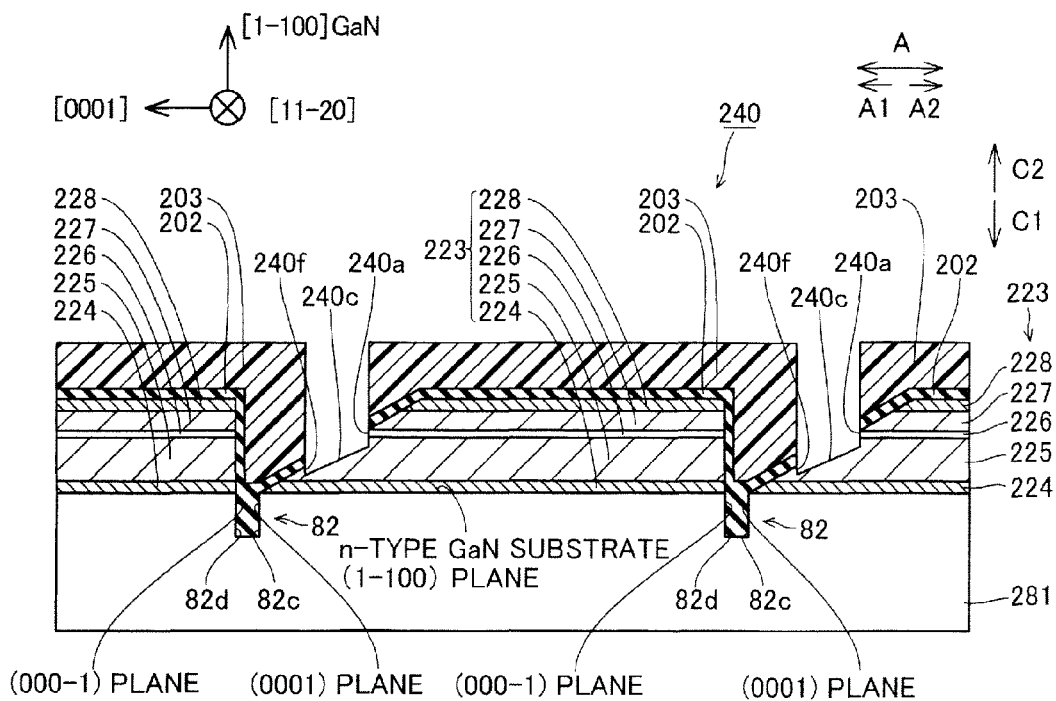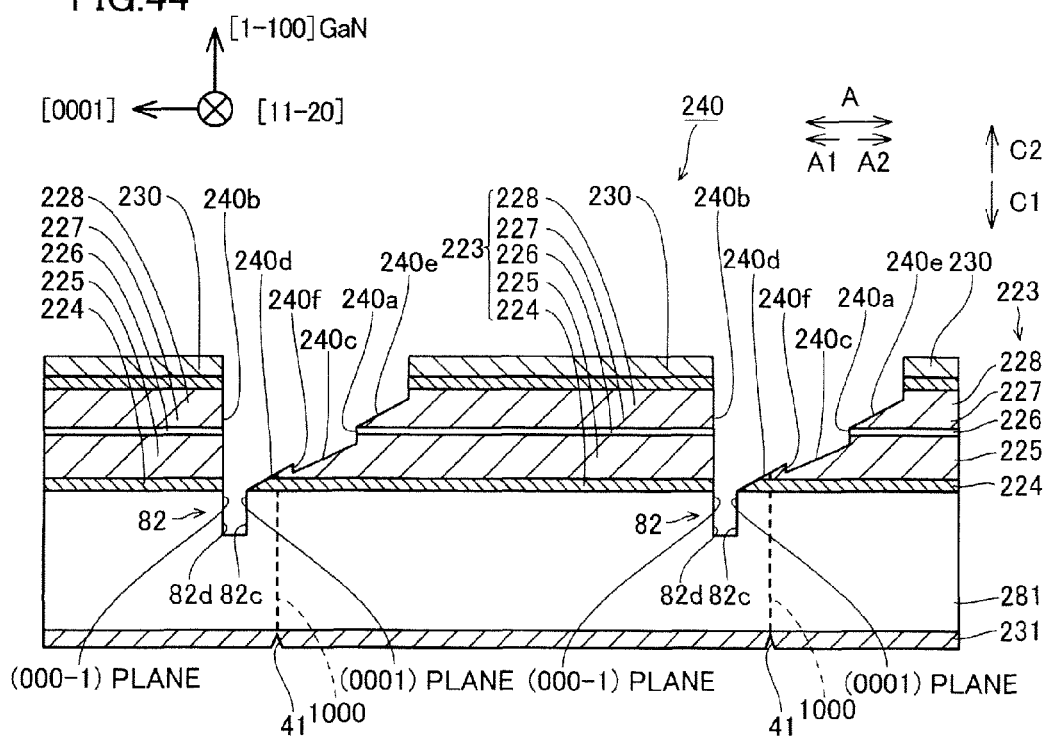

NITRIDE-BASED SEMICONDUCTOR LIGHT-EMITTING DEVICE, NITRIDE-BASED SEMICONDUCTOR LASER DEVICE, NITRIDE-BASED SEMICONDUCTOR LIGHT-EMITTING DIODE, METHOD OF MANUFACTURING THE SAME, AND METHOD OF FORMING NITRIDE-BASED SEMICONDUCTOR LAYER

TECHNICAL FIELD

The present invention relates to a nitride-based semiconductor light-emitting device, a nitride-based semiconductor laser device, a nitride-based semiconductor light-emitting diode, a method of manufacturing the same, and a method of forming nitride-based semiconductor layer

BACKGROUND ART

Appl. Phys. Lett. 48(24), 16 Jun. 1986, p-1675-1677 proposes a monolithic semiconductor laser device comprising a semiconductor device layer integrally formed with a cavity facet and a reflection surface of an emitted laser beam with a gallium arsenide-based semiconductor material in general.

In the conventional semiconductor laser device disclosed in Appl. Phys. Lett. 48(24), 16 Jun. 1986, p-1675-1677, a cavity facet on a light-emitting surface side and a reflection surface extending in a direction inclined at 45° with respect to the cavity facet at a position spaced from this cavity facet by a prescribed distance are formed on a semiconductor device layer uniformly stacked on a substrate by ion beam etching. Thus, a laser beam emitted from the cavity facet can emit outside by being reflected in a direction perpendicular to the substrate by the reflection surface.

However, the monolithic semiconductor laser device proposed in Appl. Phys. Lett. 48(24), 16 Jun. 1986, p-1675-1677 requires a step of forming the reflection surface inclined at 45° with respect to the cavity facet by ion beam etching after forming the flat semiconductor device layer on the substrate in a manufacturing process, and hence there is such a problem that the manufacturing process is complicated. The reflection surface formed by ion beam etching is formed with small unevenness, and hence the laser beam emitted from the cavity facet is conceivably partly scattered on the reflection surface. In this case, there is also such a problem that luminous efficiency as the semiconductor laser device is reduced.

DISCLOSURE OF THE INVENTION

The present invention has been proposed in order to solve the aforementioned problems, and an object of the present invention is to provide a nitride-based semiconductor light-emitting device capable of suppressing complication of a manufacturing process and reduction of luminous efficiency and a method of manufacturing the same.

A nitride-based semiconductor light-emitting device according to a first aspect of the present invention comprises a nitride-based semiconductor device layer formed on a substrate, and having a light-emitting layer with a main surface formed by a (H, K, −H−K, 0) plane, a facet formed on an end of a region including the light-emitting layer of the nitride-based semiconductor device layer, and formed by a (000-1) plane extending in a direction substantially perpendicular to the main surface of the light-emitting layer, and a reflection surface formed on a region opposed to the facet, formed by a growth surface of the nitride-based semiconductor device layer, and extending to be inclined at a prescribed angle with respect to the facet.

As hereinabove described, the nitride-based semiconductor light-emitting device according to the first aspect of the present invention comprises the reflection surface formed by the growth surface of the nitride-based semiconductor device layer and extending to be inclined at a prescribed angle with respect to the facet on the region opposed to the facet formed by the (000-1) plane, whereby the reflection surface inclined with respect to the facet can be formed simultaneously with the crystal growth of the nitride-based semiconductor device layer. Thus, the manufacturing process of the semiconductor light-emitting device can be inhibited from complication, dissimilarly to a case of growing a flat semiconductor device layer on the substrate and thereafter forming the reflection surface inclined at the prescribed angle with respect to the cavity facet by ion beam etching. The reflection surface is formed by the growth surface of the nitride-based semiconductor device layer, whereby the reflection surface can obtain excellent flatness. Thus, the laser beam emitted from the facet can be emitted outside by uniformly changing the emission direction without scattering by the reflection surface. Therefore, reduction in luminous efficiency of the semiconductor light-emitting device can be suppressed, dissimilarly to a semiconductor light-emitting device formed with a reflection surface having small unevenness by ion beam etching. Additionally, the nitride-based semiconductor device layer having the light-emitting layer with the main surface formed by the (H, K, −H−K, 0) plane is provided on the substrate, whereby a piezoelectric field caused in the semiconductor device layer (light-emitting layer) or an internal electric field such as intrinsic polarization can be reduced. Thus, luminous efficiency of a laser beam can be further improved.

In the aforementioned nitride-based semiconductor light-emitting device according to the first aspect, the facet is preferably formed by a growth surface of the nitride-based semiconductor device layer. According to this structure, the facet formed by the (000-1) plane can be formed in simultaneously the crystal growth of the nitride-based semiconductor device layer. Thus, the manufacturing process of the semiconductor light-emitting device can be further inhibited from complication, dissimilarly to a case of growing a semiconductor device layer on the substrate and thereafter forming the cavity facet substantially perpendicular to the main surface of the substrate by ion beam etching.

In the aforementioned nitride-based semiconductor light-emitting device according to the first aspect, the reflection surface made of a nitride-based semiconductor preferably has a plain orientation of either a (1-101) or (11-22) plane, the reflection surface is preferably the (1-101) plane when the substrate has a main surface formed by a (1-100) plane, and the reflection surface is preferably the (11-22) plane when the substrate has a main surface formed by a (11-20) plane. According to this structure, the aforementioned two reflection surfaces are mostly covered with nitrogen atoms by utilizing crystal growth, and hence oxygen in the atmosphere is inhibited from being incorporated into the reflection surfaces. Thus, deterioration of the reflection surfaces following oxidation is suppressed. Consequently, a reflectance of a laser beam does not change over time, and a stable laser beam can be obtained.

In the aforementioned nitride-based semiconductor light-emitting device according to the first aspect, the substrate preferably has a main surface formed by the (H, K, −H−K, 0) plane, and the facet is preferably formed substantially perpendicular to the main surface along a first side surface of a recess portion formed on the substrate to extend in a striped manner in a [K, −H, −K+H, 0] direction within the main surface. According to this structure, the nitride-based semiconductor device layer having the facet formed by the (000-1) plane substantially perpendicular to the main surface of the substrate can be easily formed by utilizing the first side surface of the recess portion formed in the [K, −H, −K+H, 0] direction substantially orthogonal to a c-axis direction ([0001] direction) in the (H, K, −H−K, 0) plane of the substrate when forming the nitride-based semiconductor layer on the main surface of the substrate.

In this case, the first side surface is preferably formed by the (000-1) plane. According to this structure, the nitride-based semiconductor device layer having the facet formed by the (000-1) plane so as to start from the (000-1) plane of the recess portion of the substrate can be easily formed when forming the nitride-based semiconductor device layer on the substrate.

In the aforementioned nitride-based semiconductor light-emitting device according to the first aspect, a laser beam emitted from the facet is preferably reflected in a direction intersecting with an emission direction from the light-emitting layer by the reflection surface to be introduced into a monitor optical sensor of the laser beam. According to this structure, a laser beam (sample light monitoring a laser beam intensity of a facet emission laser device) where light scattering is suppressed by the reflection surface having excellent flatness as a crystal growth surface can be guided to the optical sensor, and hence the laser beam intensity can be more precisely measured.

In the aforementioned nitride-based semiconductor light-emitting device according to the first aspect, a laser beam emitted from the facet is preferably reflected in a direction intersecting with an emission direction from the light-emitting layer by the reflection surface to be employed as a light source of a surface-emitting laser. According to this structure, a laser beam where light scattering is suppressed by the reflection surface having excellent flatness as a crystal growth surface is emitted, and hence the surface-emitting laser improving luminous efficiency can be formed.

A nitride-based semiconductor laser device according to a second aspect of the present invention comprises a substrate, and a nitride-based semiconductor device layer formed on a main surface of the substrate and having a light-emitting layer, wherein a first facet of the nitride-based semiconductor device layer includes a cavity facet and an inclined plane formed in the vicinity of the cavity facet and inclined at a prescribed angle with respect to at least the main surface, and an angle formed by the inclined plane and the main surface is an acute angle.

In the nitride-based semiconductor laser device according to the second aspect of the present invention, as hereinabove described, the first facet of the nitride-based semiconductor device layer includes the cavity facet and the inclined plane formed in the vicinity of the cavity facet and inclined at the prescribed angle while forming an acute angle with respect to at least the main surface of the substrate, whereby the nitride-based semiconductor device layer is connected to the substrate side through a plane area larger than a plane area in the vicinity of the light-emitting layer, and hence a sectional area of a path through which heat is radiated to the substrate side can be increased by the increased plane area. Thus, heat generated from a laser beam emitted in the vicinity of the cavity facet are suitably diffused to the substrate side through the inside of the nitride-based semiconductor device layer formed with the inclined plane extending in the emission direction of the laser beam beyond the cavity facet also when output of semiconductor laser is increased. Therefore, generation of excess heat of the cavity facet due to the emitted laser beam is suppressed. Thus, deterioration of the cavity facet following higher output of the semiconductor laser can be suppressed. The life of the semiconductor laser can be improved by suppressing the deterioration of the cavity facet.

In the aforementioned nitride-based semiconductor laser device according to the second aspect, the nitride-based semiconductor device layer preferably includes a first conductive type first cladding layer formed on the substrate side of the light-emitting layer and a second conductive type second cladding layer formed on an opposite side of the light-emitting layer to the substrate side, and the inclined plane preferably includes a facet of at least the first cladding layer. According to this structure, the inclined plane is formed toward the substrate to start from the first cladding layer located in the vicinity of the lower portion of the light-emitting layer of the cavity facet formed on the substrate, and hence heat of the laser beam generated in the vicinity of the light-emitting layer can be more effectively diffused to the substrate side.

In the aforementioned nitride-based semiconductor laser device according to the second aspect, the inclined plane is preferably formed on at least an emitting side of a laser beam emitted from the light-emitting layer. According to this structure, deterioration of the cavity facet on the light-emitting side following larger heat generation in a laser operation can be easily suppressed.

In the present invention, the "laser beam-emitting side" is distinguished by the large-small relation between the strength levels of laser beams emitted from a pair of cavity facets. In other words, the cavity facet on the light-emitting side has relatively larger emission intensity of the laser beam, and the cavity facet on the light-reflecting side has relatively smaller emission intensity of the laser beam.

In the aforementioned nitride-based semiconductor laser device according to the second aspect, the main surface preferably includes a (H, K, −H−K, 0) plane, at least the inclined plane is preferably a growth surface of the nitride-based semiconductor device layer starting from a first side surface of a recess portion formed to extend in a striped manner in a direction within the main surface, the recess portion is preferably formed to extend in the striped manner in a [11-20] direction and the growth surface is formed by a (1-101) plane starting from the first side surface when the main surface includes a (1-100) plane, and the recess portion is preferably formed to extend in the striped manner in a [1-100] direction and the growth surface is formed by a (11-22) plane starting from the first side surface when the main surface includes a (11-20) plane. According to this structure, the inclined planes formed by two types of the growth surfaces of the aforementioned (1-101) and (11-22) planes can be formed simultaneously with the crystal growth of the nitride-based semiconductor device layer.

In the aforementioned structure where the main surface includes the (H, K, −H−K, 0) plane, the nitride-based semiconductor laser device preferably further comprises a second facet formed on an end opposite to the first facet with respect to an extensional direction of a cavity and extending in a direction substantially perpendicular to the main surface. According to this structure, the nitride-based semiconductor layer where the cavity facets on the first facet side and the second facet side opposite to the first facet side are employed as a pair of cavity facets can be formed.

In the aforementioned structure further comprising the second facet, the second facet is preferably formed substantially perpendicular to the main surface to start from a second side surface of the recess portion. According to this structure, the nitride-based semiconductor device layer having the cavity facet (second facet) formed by the (000-1) plane substantially perpendicular to the main surface of the substrate can be easily formed with no cleavage step by utilizing the second side surface of the recess portion formed in the [K, −H, −K+H, 0] substantially orthogonal to a c-axis direction ([0001] direction) in the (H, K, −H−K, 0) plane of the substrate, for example, when forming the nitride-based semiconductor layer on the main surface of the substrate.

A nitride-based semiconductor light-emitting diode according to a third aspect of the present invention comprises a substrate formed with a recess portion on a main surface, and a nitride-based semiconductor layer having a light-emitting layer on the main surface and including a first side surface formed by a (000-1) plane formed to start from a first inner side surface of the recess portion and a second side surface formed on a region opposite to the first side surface with the light-emitting layer therebetween to start from a second inner side surface of the recess portion on the main surface.

As hereinabove described, the nitride-based semiconductor light-emitting diode according to the third aspect of the present invention comprises the substrate formed with the recess portion on the main surface, and the nitride-based semiconductor layer including the first side surface formed by the (000-1) plane formed to start from the first inner side surface of the recess portion and the second side surface formed to start from the second inner side surface of the recess portion on the main surface of the substrate, whereby the nitride-based semiconductor layer is formed with the first and second side surfaces starting from the inner side surfaces of the recess portion previously formed on the substrate. In other words, no etching is required in the manufacturing process dissimilarly to a case of forming the aforementioned first and second side surfaces by etching the nitride-based semiconductor layer stacked on a flat substrate with no recess portion, and hence the manufacturing process of the nitride-based semiconductor light-emitting diode can be inhibited from complication. The first and second side surfaces of the nitride-based semiconductor layer are not formed by dry etching or the like, and hence the light-emitting layer and the like are difficult to be damaged in the manufacturing process. Thus, light extraction efficiency from the light-emitting layer can be improved.

The nitride-based semiconductor light-emitting diode comprises the substrate formed with the recess portion on the main surface, and the nitride-based semiconductor layer including the first side surface formed by the (000-1) plane formed to start from the first inner side surface and the second side surface formed to start from the second inner side surface of the recess portion on the main surface of the substrate, whereby the growth rates of forming the first and second side surfaces starting from the first and second inner side surfaces are slower than the growth rate of growing the upper surface (main surface of the nitride-based semiconductor layer) of the growth layer when the nitride-based semiconductor layer is crystal-grown on the substrate, and hence the upper surface (main surface) of the growth layer is grown while maintaining flatness. Thus, flatness of the surface of the semiconductor layer having the light-emitting layer can be further improved as compared with surfaces of a growth layer of a nitride-based semiconductor layer with no facet formed by the aforementioned first and second side surfaces.

In the aforementioned nitride-based semiconductor light-emitting diode according to the third aspect, the first inner side surface preferably includes the (000-1) plane. According to this structure, the (000-1) plane of the nitride-based semiconductor layer is formed to start from the first inner side surface of the recess portion formed by the (000-1) plane when forming the nitride-based semiconductor layer having the first side surface formed by the (000-1) plane on the main surface of the substrate, and hence the first side surface formed by the (000-1) plane can be easily formed on the substrate.

In the aforementioned nitride-based semiconductor light-emitting diode according to the third aspect, the first and second side surfaces are preferably formed by crystal growth surfaces of the nitride-based semiconductor layer. According to this structure, two types of the growth surfaces (facets) of the aforementioned first and second side surfaces can be formed simultaneously with the crystal growth of the nitride-based semiconductor layer.

In the aforementioned nitride-based semiconductor light-emitting diode according to the third aspect, the second side surface is preferably formed by a {A+B, A, −2A−B, 2A+B} plane (A and B satisfy A≥0 and B≥0, and at least either one of A and B is a nonzero integer). According to this structure, the surface (upper surface) of the growth layer can be reliably formed to have flatness in forming the second side surface formed by the {A+B, A−B, −2A, 2A+B} plane on the substrate as compared with surfaces (main surfaces) of a growth layer of the nitride-based semiconductor layer in forming a side surface (facet) which is not the {A+B, A, −2A−B, 2A+B} plane on the substrate. The {A+B, A, −2A−B, 2A+B} plane has the slower growth rate than the main surface of the nitride-based semiconductor layer, and hence the second side surface can be easily formed by crystal growth.

In the aforementioned nitride-based semiconductor light-emitting diode according to the third aspect, the substrate is preferably formed by a nitride-based semiconductor. According to this structure, the nitride-based semiconductor layer having the first and second side surfaces formed by the (000-1) and {A+B, A, −2A−B, 2A+B} planes can be easily formed by utilizing crystal growth of the nitride-based semiconductor layer on the substrate made of a nitride-based semiconductor.

In the aforementioned nitride-based semiconductor light-emitting diode according to the third aspect, at least either the first or second side surface preferably forms an obtuse angle with respect to the main surface. According to this structure, the region (upper region of the recess portion of the substrate) where the first and second side surfaces of the nitride-based semiconductor layer are opposed is formed to broaden from the substrate toward the upper surface of the nitride-based semiconductor layer, and hence light from the light-emitting layer can be easily extracted not only through the upper surface of the nitride-based semiconductor layer but also through the first or second side surface inclined with respect to the main surface of the substrate. Thus, luminous efficiency of the nitride-based semiconductor light-emitting diode can be further improved.

In the aforementioned nitride-based semiconductor laser device according to the third aspect, the substrate preferably includes a base substrate and an underlayer made of AlGaN formed on the base substrate, and $c_1$ and $c_2$ preferably satisfy relation of $c_1 > c_2$, where lattice constants of the base substrate and the underlayer are $c_1$ and $c_2$ respectively, and the first and second side surfaces are preferably formed to start from inner side surfaces, formed to extend substantially parallel to a (0001) plane of the underlayer and the main surface, of a crack, respectively. According to this structure, the lattice constant $c_2$ of the underlayer is smaller than the lattice constant $c_1$ of the base substrate ($c_1 > c_2$) when the underlayer made of AlGaN is formed on the base substrate, and hence tensile stress is caused inside the underlayer in response to the lattice constant $c_1$ on the base substrate side. Consequently, when the thickness of the underlayer is at least a prescribed thickness, the underlayer can not withstand this tensile stress and hence the crack is formed on the underlayer. Thus, the inner side surface (first inner side surface of the recess portion) of the (000-1) plane which is the basis for forming the first side surface ((000-1) plane) of the nitride-based semiconductor layer on the underlayer can be easily formed on the underlayer.

A method of forming a nitride-based semiconductor layer according to a fourth aspect of the present invention comprises steps of forming (000-1) facets substantially perpendicular to a main surface of a substrate on the substrate having the main surface of a nonpolar face to be in contact with the main surface, and forming a nitride-based semiconductor layer on the main surface.

As hereinabove described, the method of forming a nitride-based semiconductor layer according to the fourth aspect of the present invention comprises the steps of forming the (000-1) facets substantially perpendicular to the main surface of the substrate, and forming the nitride-based semiconductor layer on the main surface, whereby the nitride-based semiconductor layer having the (000-1) plane facets can be formed to start from the (000-1) facets previously formed substantially perpendicular to the main surface of the substrate when forming the nitride-based semiconductor layer on the substrate. Thus, the nitride-based semiconductor layer having the facets formed by the (000-1) planes can be formed with no cleavage step. Further, flatness of the growth layer surfaces can be improved by comprising the aforementioned step as compared with growth layer surfaces of the semiconductor layer with no (000-1) facet. The nitride-based semiconductor layer (light-emitting layer) having the cavity facets formed by the (000-1) planes can be formed with no cleavage step by applying the method of forming a nitride-based semiconductor layer of this invention to a method of forming a semiconductor laser device.

In other words, the facets of the (000-1) planes in the structure of pairs of the cavity facets (combination of the (0001) and (000-1) planes) extending in the direction perpendicular to the [0001] direction can be easily formed by utilizing crystal growth of the nitride-based semiconductor layer when gains of the semiconductor laser is improved by forming the optical waveguides along the [0001] direction of the nitride-based semiconductor layer, by applying the present invention to a case where a laser device layer made of a nitride-based semiconductor layer is formed on a substrate having a main surface of an m-plane ((1-100) plane) or an a-plane ((11-20) plane).

In the method of forming a nitride-based semiconductor layer according to the fourth aspect, the step of forming the nitride-based semiconductor layer preferably includes a step of forming the nitride-based semiconductor layer having facets formed by the (000-1) planes on regions, corresponding to the (000-1) facets, of the main surface. According to this structure, the nitride-based semiconductor layer having the facets formed by the (000-1) planes to start from the (000-1) facets formed on the substrate can be easily formed.

In the method of forming a nitride-based semiconductor layer according to the fourth aspect, the substrate is preferably made of a nitride-based semiconductor. According to this structure, the nitride-based semiconductor layer having the facets formed by the (000-1) planes can be easily formed on the substrate made of a nitride-based semiconductor by utilizing crystal growth of the nitride-based semiconductor layer.

In the method of forming a nitride-based semiconductor layer according to the fourth aspect, the main surface is preferably a (1-100) or (11-20) plane. In this case, the influence of a piezoelectric field caused in the light-emitting layer is suppressed by applying the present invention to a case where a laser device layer (light-emitting layer) made of a nitride-based semiconductor layer is formed on a substrate having a main surface of an m-plane ((1-100) plane) or an a-plane ((11-20) plane), whereby luminous efficiency of a laser beam can be improved.

In the method of forming a nitride-based semiconductor layer according to the fourth aspect, the substrate preferably includes a base substrate and an underlayer formed on the base substrate, and the step of forming the (000-1) facets preferably includes a step of forming the (000-1) facets on the underlayer. According to this structure, the nitride-based semiconductor layer having the facets formed by the (000-1) planes to start from the (000-1) facets can be easily formed by utilizing the (000-1) facets formed on the underlayer when forming the nitride-based semiconductor layer on the main surface of the base substrate.

In this case, the underlayer preferably includes an AlGaN layer, and the base substrate and the underlayer satisfy relation of $c_1 > c_2$, where lattice constants of the base substrate and the underlayer are $c_1$ and $c_2$, respectively. According to this structure, the lattice constant $c_2$ of the underlayer is smaller than the lattice constant $c_1$ of the base substrate ($c_1 > c_2$) when the underlayer made of AlGaN is formed on the base substrate, and hence tensile stress is caused inside the underlayer in response to the lattice constant $c_1$ on the base substrate. Consequently, when the thickness of the underlayer is at least a prescribed thickness, the underlayer can not withstand this tensile stress and hence the cracks are formed on the underlayer along the (000-1) planes. Thus, the facets formed by the (000-1) planes which are the basis for forming the (000-1) plane of the nitride-based semiconductor layer on the underlayer can be easily formed on the underlayer.

In the aforementioned structure including the step of forming the (000-1) plane on the underlayer of the substrate, the step of forming the (000-1) facets preferably further includes a step of forming (000-1) planes formed by first surfaces of cracks formed substantially parallel to a (0001) plane on the underlayer. According to this structure, the nitride-based semiconductor layer having the facets formed by the (000-1) planes can be easily formed to start from the facets of the (000-1) planes formed by the first surfaces of the cracks formed on the underlayer when forming the nitride-based semiconductor layer on the base substrate.

In the method of forming a nitride-based semiconductor layer according to the fourth aspect, the step of forming the (000-1) facets preferably further includes a step of forming (000-1) planes extending in a striped manner on the main surface in plan view. According to this structure, the facets formed by the (000-1) planes of the nitride-based semiconductor layer formed on the substrate can be formed to extend in a striped manner along the (000-1) planes, extending in the striped manner, of the substrate.

A method of manufacturing a nitride-based semiconductor light-emitting device according to the fifth aspect of the present invention comprises steps of forming recess portions extending in a striped manner in a [K, −H, −K+H, 0] direction within a main surface of a substrate on the substrate having the main surface formed by a (H, K, −H−K, 0) plane, and forming a nitride-based semiconductor device layer having a light-emitting layer with a main surface formed by the (H, K, −H−K, 0) plane by growing facets formed by a (000-1) plane of a nitride-based semiconductor on regions corresponding to first side surfaces of the recess portions on the main surface and by growing reflection surfaces formed by growth surfaces of the nitride-based semiconductor layer and extending to be inclined at a prescribed angle with respect to the facets formed by the (0001) planes on regions opposed to the facets.

As hereinabove described, the method of manufacturing a nitride-based semiconductor light-emitting device according to the fifth aspect of the present invention comprises the step of forming the nitride-based semiconductor device layer by growing the (000-1) facets of the nitride-based semiconductor on regions corresponding to the first side surfaces of the recess portions formed on the substrate and by growing the reflection surfaces formed by the growth surfaces of the nitride-based semiconductor layer and extending to be inclined at the prescribed angle with respect to the (000-1) facets on regions opposed to the (000-1) facets, whereby the nitride-based semiconductor light-emitting device formed with the reflection surfaces inclined with respect to the (000-1) facets simultaneously with crystal growth of the nitride-based semiconductor device layer can be obtained. Thus, the aforementioned nitride-based semiconductor light-emitting device can be formed with no complicated manufacturing process, dissimilarly to a case of growing a flat semiconductor device layer on the substrate and thereafter forming the reflection surfaces inclined at the prescribed angle with respect to the cavity facets by ion beam etching or the like. The reflection surfaces are formed by growing the nitride-based semiconductor layer, whereby the reflection surfaces obtaining excellent flatness by crystal growth can be formed. Thus, a laser beam emitted from the (000-1) facet is emitted outside while uniformly changing an emission direction without scattering by the reflection surface, and hence reduction in luminous efficiency of the semiconductor light-emitting device can be suppressed.

The method of manufacturing a nitride-based semiconductor light-emitting device according to the fifth aspect comprises the steps of forming the recess portions extending in the striped manner in the [K, −H, −K+H, 0] direction within the main surface of the substrate on the substrate, and growing the facets formed by the (000-1) plane of the nitride-based semiconductor on the regions corresponding to first side surfaces of the recess portions formed on the substrate, whereby the nitride-based semiconductor device layer having the flatter (000-1) facets can be easily formed on the substrate by utilizing the first side surfaces of the recess portions extending in the [K, −H, −K+H, 0] direction substantially orthogonal to a c-axis direction ([0001] direction) within the main surface ((H, K, −H−K, 0) plane) of the substrate by crystal growth. The manufacturing process can be simplified by comprising the aforementioned steps dissimilarly to a case of forming facets by etching, scribing, or the like. Further, impurities in forming the facets are in no danger of being introduced in the next step dissimilarly to the case of forming the facets by etching, scribing, or the like, and hence the nitride-based semiconductor device layer having the (000-1) facets with high cleanliness can be formed. Further, this method comprises the step of forming the nitride-based semiconductor device layer having the light-emitting layer with the main surface formed by the (H, K, −H−K, 0) plane on the substrate, whereby a piezoelectric field caused in the semiconductor device layer (light-emitting layer) or an internal electric field such as intrinsic polarization can be reduced. Thus, the semiconductor light-emitting device where luminous efficiency is further improved can be formed.

In the method of manufacturing a nitride-based semiconductor light-emitting device according to the fifth aspect, the first side surfaces of the recess portions are preferably formed by (000-1) planes. According to this structure, the nitride-based semiconductor device layer having the (000-1) facets to start from the (000-1) planes of the recess portions previously formed on the substrate can be easily formed when forming the nitride-based semiconductor layer on the substrate by crystal growth.

A method of manufacturing a nitride-based semiconductor laser device according to a sixth aspect of the present invention comprises steps of forming a nitride-based semiconductor device layer having first facets including inclined planes inclined at a prescribed angle with respect to at least a main surface of a substrate on the substrate, and forming cavity facets extending substantially perpendicular to the main surface on partial regions of the inclined planes by etching, wherein angles formed by the inclined planes and the main surface are acute angles.

As hereinabove described, the method of manufacturing a nitride-based semiconductor laser device according to the sixth aspect of the present invention comprises the steps of forming the nitride-based semiconductor device layer having the first facets including the inclined planes inclined at the prescribed angle with respect to at least the main surface of the substrate, and forming the cavity facets extending substantially perpendicular to the main surface on partial regions of the inclined planes, whereby the nitride-based semiconductor device layer is connected to the substrate side through a plane area larger than a plane area in the vicinity of the light-emitting layer, and hence a sectional area of a path through which heat is radiated to the substrate side can be increased by the increased plane area. Thus, heat generated from a laser beam emitted in the vicinity of the cavity facet are suitably diffused to the substrate side through the inside of the nitride-based semiconductor device layer formed with the inclined plane extending in the emission direction of the laser beam beyond the cavity facet also when output of semiconductor laser is increased. Therefore, generation of excess heat of the cavity facet due to the emitted laser beam is suppressed. Thus, the nitride-based semiconductor laser device where deterioration of the cavity facet following higher output of the semiconductor laser is suppressed can be formed. The life of the nitride-based semiconductor laser device can be improved by suppressing the deterioration of the cavity facet.

In the aforementioned method of manufacturing a nitride-based semiconductor laser device according to the sixth aspect, the main surface is preferably formed by a (H, K, −H−K, 0) plane, the nitride-based semiconductor laser device preferably further comprises a step of forming recess portions extending in a striped manner in a [K, −H, −K+H, 0] direction within the main surface on the substrate in advance of the step of forming the nitride-based semiconductor device layer, wherein the step of forming the nitride-based semiconductor device layer preferably includes a step of forming the first facets formed by first growth surfaces of the nitride-based semiconductor device layer to start from first side surfaces of the recess portions. According to this structure, the first facets including the inclined planes formed by the first growth surfaces of the nitride-based semiconductor device layer can be formed simultaneously with crystal growth of the nitride-based semiconductor device layer.

In the aforementioned method of manufacturing a nitride-based semiconductor laser device according to the sixth aspect, the step of forming the nitride-based semiconductor device layer preferably further includes a step of forming second facets formed by second growth surfaces of the nitride-based semiconductor device layer and extending substantially perpendicular to the main surface to start from second side surfaces of the recess portions. According to this structure, the second facets extending substantially perpendicular to the main surface of the substrate can be easily formed simultaneously with the inclined first facets in crystal growth of the nitride-based semiconductor device layer.

A method of manufacturing a nitride-based semiconductor light-emitting diode according to a seventh aspect of the present invention comprises steps of forming recess portions on a main surface of a substrate; and forming a nitride-based semiconductor layer on the main surface by having a light-emitting layer on the main surface and by including first side surfaces formed by (000-1) planes starting from first inner side surfaces of the recess portions and second side surfaces starting from second inner side surfaces of the recess portions on regions opposed to the first side surfaces on the main surface.

As hereinabove described, the method of manufacturing a nitride-based semiconductor light-emitting diode according to the seventh aspect of the present invention comprises the steps of forming the recess portions on the main surface of the substrate and forming the nitride-based semiconductor layer by including the first side surfaces formed by the (000-1) planes starting from the first inner side surfaces of the recess portions and the second side surfaces starting from the second inner side surfaces of the recess portions on the main surface, whereby the first and second side surfaces starting from the inner side surfaces of the recess portions previously formed on the substrate are formed on the nitride-based semiconductor layer. In other words, no etching is required in the manufacturing process dissimilarly to a case of forming the aforementioned first and second side surfaces by etching the nitride-based semiconductor layer stacked on a flat substrate with no recess portion, and hence the manufacturing process of the nitride-based semiconductor light-emitting diode can be inhibited from complication. The first and second side surfaces of the nitride-based semiconductor layer are not formed by dry etching or the like, and hence the light-emitting layer and the like are difficult to be damaged in the manufacturing process. Thus, light extraction efficiency from the light-emitting layer can be improved.

Further, this method comprises the steps of forming the recess portions on the main surface of the substrate and forming the nitride-based semiconductor layer by including the first side surfaces formed by the (000-1) planes starting from the first inner side surfaces of the recess portions and the second side surfaces starting from the second inner side surfaces of the recess portions on the main surface, whereby the growth rates of forming the first and second side surfaces of the recess portions starting from the first and second inner side surfaces of the recess portions respectively are slower than the growth rate of growing the upper surface of the growth layer (main surface of the nitride-based semiconductor layer) when the nitride-based semiconductor layer is crystal-grown on the substrate, and hence the upper surface (main surface) of the growth layer is grown while maintaining flatness. Thus, flatness of the surface of the semiconductor layer having the light-emitting layer can be further improved as compared with surfaces of a growth layer of a nitride-based semiconductor layer with no facet formed by the aforementioned first and second side surfaces.

BRIEF DESCRIPTION OF THE DRAWINGS

FIG. 11 A sectional view for illustrating the manufacturing process of the nitride-based semiconductor laser device according to the first embodiment shown in FIG. 3.

FIG. 12 A sectional view showing a structure of a nitride-based semiconductor laser device according to a modification of the first embodiment of the present invention.

FIG. 31 A sectional view for illustrating the manufacturing process of the nitride-based semiconductor laser device according to the fifth embodiment shown in FIG. 23.

FIG. 32 A sectional view showing a structure of a nitride-based semiconductor laser device according to a first modification of the fifth embodiment of the present invention.

FIG. 43 A sectional view for illustrating the manufacturing process of the nitride-based semiconductor laser device according to the eighth embodiment shown in FIG. 41.

FIG. 44 A sectional view for illustrating the manufacturing process of the nitride-based semiconductor laser device according to the eighth embodiment shown in FIG. 41.

BEST MODES FOR CARRYING OUT THE INVENTION

Embodiments of the present invention will be hereinafter described with reference to the drawings.

A structure of a light-emitting diode chip 10, which is an example of a nitride-based semiconductor light-emitting device of the present invention, will be schematically described with reference to FIG. 1, before specifically describing the embodiments of the present invention.

Figure 1:
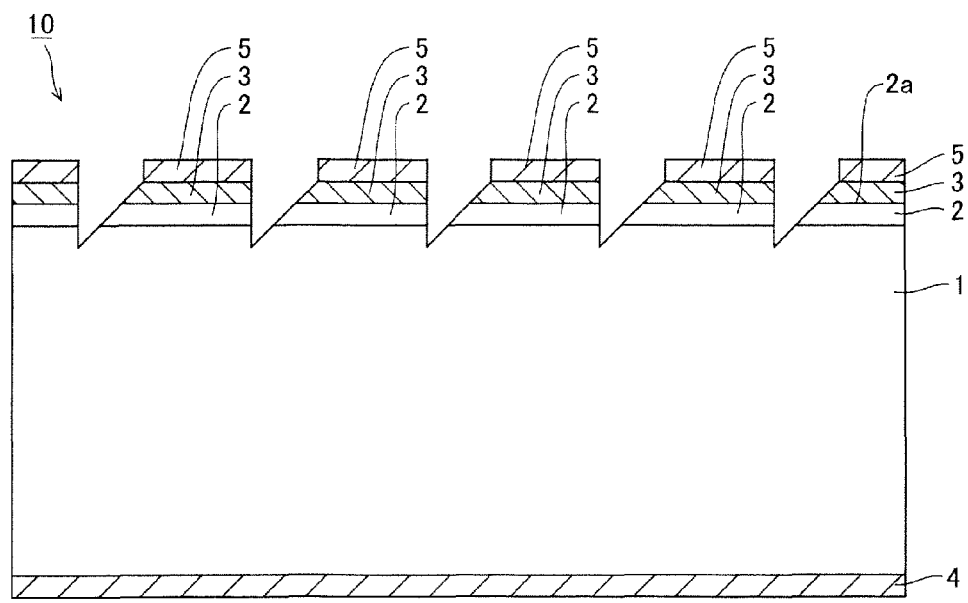
FIG. 1 A sectional view for schematically illustrating a structure of a light-emitting diode chip according to the present invention.

The light-emitting diode chip 10 is formed with a light-emitting layer 2 on a first semiconductor 1, as shown in FIG. 1. A second semiconductor 3 is formed on the light-emitting layer 2. A first electrode 4 is formed on a lower surface of the first semiconductor 1, and a second electrode 5 is formed on the second semiconductor 3. The first semiconductor 1 is examples of the "substrate" and the "nitride-based semiconductor layer" in the present invention, and the light-emitting layer 2 and the second semiconductor 3 are each an example of the "nitride-based semiconductor layer" in the present invention.

In general, the light-emitting layer 2 having a band gap smaller than band gaps of the first and second semiconductors 1 and 3 is formed between the first and second semiconductors 1 and 3 for forming a double hetero structure, so that carriers can be likely to be confined in the light-emitting layer 2 and luminous efficiency of the light-emitting diode chip 10 can be improved. The light-emitting layer 2 is formed to have a single quantum well (SQW) structure or a multiple quantum well (MQW) structure, whereby luminous efficiency can be further improved. In the case of these quantum well structures, a thickness of a well layer is small, and hence deterioration of crystallinity of the well layer can be suppressed also when the well layer has strain. Deterioration of crystallinity is suppressed also when the well layer has compressive strain in the in-plane directions of a main surface 2a of the light-emitting layer 2 or has tensile strain in the in-plane directions thereof. The light-emitting layer 2 may be undoped or doped.

In the present invention, the first semiconductor 1 may be formed by a substrate or a semiconductor layer, or may be formed by both of the substrate and the semiconductor layer. When the first semiconductor 1 is formed by both of the substrate and the semiconductor layer, the substrate is formed on a side opposite to a side formed with the second semiconductor 3 of the first semiconductor 1 (lower side of the first semiconductor 1). The substrate may be formed by a growth substrate or may be employed as a support substrate for supporting the semiconductor layer on a growth surface (main surface) of the semiconductor layer after growing the semiconductor layer.

A GaN substrate or an α-SiC substrate can be employed as the substrate. A nitride-based semiconductor layer having the same main surface as the substrate is formed on the GaN substrate and the α-SiC substrate. For example, nitride-based semiconductor layers having main surfaces formed by an a-plane and an m-plane are formed on the a-plane and the m-plane of the α-SiC substrate, respectively. An r-plane sapphire substrate formed with a nitride-based semiconductor having a main surface formed by the a-plane may be employed as the substrate. A LiAlO$_2$ substrate or a LiGaO$_2$ substrate formed with the nitride-based semiconductor layers having the main surfaces formed by the a-plane and the m-plane can be employed as the substrate.

In the p-n junction light-emitting diode chip 10, the first and second semiconductors 1 and 3 have different conductivity types. The first semiconductor 1 may be the p-type and the second semiconductor 3 may be the n-type, or the first semiconductor 1 may be the n-type and the second semiconductor 3 may be the p-type.

The first and second semiconductors 1 and 3 may include cladding layers (not shown) having band gaps larger than that of the light-emitting layer 2. Further, each of the first and second semiconductors 1 and 3 may include a cladding layer and a contact layer (not shown) successively from the light-emitting layer 2 side. In this case, the contact layer preferably has a smaller band gap than the cladding layer.

In the light-emitting layer 2 of the quantum well, GaInN can be employed as a well layer, and AlGaN, GaN and GaInN having band gaps larger than that of the well layer can be employed as the barrier layer. GaN and AlGaN can be employed as the cladding layer and the contact layer.

The second electrode 5 may be formed on a part of a region on the second semiconductor 3. In a case where the light-emitting diode chip 10 is a light-emitting diode, an electrode formed on a light-emission side (upper side) (second electrode 5, in this case) preferably has translucence.

A plain orientation of a substrate in forming a semiconductor light-emitting device by a method of forming the nitride-based semiconductor layer of the present invention will be now described with reference to FIG. 2.

Figure 2:
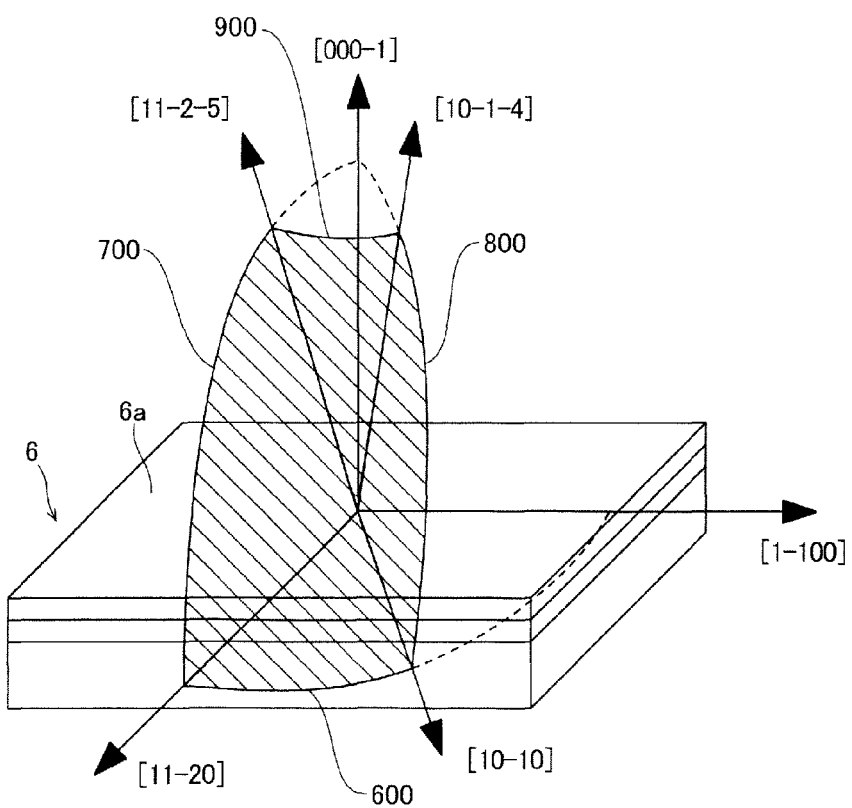
FIG. 2 A diagram showing a range of a crystal orientation of a nitride-based semiconductor and a normal direction of a main surface of a substrate in a case of forming a nitride-based semiconductor light-emitting device through a manufacturing process of the present invention.

As shown in FIG. 2, a normal direction of a main surface 6a of a substrate 6 is in an area (region hatched by slant lines) enclosed with a line 600 connecting a [11-20] direction and a substantially [10-10] direction ([C+D, C, -2C-D, 0] direction (C and D satisfy C>0 and D≥0, and at least either one of C and D is a nonzero integer)), a line 700 connecting the [11-20] direction and a substantially [11-2-5] direction ([1, 1, -2, -E] direction (0≤E≤5c)), a line 800 connecting a [10-10] direction and a substantially [10-1-4] direction ([1, -1, 0, -F] direction (0≤F≤4)), and a line 900 connecting a substantially [11-2-5] direction and a substantially [10-1-4] direction ([G+H, G, -2G-H, -5G-4H] direction (G and H satisfy G≥0 and H≥0, and at least either one of G and H is a nonzero integer)).

First Embodiment

A structure of a nitride-based semiconductor laser device 50 according to a first embodiment will be now described with reference to FIGS. 3 to 6.

Figure 3:
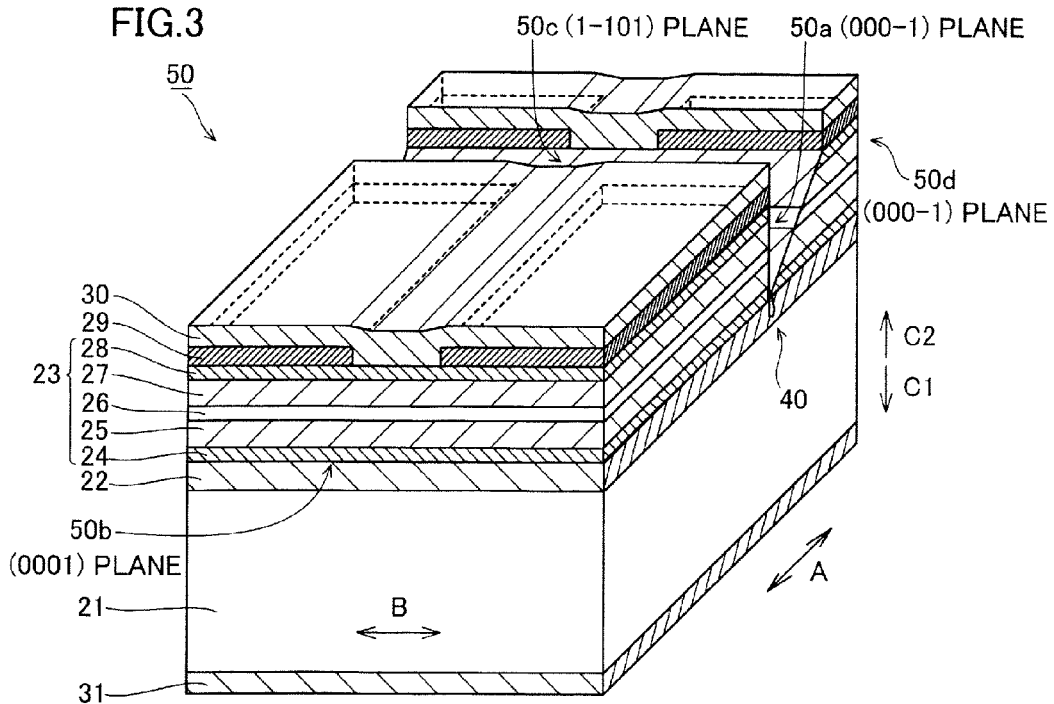
FIG. 3 A perspective view showing a structure of a nitride-based semiconductor laser device according to a first embodiment of the present invention.
Figure 4:
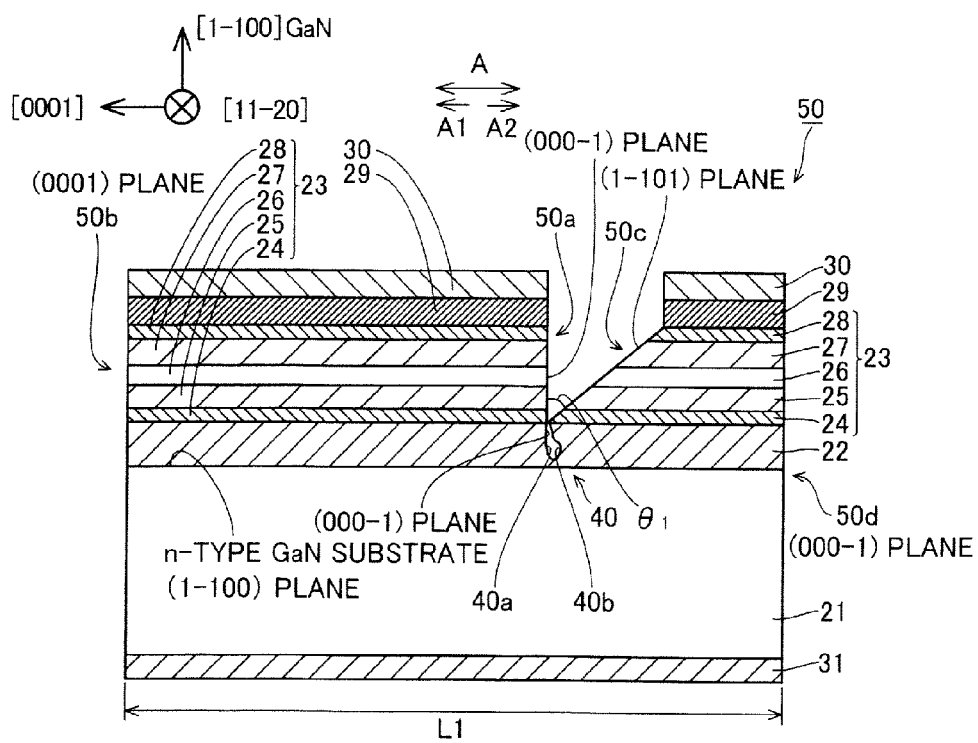
FIG. 4 A sectional view taken along a cavity direction of the semiconductor laser device, for illustrating the structure of the nitride-based semiconductor laser device according to the first embodiment shown in FIG. 3.

In the nitride-based semiconductor laser device 50 according to the first embodiment, a semiconductor laser device layer 23 having a thickness of about 3.1 μm is formed on an underlayer 22 made of AlGaN having a thickness of about 3 μm to about 4 μm formed on an n-type GaN substrate 21 having a thickness of about 100 μm, as shown in FIGS. 3 and 4. As shown in FIG. 4, in the semiconductor laser device layer 23, a length L1 between laser device ends (direction A) is about 1560 μm, and a light-emitting surface 50a and a light-reflecting surface 50b substantially perpendicular to a main surface of the n-type GaN substrate 21 is formed in a cavity direction (direction A) which is a [0001] direction. The n-type GaN substrate 21 and the semiconductor laser device layer 23 are examples of the "substrate" and the "nitride-based semiconductor device layer" in the present invention, respectively, and the light-emitting surface 50a is an example of the "facet" in the present invention. The light-emitting surface 50a and the light-reflecting surface 50b are distinguished by the large-small relation between intensity levels of laser beams emitted from cavity facets formed on the light-emitting side and the light-reflecting side, respectively. In other words, the side on which the emission intensity of the laser beam is relatively large is the light-emitting surface 50a, and the side on which the emission intensity of the laser beam is relatively small is the light-reflecting surface 50b.

According to the first embodiment, the semiconductor laser device layer 23 is formed on a main surface formed by an m-plane ((1-100) plane) which is a nonpolar face of the n-type GaN substrate 21 through the underlayer 22. The underlayer 22 is formed with a crack 40 having an inner side surface 40a formed by a (000-1) plane formed in crystal growth. The crack 40 is an example of the "recess portion" in the present invention, and the inner side surface 40a is an example of the "first side surface of the recess portion" in the present invention. As shown in FIG. 4, the light-emitting surface 50a of the semiconductor laser device layer 23 is constituted by a facet formed by the (000-1) plane crystal-grown to start from the inner side surface 40a of the crack 40 of the underlayer 22. The light-reflecting surface 50b of the semiconductor laser device layer 23 is formed by a c-plane ((0001) plane) which is the facet perpendicular to the [0001] direction (along arrow A1 in FIG. 4).

While the crack 40 employed as the recess portion is formed on the underlayer 22 by utilizing difference between lattice constants of the n-type GaN substrate 21 and the underlayer 22 when crystal-growing the underlayer 22 in the first embodiment, an inner side surface (inner side surface of the recess portion) including the (000-1) plane may be formed by mechanical scribing, laser scribing, dicing, etching and the like from a surface side of the underlayer 22 after crystal-growing the underlayer 22. When forming the recess portion by the aforementioned method, the underlayer 22 may be made of GaN having a lattice constant similar to that of the n-type GaN substrate 21 which is the substrate (base substrate). Further, a recess portion (shown as a groove 80 in a second embodiment) having an inner side surface formed by a (000-1) plane may be directly formed on a surface of the n-type GaN substrate 21 by mechanical scribing, laser scribing, dicing, etching and the like.

Figure 6:
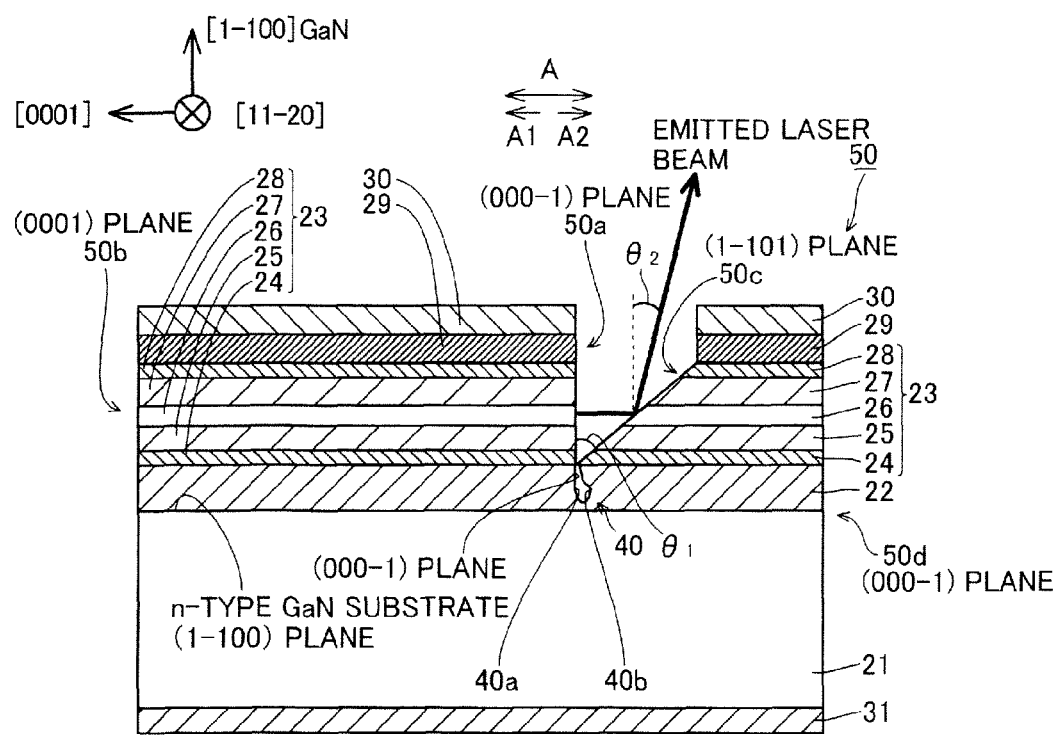
FIG. 6 A sectional view for illustrating an operation of the nitride-based semiconductor laser device according to the first embodiment shown in FIG. 3.

According to the first embodiment, the semiconductor laser device layer 23 is formed with a reflection surface 50c extending in a direction inclined at an angle $\theta_1$ (=about 62°) with respect to the light-emitting surface 50a on a region opposed to the light-emitting surface 50a in a [000-1] direction (along arrow A2), as shown in FIG. 4. The reflection surface 50c is formed by a growth surface (facet) formed by a (1-101) plane following crystal growth in forming the semiconductor laser device layer 23. Thus, the nitride-based semiconductor laser device 50 is so formed that a laser beam emitted from the light-emitting surface 50a of a light-emitting layer 26, described later, along arrow A2 can be emitted outside by changing an emission direction to a direction inclined at an angle $\theta_2$ (=about 34°) with respect to the light-emitting surface 50a by the reflection surface 50c, as shown in FIG. 6. As shown in FIG. 4, a facet 50d formed by the (000-1) plane of the semiconductor laser device layer 23 is formed on an end of the semiconductor laser device layer 23 along arrow A2 by bar-shaped cleavage in a manufacturing process.

The semiconductor laser device layer 23 includes a buffer layer 24, an n-type cladding layer 25, the light-emitting layer 26, a p-type cladding layer 27 and a p-type contact layer 28. More specifically, the buffer layer 24 made of undoped $Al_{0.01}Ga_{0.99}N$ having a thickness of about 1.0 μm and the n-type cladding layer 25 made of Ge-doped $Al_{0.07}Ga_{0.93}N$ having a thickness of about 1.9 μm are formed on an upper surface of the underlayer 22 formed on the n-type GaN substrate 21, as shown in FIGS. 3 and 4.

Figure 5:
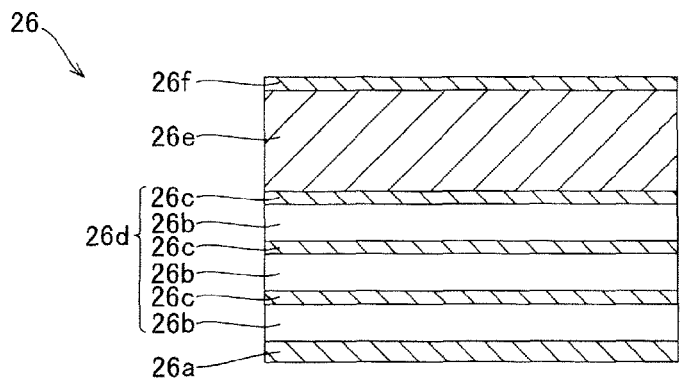
FIG. 5 An enlarged sectional view showing a light-emitting layer of the nitride-based semiconductor laser device according to the first embodiment shown in FIG. 4 in detail.

The light-emitting layer 26 is formed on the n-type cladding layer 25. As shown in FIG. 5, the light-emitting layer 26 is constituted by the n-side carrier blocking layer 26a made of $Al_{0.2}Ga_{0.8}N$ having a thickness of about 20 nm, an MQW active layer 26d, a p-side optical guide layer 26e made of undoped $In_{0.01}Ga_{0.99}N$ having a thickness of about 0.8 nm and a carrier blocking layer 26f made of $Al_{0.25}Ga_{0.75}N$ having a thickness of about 20 nm successively from a side closer to the n-type cladding layer 25 (see FIG. 4). In the MQW active layer 26d, three quantum well layers 26b made of undoped $In_{0.15}Ga_{0.85}N$ having a thickness of about 2.5 nm and three quantum barrier layers 26c made of undoped $In_{0.02}Ga_{0.28}N$ having a thickness of about 20 nm are alternately stacked. The n-type cladding layer 25 has a larger band gap than the MQW active layer 26d. An optical guide layer having an intermediate band gap between those of the n-side carrier blocking layer 26a and the MQW active layer 26d may be formed between the n-side carrier blocking layer 26a and the MQW active layer 26d. The MQW active layer 26d may alternatively have a single-layer structure or an SQW structure.

As shown in FIGS. 3 and 4, the p-type cladding layer 27 made of Mg doped $Al_{0.07}Ga_{0.93}N$ having a thickness of about 0.5 μm is formed on the light-emitting layer 26. The p-type cladding layer 27 has a larger band gap than the MQW active layer 26d. The p-type contact layer 28 made of undoped $In_{0.07}Ga_{0.92}N$ having a thickness of about 3 nm is formed on the p-type cladding layer 27. The buffer layer 24, the n-type cladding layer 25, the light-emitting layer 26, the p-type cladding layer 27 and the p-type contact layer 28 are each an example of the "nitride-based semiconductor device layer" in the present invention.

As shown in FIG. 3, a current blocking layer 29 made of $SiO_2$ having a thickness of about 200 nm is formed on a prescribed region on an upper surface of the p-type contact layer 28.

A p-side electrode 30 constituted by a Pt layer having a thickness of about 5 nm and a Pd layer having a thickness of about 100 nm successively from a side closer to the upper surface of the p-type contact layer 28 is formed on a region, formed with no current blocking layer 29, of the upper surface of the p-type contact layer 28 (in the vicinity of a central portion in a direction B of FIG. 3). The p-side electrode 30 is formed to cover an upper surface of the current blocking layer 29.

As shown in FIGS. 3 and 4, an n-side electrode 31 constituted by an Al layer having a thickness of about 10 nm, a Pt layer having a thickness of about 20 nm and an Au layer having a thickness of about 300 nm successively from a side closer to the n-type GaN substrate 21 is formed on a lower surface of the n-type GaN substrate 21. This n-side electrode 31 is formed on the overall lower surface of the n-type GaN substrate 21 to extend to both side portions of the nitride-based semiconductor laser device 50 in the direction A, as shown in FIG. 4.

A manufacturing process of the nitride-based semiconductor laser device 50 according to the first embodiment will be now described with reference to FIGS. 3 to 5, and FIGS. 7 to 11.

Figure 7:
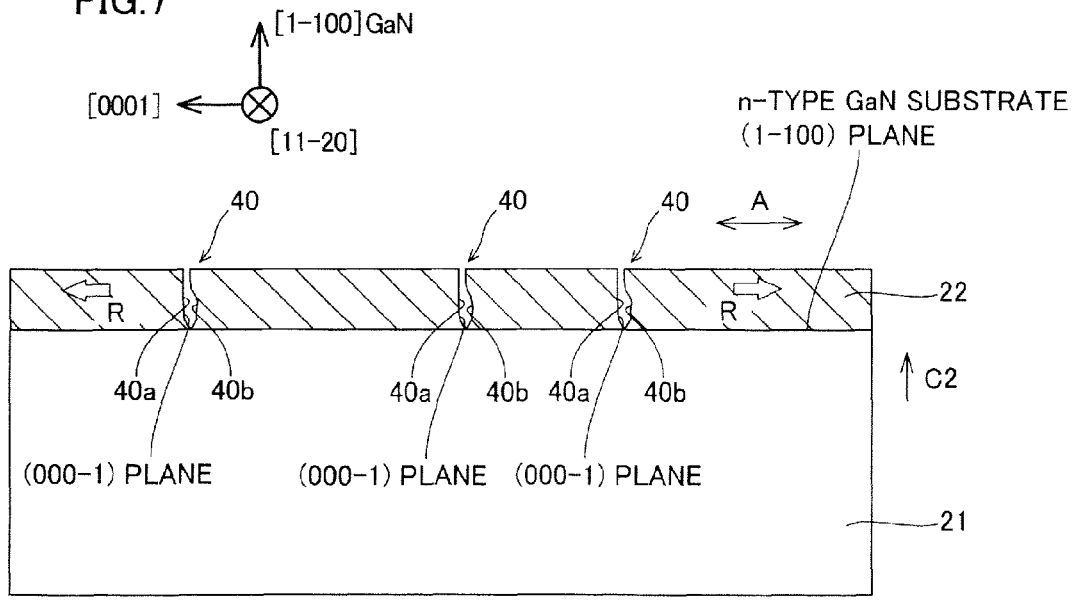
FIG. 7 A sectional view for illustrating a manufacturing process of the nitride-based semiconductor laser device according to the first embodiment shown in FIG. 3.
Figure 8:
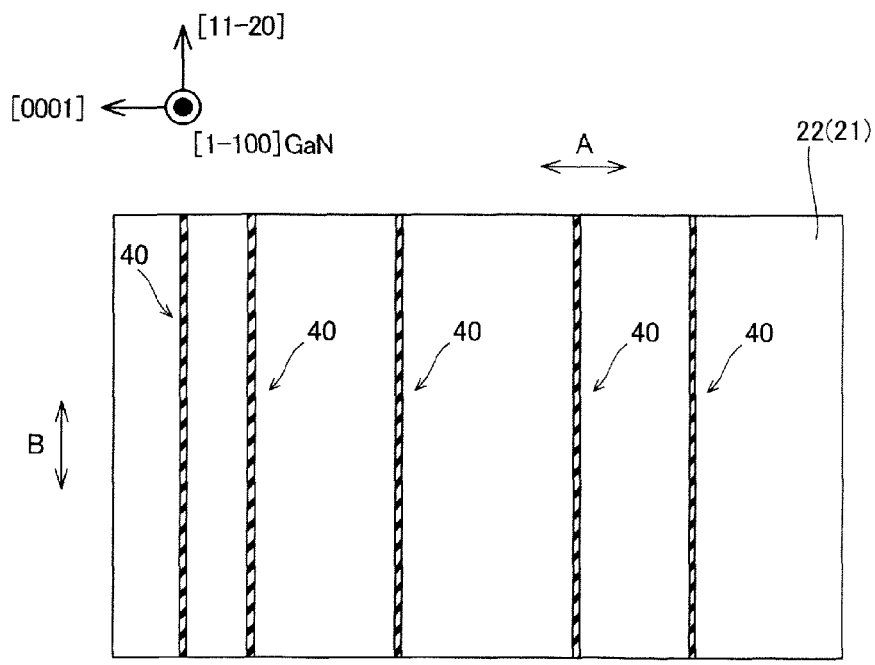
FIG. 8 A plan view for illustrating the manufacturing process of the nitride-based semiconductor laser device according to the first embodiment shown in FIG. 3.

As shown in FIG. 7, the underlayer 22 is grown on the n-type GaN substrate 21 to have a thickness of about 3 μm to about 4 μm by metal organic chemical vapor deposition (MOCVD). When the underlayer 22 is crystal-grown, a lattice constant $c_2$ in the [0001] direction of the underlayer 22 made of AlGaN is smaller than a lattice constant $c_1$ in the [0001] direction of the n-type GaN substrate 21 ($c_1 > c_2$), and hence tensile stress R is caused inside the underlayer 22, a thickness of which reaches a prescribed thickness, in response to the lattice constant $c_1$ of the n-type GaN substrate 21. Consequently, the cracks 40 as shown in FIG. 7 are formed on the underlayer 22 following local contraction of the underlayer 22 in the direction A. At this time, the cracks 40 are formed in a striped manner in the [11-20] direction (direction B) orthogonal to the [0001] direction (direction A) of the n-type GaN substrate 21, as shown in FIG. 8.

According to the first embodiment, when forming the cracks 40 on the underlayer 22, the cracks 40 are formed with the inner side surfaces 40a formed by the (000-1) plane of the AlGaN layer and reaching the (1-100) plane of the upper surface of the n-type GaN substrate 21, as shown in FIG. 7. These inner side surfaces 40a are formed substantially perpendicular to the main surface, formed by the (1-100) plane, of the n-type GaN substrate 21. The cracks 40 are formed by utilizing the tensile stress R caused inside the underlayer 22, and hence the inner side surfaces 40a can be easily coincide with a crystallographical plane index (000-1) plane dissimilarly to a case where the recess portions are formed by external processing techniques (mechanical scribing, laser scribing, dicing, etching, etc. for example). Consequently, the inner side surfaces 40a can be formed as extremely flat (000-1) planes, and hence the semiconductor laser device layer 23 having flat facets starting from the (000-1) planes of the inner side surfaces 40a can be easily grown when crystal-growing the semiconductor laser device layer 23 on the flat inner side surfaces 40a.

According to the first embodiment, the cracks 40 reaching the upper surface of the n-type GaN substrate 21 are formed inside the underlayer 22 described above, and hence lattice strains of the underlayer 22 different in lattice constant from the n-type GaN substrate 21 can be opened. Therefore, the crystal quality of the underlayer 22 is excellent, and the semiconductor laser device layer 23 formed on the underlayer 22 can be brought into a high quality crystalline state. Consequently, electric characteristics of the n-type cladding layer 25, the n-side carrier blocking layer 26a, the carrier blocking layer 26f, the p-type cladding layer 27 and the p-type contact layer 28 formed through steps described later are improved, and light absorption in these layers can be suppressed. Further, internal loss of the light-emitting layer 26 (the n-side carrier blocking layer 26a, the MQW active layer 26d, the p-side optical guide layer 26e and the carrier blocking layer 26f) is reduced, and the luminous efficiency of the light-emitting layer 26 can be improved. While the cracks 40 reaching the upper surface of the n-type GaN substrate 21 are formed inside the underlayer 22 in the first embodiment, grooves having a depth corresponding to a thickness of the underlayer 22 may be formed in a thickness direction (along arrow C2 in FIG. 7) of the underlayer 22. Also according to this structure, internal strains of the underlayer 22 can be opened by the grooves having the depth corresponding to the thickness of the underlayer 22, and hence effects similar to those in a case of forming the cracks 40 can be attained.

Figure 9:
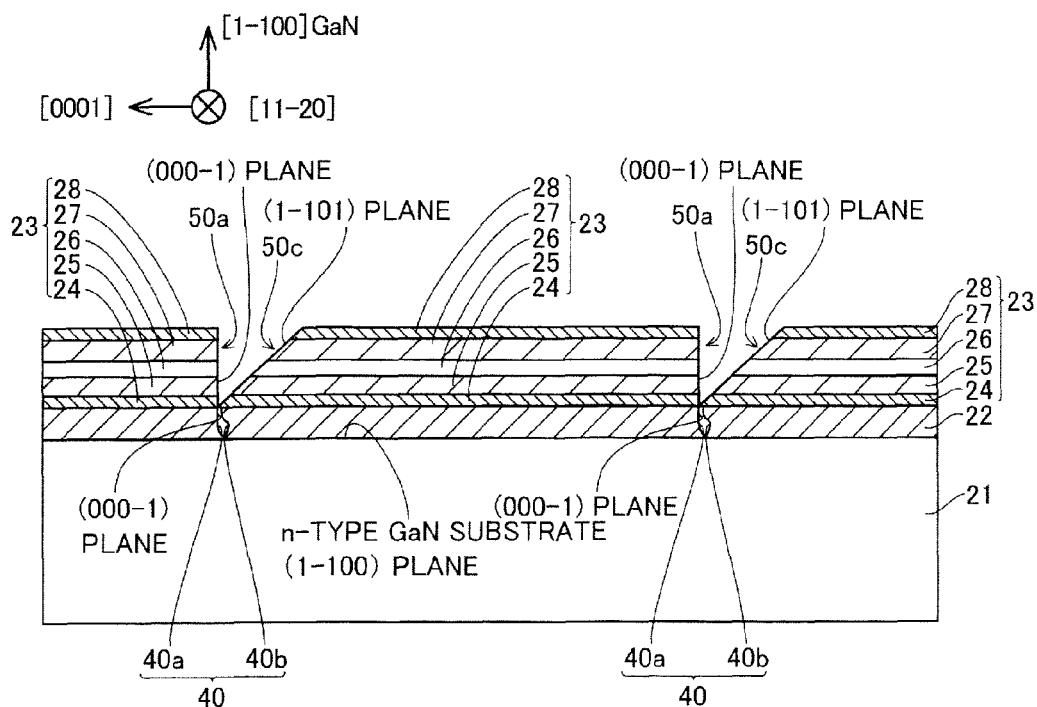
FIG. 9 A sectional view for illustrating the manufacturing process of the nitride-based semiconductor laser device according to the first embodiment shown in FIG. 3.

As shown in FIG. 9, the semiconductor laser device layer 23 is formed by successively growing the buffer layer 24, the n-type cladding layer 25, the light-emitting layer 26 (see FIG. 5 in details), the p-type cladding layer 27 and the p-type contact layer 28 on the underlayer 22 formed with the cracks 40 by MOCVD.

More specifically, in forming the aforementioned semiconductor laser device layer 23, carrier gas of $H_2$ containing trimethylgallium (TMGa) and trimethylaluminum (TMAl) employed as Ga and Al sources is supplied into a reactor in a state where a substrate temperature is kept at a growth temperature of about 1000° C., and the buffer layer 24 is grown on the n-type GaN substrate 21. Then, carrier gas of $H_2$ containing TMGa, TMAl and $GeH_4$ (monogerman) employed as a Ge impurity source for obtaining an n-type conductivity type is supplied into the reactor, and the n-type cladding layer 25 is grown on the buffer layer 24. Thereafter, $H_2$ gas containing TMGa and TMAl is supplied into the reactor, and the n-side carrier blocking layer 26a is grown on the n-type cladding layer 25.

Triethyl gallium (TEGa) and trimethyl indium (TMIn) employed as Ga and In sources are supplied in a nitrogen gas atmosphere obtained by supplying $NH_3$ gas into the reactor in a state where the substrate temperature reduced to a growth temperature of about 850° C. is kept, and the MQW active layer 26d and the p-side optical guide layer 26e are grown. Then, TMGa and TMAl are supplied into the reactor, and the carrier blocking layer 26f is grown. The light-emitting layer 26 (see FIG. 5) is formed in the aforementioned manner.

Then, $Mg(C_5H_5)_2$ (cyclopentadienyl magnesium) employed as a Mg source serving as a p-type impurity, and TMGa and TMAl employed as Ga and Al sources are supplied into an atmosphere of hydrogen gas and nitrogen gas obtained by supplying $NH_3$ gas into the reactor in a state where the substrate temperature increased to a growth temperature of about 1000° C. is kept, and the p-type cladding layer 27 is grown on the light-emitting layer 26. Thereafter, TEGa and TMIn employed as Ga and In sources are supplied in a nitrogen gas atmosphere obtained by supplying $NH_3$ gas into the reactor in a state where the substrate temperature reduced to a growth temperature of about 850° C. again is kept, and the p-type contact layer 28 is grown. The semiconductor laser device layer 23 is formed on the underlayer 22 in the aforementioned manner.

Figure 10:
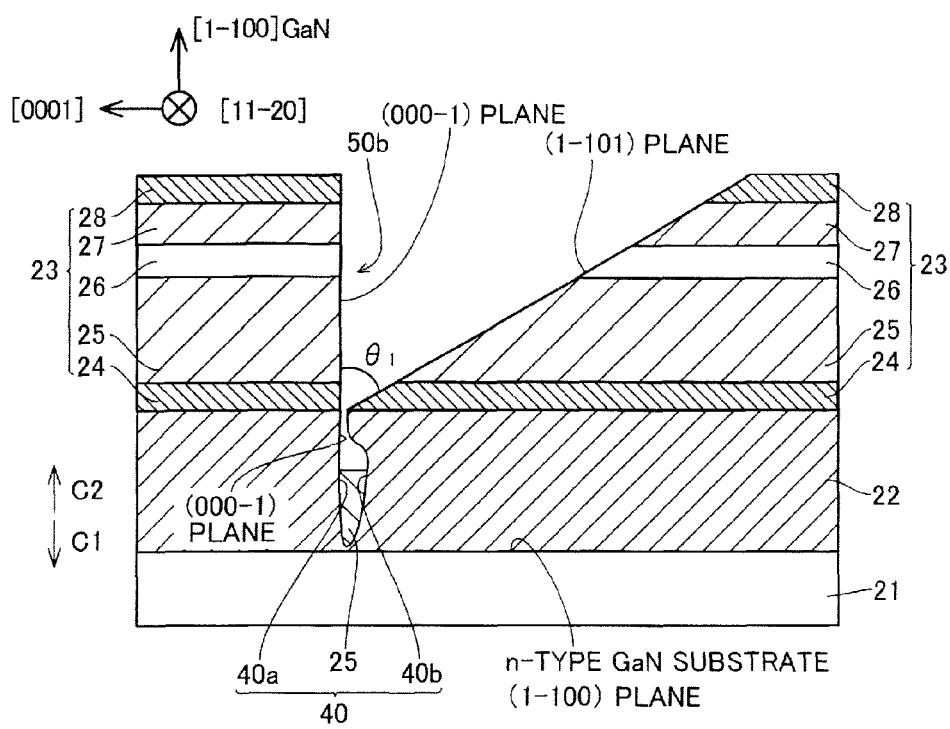
FIG. 10 An enlarged sectional view for illustrating the manufacturing process of the nitride-based semiconductor laser device according to the first embodiment shown in FIG. 3.

In the manufacturing process according to the first embodiment, when the semiconductor laser device layer 23 is grown on the underlayer 22, the semiconductor laser device layer 23 is crystal-grown on the inner side surfaces 40a formed by the (000-1) planes of the cracks 40 extending in a striped manner in the direction B (see FIG. 8), while forming the (000-1) planes extending in a [1-100] direction (along arrow C2) to start from the (000-1) planes of the cracks 40, as shown in FIG. 10. Thus, the (000-1) plane of the semiconductor laser device layer 23 can be easily formed as the light-emitting surface 50a of each pair of the cavity facets in the nitride-based semiconductor laser device 50 without complicating the manufacturing process dissimilarly to a case of forming the facets by etching or scribing.

In the manufacturing process according to the first embodiment, the semiconductor laser device layer 23 is formed with the reflection surfaces 50c employed as growth surfaces extending in the direction inclined at the angle $\theta_1$ (=about 62°) with respect to the light-emitting surfaces 50a on inner side surface 40b sides opposed to the inner side surfaces 40a of the cracks 40, as shown in FIG. 10. The reflection surfaces 50c are the facets (growth surfaces) formed by the (1-101) planes following crystal growth of the semiconductor laser device layer 23. Thus, the light-emitting surfaces 50a substantially perpendicular to the main surface of the n-type GaN substrate 21 and the reflection surfaces 50c can be formed in simultaneously the crystal growth of the semiconductor laser device layer 23.

In the manufacturing process according to the first embodiment, the facet formation of the light-emitting surface 50a and the reflection surface 50c is not performed by etching or scribing, and hence impurities in forming the facets (the light-emitting surfaces 50a and the reflection surfaces 50c) are in no danger of being introduced in the next step. Therefore, the semiconductor laser device layer 23 having the light-emitting surfaces 50a formed by (000-1) facets with high cleanliness and the reflection surfaces 50c formed by the (1-101) planes can be formed.

Then, p-type annealing treatment is performed in a nitrogen gas atmosphere under a temperature condition of about 800° C. As shown in FIG. 3, resist patterns are formed on the upper surface of the p-type contact layer 28 by photolithography and the resist patterns are thereafter employed as masks for dry etching, thereby forming the current blocking layer 29 made of $SiO_2$. As shown in FIGS. 3 and 11, the p-side electrodes 30 are formed on the current blocking layer 29 and the p-type contact layer 28 formed with no current blocking layer 29 by vacuum evaporation. FIG. 11 shows a sectional structure taken along the cavity direction (direction A) of the semiconductor laser device located on the position formed with the current blocking layer 29.

As shown in FIG. 11, the lower surface of the n-type GaN substrate 21 is so polished that a thickness of the n-type GaN substrate 21 reaches a thickness of about 100 μm, and an n-side electrode 31 is thereafter formed on the lower surface of the n-type GaN substrate 21 by vacuum evaporation.

As shown in FIG. 11, linear scribing grooves 41 are so formed on positions to be formed with prescribed (0001) planes on the lower side of the n-side electrode 31 as to extend in a direction (direction B in FIG. 3) orthogonal to the [0001] direction (direction A in FIG. 3) of the n-type GaN substrate 21 by laser scribing or mechanical scribing. In this state, the wafer is cleaved on the position (cleavage line 1000) of each scribing groove 41 by applying a load while fulcruming the lower side of the n-type GaN substrate 21 so that the surface (upper side) of the wafer opens, as shown in FIG. 11. Thus, the (0001) plane of the semiconductor laser device layer 23 is formed as the light-reflecting surface 50b of each pair of the cavity facets in the nitride-based semiconductor laser device 50.

Thereafter, the device is separated into chips by division along the cavity direction (direction A), thereby forming the nitride-based semiconductor laser device 50 according to the first embodiment shown in FIGS. 3 and 4.

According to the first embodiment, as hereinabove described, the nitride-based semiconductor laser device 50 comprises the reflection surface 50c formed by the (1-101) plane which is the growth surface in crystal growth of the semiconductor laser device layer 23, extending in the direction inclined at the angle $\theta_1$ (=about 62°) with respect to the light-emitting surface 50a formed by the (000-1) plane, whereby the reflection surface 50c inclined with respect to the light-emitting surface 50a can be formed simultaneously with the crystal growth for forming the semiconductor laser device layer 23 on the main surface of the n-type GaN substrate 21. Thus, the manufacturing process of the nitride-based semiconductor laser device 50 can be inhibited from complication, dissimilarly to a case of growing a flat semiconductor device layer on the n-type GaN substrate and thereafter forming the reflection surfaces inclined at the prescribed angle with respect to the cavity facets (light-emitting surface) by ion beam etching.

According to the first embodiment, the reflection surface 50c is formed by the (1-101) plane which is the growth surface (facet) of the semiconductor laser device layer 23, whereby the reflection surface 50c can obtain excellent flatness. Thus, the laser beam emitted from the light-emitting surface 50a can be emitted outside by uniformly changing the emission direction to the direction inclined at the angle $\theta_2$ (=about 34°) with respect to the light-emitting surface 50a without scattering by the reflection surface 50c. Therefore, reduction in luminous efficiency of the nitride-based semiconductor laser device 50 can be suppressed, dissimilarly to a semiconductor laser device formed with a reflection surface having small unevenness by ion beam etching.

According to the first embodiment, the nitride-based semiconductor laser device 50 comprises the semiconductor laser device layer 23 having the light-emitting layer 26 with the main surface formed by the (1-100) plane on the n-type GaN substrate 21, whereby a piezoelectric field caused in the semiconductor laser device layer 23 (light-emitting layer 26) can be reduced. Thus, luminous efficiency of a laser beam can be improved.

According to the first embodiment, the light-emitting surface 50a formed by the (000-1) plane is formed by the growth surface of the semiconductor laser device layer 23, whereby the light-emitting surface 50a can be formed in simultaneously the crystal growth of the semiconductor laser device layer 23. Thus, the manufacturing process of the nitride-based semiconductor laser device 50 can be inhibited from complication, dissimilarly to a case of growing a semiconductor device layer on the n-type GaN substrate and thereafter forming the cavity facet substantially perpendicular to the main surface on the n-type GaN substrate by ion beam etching.

According to the first embodiment, the n-type GaN substrate 21 made of GaN is employed, whereby the reflection surface 50c inclined at the angle $\theta_1$ (=about 62°) with respect to the light-emitting surface 50a can be easily formed on the n-type GaN substrate 21 by utilizing the crystal growth of the nitride-based semiconductor layer.

According to the first embodiment, the n-type GaN substrate 21 having the main surface formed by the m-plane ((1-100) plane) is employed, whereby the semiconductor laser device layer 23 (light-emitting layer 26) is particularly formed on the n-type GaN substrate 21 having the main surface formed by a non-polar plane, and hence a piezoelectric field caused in the semiconductor laser device layer 23 can be further reduced. Thus, luminous efficiency of a laser beam can be further improved.

According to the first embodiment, the reflection surface 50c formed on the semiconductor laser device layer 23 has a plain orientation of the (1-101) plane, whereby the aforementioned reflection surface 50c is mostly covered with nitrogen atoms by utilizing crystal growth of the nitride-based semiconductor layer, and hence oxygen in the atmosphere is inhibited from being incorporated into the reflection surface 50c. Thus, deterioration of the reflection surface 50c following oxidation is suppressed. Consequently, a reflectance of a laser beam does not change over time, and a stable laser beam can be obtained.

According to the first embodiment, the underlayer 22 is formed on the n-type GaN substrate 21, and the light-emitting surface 50a formed by the (000-1) plane of the semiconductor laser device layer 23 is formed substantially perpendicular to the main surface of the n-type GaN substrate 21 along the (000-1) plane formed by the inner side surface 40a of the crack 40 formed to extending in the striped manner in the [11-20] direction (direction B in FIG. 8) of the m-plane ((000-1) plane) which is the main surface of the underlayer 22 on the n-type GaN substrate 21. Thus, the semiconductor laser device layer 23 having the light-emitting surface 50a formed by the (000-1) plane substantially perpendicular to the main surface of the n-type GaN substrate 21 can be easily formed by utilizing the inner side surface 40a of the crack 40 formed in the [11-20] direction substantially orthogonal to a c-axis direction ([0001] direction) in the m-plane ((000-1) plane) of the n-type GaN substrate 21 when forming the nitride-based semiconductor layer on the main surface of the n-type GaN substrate 21.

According to the first embodiment, the inner side surface 40a of the crack 40 formed on the n-type GaN substrate 21 is formed by the (000-1) plane, whereby the semiconductor laser device layer 23 having the light-emitting surface 50a formed by the (000-1) facet so as to start from the (000-1) plane of the crack 40 formed on the underlayer 22 on the n-type GaN substrate 21 can be easily formed when forming the semiconductor laser device layer 23 on the n-type GaN substrate 21.

Modification of First Embodiment

In a nitride-based semiconductor laser device 60 according to a modification of the first embodiment, a case where a semiconductor laser device layer 23 is formed on a main surface formed by an a-plane ((11-20) plane) which is a nonpolar face of an n-type GaN substrate 61 through an underlayer 22 dissimilarly to the aforementioned first embodiment will be described with reference to FIG. 12. The n-type GaN substrate 61 is an example of the "substrate" in the present invention.

According to the modification of the first embodiment, a light-emitting surface 60a of the semiconductor laser device layer 23 is constituted by a facet formed by a (000-1) plane crystal-grown to start from an inner side surface 40a of a crack 40 of the underlayer 22, as shown in FIG. 12. The semiconductor laser device layer 23 is formed with a reflection surface 60c extending in a direction inclined at an angle $\theta_3$ (=about 58°) with respect to the light-emitting surface 60a on a region opposed to the light-emitting surface 60a in a [000-1] direction (along arrow A2). The reflection surface 60c is formed by a facet formed by a (11-22) plane following crystal growth in forming the semiconductor laser device layer 23. Thus, the nitride-based semiconductor laser device 60 is so formed that a laser beam emitted from the light-emitting surface 60a of a light-emitting layer 26 along arrow A2 can be emitted outside by changing an emission direction to a direction inclined at an angle $\theta_4$ (=about 26°) with respect to the light-emitting surface 60a by the reflection surface 60c.

As shown in FIG. 12, a facet 60d formed by the (000-1) plane of the semiconductor laser device layer 23 is formed on an end of the semiconductor laser device layer 23 along arrow A2 by bar-shaped cleavage in a manufacturing process. The remaining structure and manufacturing process of the nitride-based semiconductor laser device 60 according to the modification of the first embodiment are similar to those of the aforementioned first embodiment.

According to the modification of the first embodiment, as hereinabove described, the semiconductor laser device layer 23 including the light-emitting surface 60a formed by the (000-1) plane and the reflection surface 60c formed by the (11-22) plane by utilizing the crystal growth is formed on the n-type GaN substrate 61 having the main surface, the plain orientation of which is the a-plane ((11-20) plane), through the underlayer 22, whereby the manufacturing process can be inhibited from complication similarly to the aforementioned first embodiment, dissimilarly to a case where a flat semiconductor device layer is formed on the n-type GaN substrate and the light-emitting surfaces, light-reflecting surfaces and the reflection surfaces are thereafter formed by ion beam etching, so that the semiconductor laser device is formed. The remaining effects of the nitride-based semiconductor laser device 60 according to the modification of the first embodiment is similar to those of the aforementioned first embodiment.

Example

Figure 13:
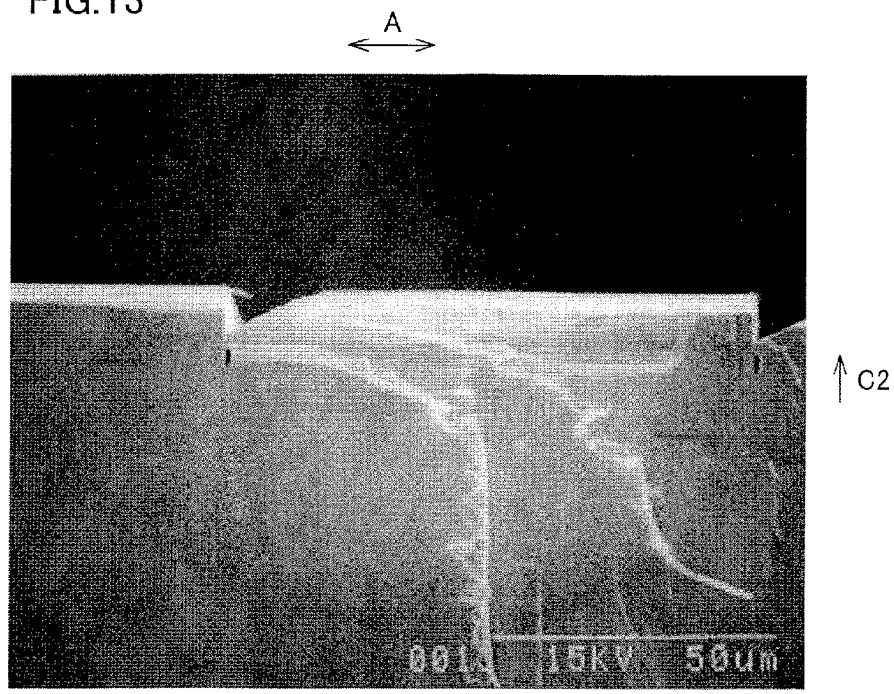
FIG. 13 A photomicrograph of a state of crystal growth of a semiconductor layer on an n-type GaN substrate through a manufacturing process according to the first embodiment shown in FIG. 10, observed with a scanning electron microscope.
Figure 14:
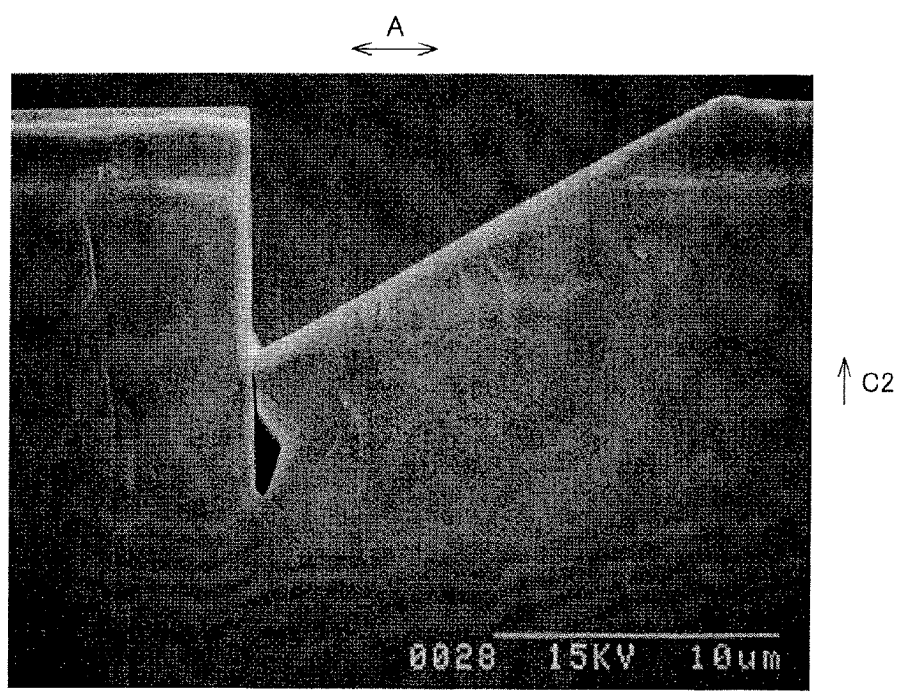
FIG. 14 A photomicrograph of the state of the crystal growth of the semiconductor layer on the n-type GaN substrate through the manufacturing process according to the first embodiment shown in FIG. 10, observed with the scanning electron microscope.

An experiment conducted for confirming the aforementioned effects of the aforementioned first embodiment will be described with reference to FIGS. 8, 13 and 14.

In this confirmatory experiment, an underlayer made of AlGaN having a thickness of 3 μm to 4 μm was first formed on an n-type GaN substrate having a main surface formed by an m-plane ((1-100) plane) by MOCVD through a manufacturing process similar to the manufacturing process of the aforementioned first embodiment. At this time, cracks shown in FIGS. 13 and 14 were formed on the underlayer resulting from difference between lattice constants of the n-type GaN substrate and the underlayer. At this time, it has been confirmed that the cracks formed (000-1) planes extending in a direction perpendicular to the main surface of the n-type GaN substrate, as shown in FIG. 14. Further, it has been confirmed that the cracks were formed in a striped manner in a [11-20] direction orthogonal to a [0001] direction of the n-type GaN substrate, as shown in FIG. 8.

A semiconductor layer of GaN was epitaxially grown on the underlayer by MOCVD. Consequently, it has been confirmed that the semiconductor layer was crystal-grown on inner side surfaces, formed by the (000-1) planes, of the cracks in a [1-100] direction while forming the (000-1) plane of GaN extending in a vertical direction (along arrow C2) so as to start from this plain orientation, as shown in FIG. 14. It has been confirmed that the inclined surfaces (facets), formed by the (1-101) planes, of GaN are formed on inner side surfaces on sides opposite to the (000-1) planes of the cracks as shown in FIG. 14. Further, it has been confirmed that each of these inclined surfaces is formed so as to form an obtuse angle with respect to the upper surface (main surface) of the semiconductor layer. Thus, it has been confirmed that the semiconductor layer can be formed on the underlayer while starting from the two inner side surfaces of each crack provided on the underlayer as starting points of crystal growth. In other words, the cavity facets (light-emitting surfaces or light-reflecting surfaces (side surfaces perpendicular to the semiconductor layer)) formed by the (000-1) planes and the facets (inclined surfaces of the semiconductor layer) formed by the (1-101) planes can be conceivably formed on the semiconductor layer (light-emitting layer) without employing a cleavage step or etching by utilizing first side surfaces of the cracks provided on the underlayer when forming the semiconductor layer by crystal growth.

It has been confirmed that not only flatness of the aforementioned (000-1) plane and (1-101) plane but also flatness of the upper surface of the semiconductor layer can be improved from difference of growth rates of portions formed with the aforementioned (000-1) plane and (1-101) plane and a growth rate of the upper surface (main surface) of the semiconductor layer along arrow C2 (see FIG. 14) in a process of the crystal growth of the semiconductor layer. It has been confirmed that voids of the cracks reaching the n-type GaN substrate in forming were partly filled up following lamination of the semiconductor layer.

In the nitride-based semiconductor light-emitting device according to the present invention and the manufacturing method thereof, it has been confirmed from results of the aforementioned confirmatory experiment that first side surfaces (light-emitting surfaces) of the cavity facets formed by the (000-1) planes and the inclined surfaces (reflection surfaces) can be simultaneously formed on the semiconductor layer (light-emitting layer) simultaneously when forming the semiconductor layer by the crystal growth.

Second Embodiment

In a nitride-based semiconductor laser device 70 according to a second embodiment, a case where grooves 80 extending in a [11-20] direction (direction perpendicular to the plane of FIG. 15) are formed on a main surface, formed by a (1-100) plane, of an n-type GaN substrate 71 by etching and a semiconductor laser device layer 23 is thereafter formed dissimilarly to the aforementioned first embodiment will be described with reference to FIGS. 15 to 17. The n-type GaN substrate 71 is an example of the "substrate" in the present invention. The groove 80 is an example of the "recess portion" in the present invention.

Figure 15:
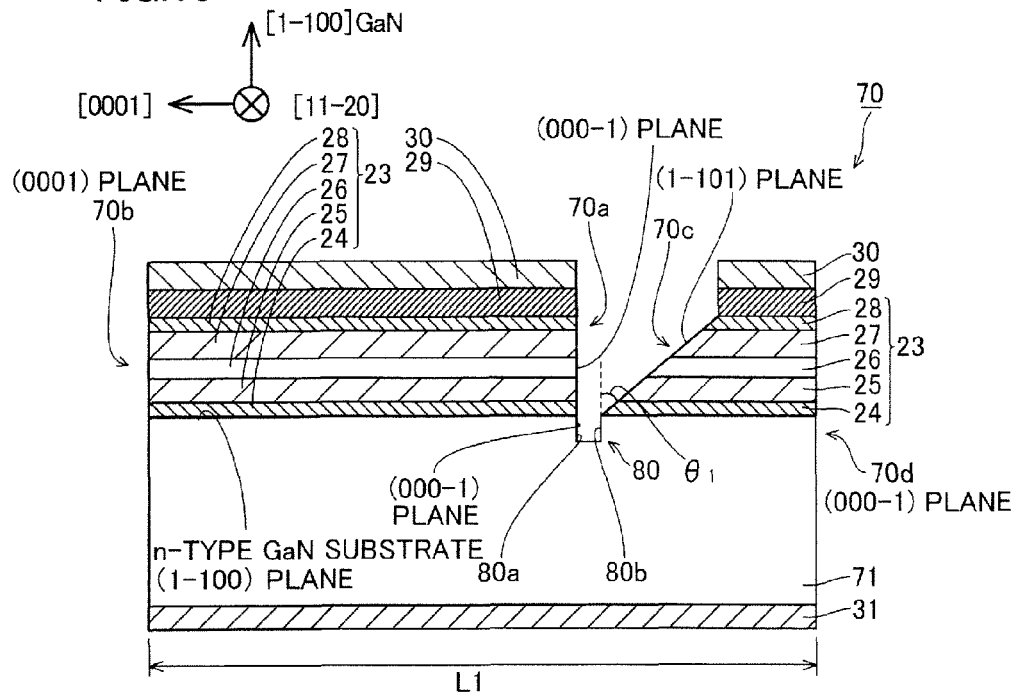
FIG. 15 A sectional view showing a structure of a nitride-based semiconductor laser device according to a second embodiment of the present invention.

In the nitride-based semiconductor laser device 70 according to the second embodiment of the present invention, the semiconductor laser device layer 23 having a structure similar to that of the first embodiment is formed on the n-type GaN substrate 71, as shown in FIG. 15. The semiconductor laser device layer 23 has a cavity length of about 1560 µm and is formed with a light-emitting surface 70a and a light-reflecting surface 70b substantially perpendicular to the main surface of the n-type GaN substrate 71 in a cavity direction which is a direction. The light-emitting surface 70a is an example of the "facet" in the present invention.

Figure 16:
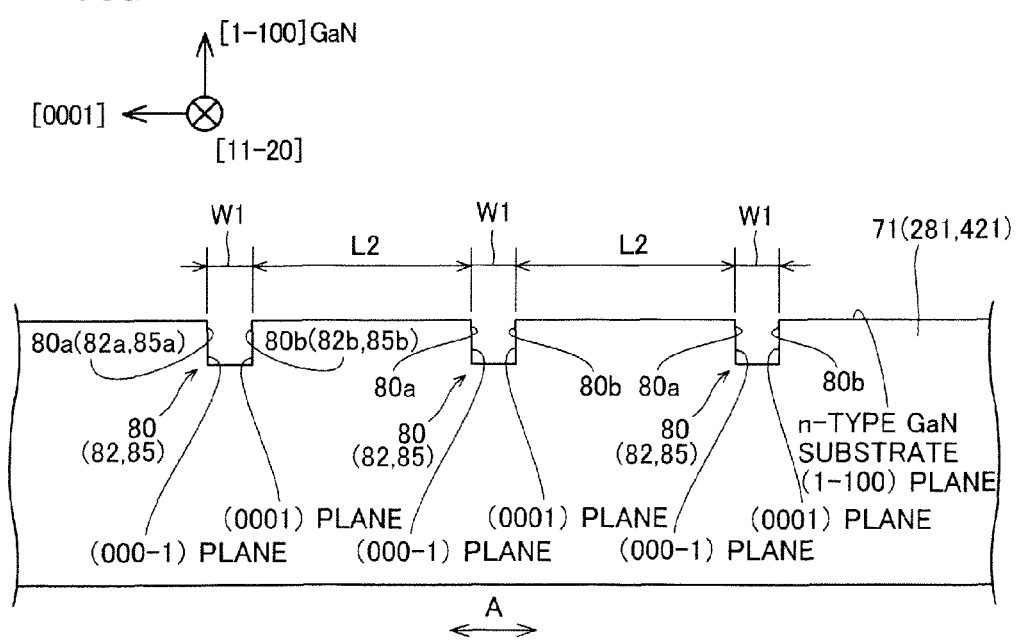
FIG. 16 A sectional view for illustrating the manufacturing process of the nitride-based semiconductor laser device according to the second embodiment shown in FIG. 15.

According to the second embodiment, the grooves 80 having a width W1 of about 10 µm in a [0001] direction (direction A) and a depth of about 2 µm and extending in the [11-20] direction (direction B) are formed on the main surface, formed by the (1-100) plane, of the n-type GaN substrate 71 by etching, dissimilarly to the manufacturing process of the nitride-based semiconductor laser device 50 according to the aforementioned first embodiment, as shown in FIG. 16. The grooves 80 are formed in a striped manner in the direction A in a period of about 1600 µm (=W1+L2). In this case, the grooves 80 are formed with inner side surfaces 80a formed by (000-1) planes substantially perpendicular to the (1-100) plane of the n-type GaN substrate 71 and inner side surfaces 80b formed by (0001) planes substantially perpendicular to the (1-100) plane of the n-type GaN substrate 71. The inner side surface 80a is an example of the "first side surface of the recess portion" in the present invention.

Figure 17:
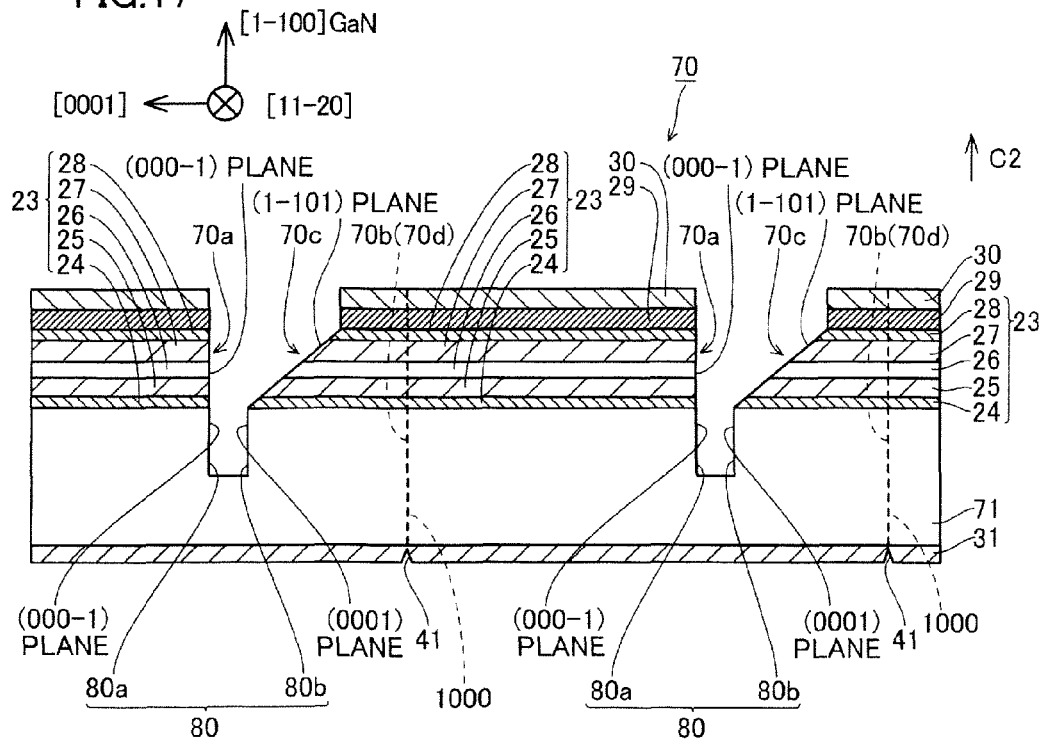
FIG. 17 A sectional view for illustrating the manufacturing process of the nitride-based semiconductor laser device according to the second embodiment shown in FIG. 15.

As shown in FIG. 17, the buffer layer 24, the n-type cladding layer 25, the light-emitting layer 26, the p-type cladding layer 27 and the p-type contact layer 28 are successively stacked on the n-type GaN substrate 71, thereby forming the semiconductor laser device layer 23.

According to the second embodiment, the semiconductor laser device layer 23 is crystal-grown on the inner side surfaces 80a formed by the (000-1) planes of the grooves 80, while forming the (000-1) planes extending in a [1-100] direction (along arrow C2) to start from the (000-1) planes of the grooves 80, as shown in FIG. 17. Thus, the (000-1) plane of the semiconductor laser device layer 23 is formed as the light-emitting surface 70a of each pair of the cavity facets in the nitride-based semiconductor laser device 70. The semiconductor laser device layer 23 is crystal-grown while forming reflection surfaces 70c (facets) formed by (1-101) planes extending in a direction inclined at an angle $\theta_1$ (=about 62°) with respect to the light-emitting surfaces 70a on the (0001) planes (inner side surfaces 80b) opposed to the (000-1) planes of the grooves 80.

Thereafter, the current blocking layer 29, the p-side electrode 30 and the n-side electrode 31 are successively formed. As shown in FIG. 17, linear scribing grooves 41 are so formed on positions corresponding to the (000-1) semiconductor facets on the lower side of the n-side electrode 31 and positions to be formed with prescribed (0001) planes as to extend parallel to the grooves 80 of the n-type GaN substrate 71 (in the direction B in FIG. 11) by laser scribing or mechanical scribing. In this state, the wafer is cleaved on the position (cleavage line 1000) of each scribing groove 41 by applying a load while fulcruming the lower side of the n-type GaN substrate 71 so that the surface (upper side) of the wafer opens, as shown in FIG. 15. Thus, the (0001) plane of the semiconductor laser device layer 23 is formed as the light-reflecting surface 70b of each pair of the cavity facets in the nitride-based semiconductor laser device 70.

Thereafter, the device is separated into chips by division along the cavity direction (direction A), thereby forming the nitride-based semiconductor laser device 70 according to the second embodiment shown in FIG. 15.

According to the second embodiment, as hereinabove described, the nitride-based semiconductor laser device 70 comprises the reflection surface 70c formed by the (1-101) plane which is the growth surface in crystal growth of the semiconductor laser device layer 23, extending in the direction inclined at the angle $\theta_1$ (=about 62°) with respect to the light-emitting surface 70a formed by the (000-1) plane, whereby the reflection surface 70c inclined with respect to the light-emitting surface 70a can be formed in simultaneously the crystal growth for forming the semiconductor laser device layer 23 on the main surface of the n-type GaN substrate 71. Thus, the manufacturing process of the nitride-based semiconductor laser device can be inhibited from complication, dissimilarly to a case of growing a flat semiconductor device layer on the n-type GaN substrate and thereafter forming the cavity facet (light-emitting surface) and the reflection surface by ion beam etching or the like, similarly to the first embodiment.

Also according to the second embodiment, the reflection surface 70c is formed by the (1-101) plane which is the growth surface of the semiconductor laser device layer 23, whereby the reflection surface 70c can obtain excellent flatness. Thus, an emission direction of a laser beam emitted from the light-emitting surface 70a is uniformly changed without scattering by the reflection surface 70c similarly to the first embodiment, and hence reduction in luminous efficiency of the nitride-based semiconductor laser device 70 can be suppressed. The remaining effects of the nitride-based semiconductor laser device 70 according to the second embodiment are similar to those of the aforementioned first embodiment.

Modification of Second Embodiment

In a nitride-based semiconductor laser device 90 according to a modification of the second embodiment, a case where a semiconductor laser device layer 23 is formed on a main surface formed by an a-plane ((11-20) plane) which is a nonpolar face of an n-type GaN substrate 91 dissimilarity to the aforementioned second embodiment will be described with reference to FIG. 18. A. The n-type GaN substrate 91 is an example of the "substrate" in the present invention.

Figure 18:
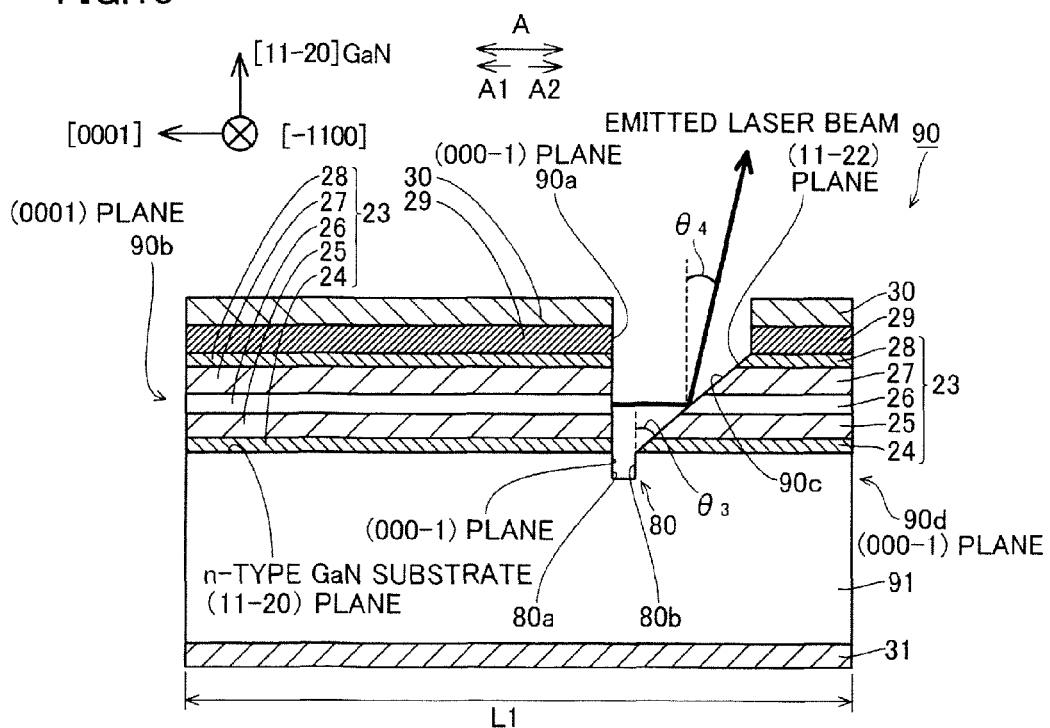
FIG. 18 A sectional view showing a structure of a nitride-based semiconductor laser device according to a modification of the second embodiment of the present invention.

According to the modification of the second embodiment, a light-emitting surface 90a of the semiconductor laser device layer 23 is constituted by a facet formed by a (000-1) plane crystal-grown to start from an inner side surface 80a of a groove 80, as shown in FIG. 18. The semiconductor laser device layer 23 is formed with a reflection surface 90c extending in a direction inclined at an angle $\theta_3$ (=about 58°) with respect to the light-emitting surface 90a on a region opposed to the light-emitting surface 90a in a [000-1] direction (along arrow A2). The reflection surface 90c is formed by a facet (growth surface) formed by a (11-22) plane following crystal growth in forming the semiconductor laser device layer 23. Thus, the nitride-based semiconductor laser device 90 is so formed that a laser beam emitted from the light-emitting surface 90a of a light-emitting layer 26 can be emitted outside by changing an emission direction to a direction inclined at an angle $\theta_4$ (=about 26°) with respect to the light-emitting surface 90a by the reflection surface 90c.

The remaining structure and manufacturing process of the nitride-based semiconductor laser device 90 according to the modification of the second embodiment are similar to those of the aforementioned first embodiment. The effects of the modification of the second embodiment is also similar to those of the aforementioned second embodiment.

Third Embodiment

A structure in which a nitride-based semiconductor laser device 100 according to a third embodiment and a monitor PD (photodiode)-equipped submount 110 are combined will be described with reference to FIG. 19.

Figure 19:
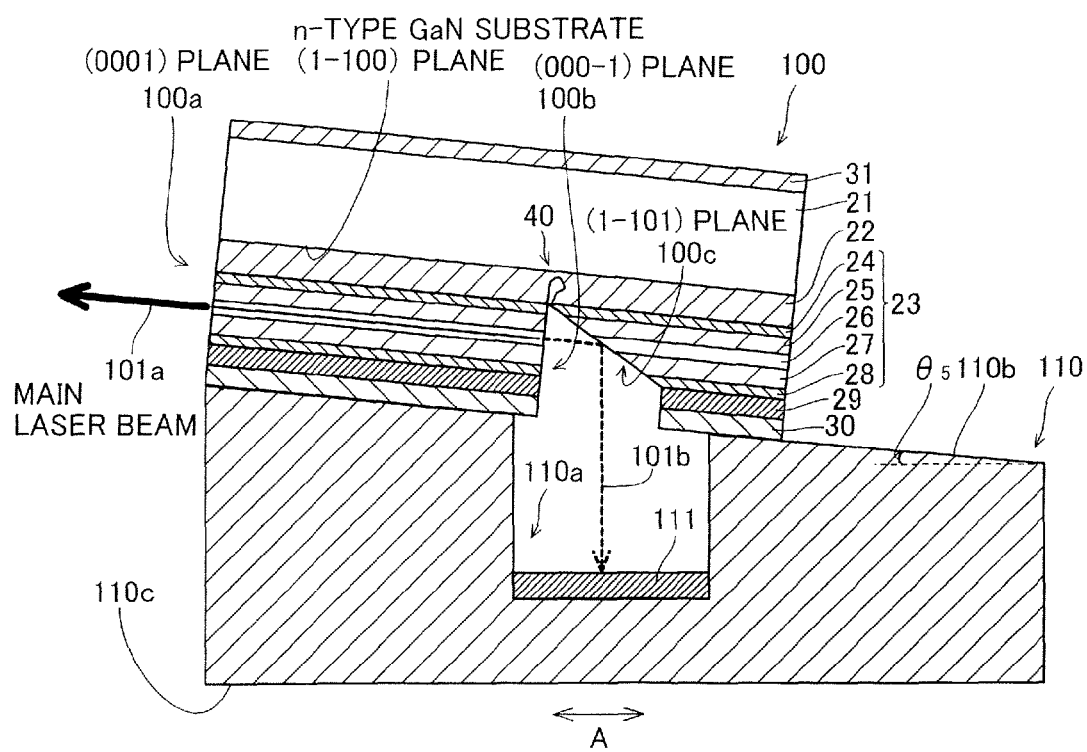
FIG. 19 A sectional view showing a structure in which a nitride-based semiconductor laser device according to a third embodiment of the present invention and a monitor PD-equipped submount are combined.

According to the third embodiment, the nitride-based semiconductor laser device 100 having a structure similar to the nitride-based semiconductor laser device 50 shown in the aforementioned first embodiment is fixed to the monitor PD-equipped submount 110 made of Si, as shown in FIG. 19. A recess portion 110a is formed on a substantially central portion of the monitor PD-equipped submount 110, and a PD (photodiode) 111 is incorporated into an inner bottom portion of the recess portion 110a. The PD 111 is an example of the "optical sensor" in the present invention.

According to the third embodiment, a main surface 110b of the monitor PD-equipped submount 110 is formed in a state inclined at an angle $\theta_5$ (=about 34°) with respect to a back surface 110c. The nitride-based semiconductor laser device 100 are fixed onto the main surface 110b to extend over the recess portion 110a, which is opened to the main surface 110b side of the monitor PD-equipped submount 110, in a direction A.

According to the third embodiment, the nitride-based semiconductor laser device 100 is a facet light-emitting laser device, and the emission intensity of a laser beam 101a emitted from a facet 100a (light-emitting surface) formed by a (0001) plane is larger than the emission intensity of a laser beam 101b emitted from a facet 100b (light-reflecting surface) formed by a (000-1) plane of the laser beams emitted from the light-emitting layer 26, as shown in FIG. 19.

Therefore, the monitor PD-equipped submount 110 is so formed that the laser beam 101b emitted from the facet 100b of the nitride-based semiconductor laser device 100 to a reflection surface 100c is incident on the PD 111 provided on the monitor PD-equipped submount 110 by the reflection surface 100c formed by a (1-101) plane, as shown in FIG. 19. At this time, the main surface 110b of the monitor PD-equipped submount 110 is inclined at the angle $\theta_5$ (=about 34°), and hence the laser beam 101b is incident substantially perpendicular to the PD 111.

According to the third embodiment, as hereinabove described, an emission direction of the laser beam 101b emitted from the facet 100b, formed by the (000-1) plane, of the light-emitting layer 26 of the nitride-based semiconductor laser device 100 is changed to a direction intersecting with the emission direction from the light-emitting layer 26 by the reflection surface 100c formed by the (1-101) plane which is a growth surface in crystal growth of the semiconductor laser device layer 23, and the laser beam 101b is incident substantially perpendicular to the PD 111 of the monitor PD-equipped submount 110 by combining the nitride-based semiconductor laser device 100 and the monitor PD-equipped submount 110, whereby the laser beam 101b (sample light monitoring a laser beam intensity of a facet emission laser device) where light scattering is suppressed by the reflection surface 100c having excellent flatness as a crystal growth surface can be guided to the PD 111, and hence the laser beam intensity can be more precisely measured.

Fourth Embodiment

A structure of a two-dimensional surface-emitting device 120 according to a fourth embodiment and a structure of a surface-emitting laser apparatus 150 employing the same will be described with reference to FIGS. 6, 15 and 20 to 22.

Figure 20:
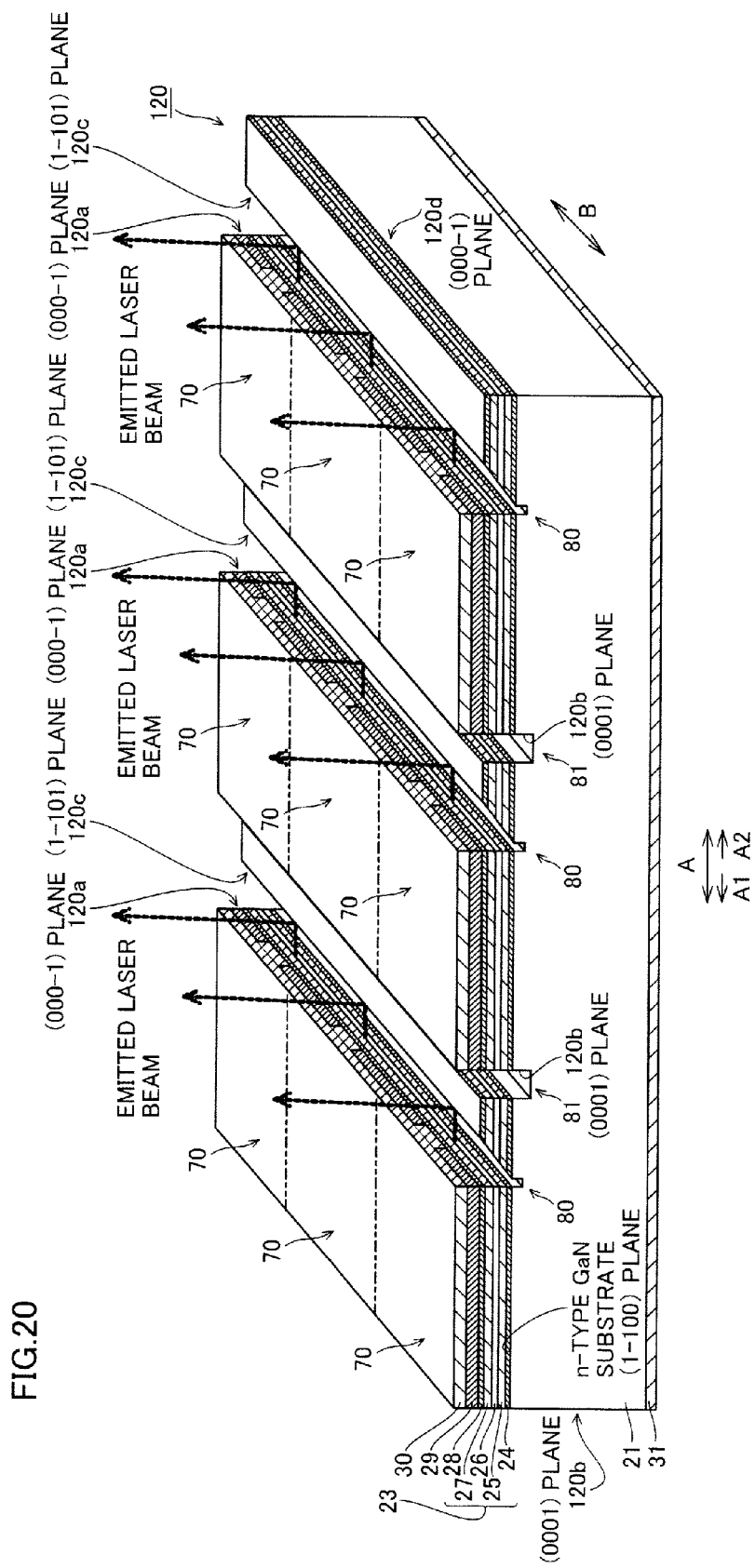
FIG. 20 A perspective view showing a structure of a two-dimensional surface-emitting device according to a fourth embodiment of the present invention.

The two-dimensional surface-emitting device 120 according to the fourth embodiment is formed by vertically arranging the three nitride-based semiconductor laser devices 70 and laterally arranging the three nitride-based semiconductor laser devices 70 (9 in total) on a wafer for allowing two-dimensional array when forming the nitride-based semiconductor laser devices 70 (see FIG. 15) according to the aforementioned second embodiment, as shown in FIG. 20.

According to the fourth embodiment, a semiconductor laser device layer 23 of the two-dimensional surface-emitting device 120 is formed through a manufacturing process similar to that of the aforementioned second embodiment, and isolation grooves 81 for isolating the semiconductor laser device layers 23 of the nitride-based semiconductor laser devices 70, which are adjacent to each other in a cavity direction (direction A), in the direction A are formed by etching, as shown in FIG. 20. Facets 200b (light-reflecting surfaces) of the cavity facets of the respective nitride-based semiconductor laser devices 70 are formed on the semiconductor laser device layer 23 by forming the isolation grooves 81.

According to the fourth embodiment, nine laser beams emitted from facets 120a (light-emitting surfaces), formed by (0001) planes, of the respective nitride-based semiconductor laser device 70 of the two-dimensional surface-emitting device 120 can be emitted upward by changing emission directions to directions inclined at about 34° (corresponding to an angle $\theta_2$ in FIG. 6) with respect to the light-emitting surfaces 120a by the reflection surfaces 120c formed by the (1-101) planes, as shown in FIG. 20. As shown in FIG. 20, a facet 120d, formed by a (000-1) plane, of the semiconductor laser device layer 23 is formed on an end along arrow A2 of the semiconductor laser device layer 23 by bar-shaped cleavage in the manufacturing process.

Figure 21:
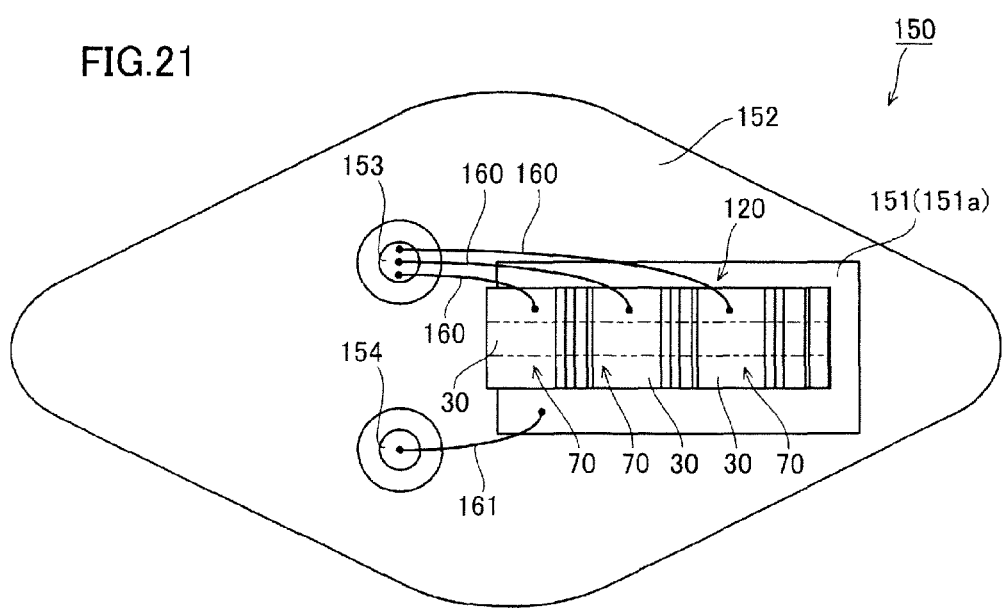
FIG. 21 A plan view and a sectional view showing a structure of a surface-emitting laser apparatus employing the two-dimensional surface-emitting device according to the fourth embodiment shown in FIG. 20.
Figure 22:
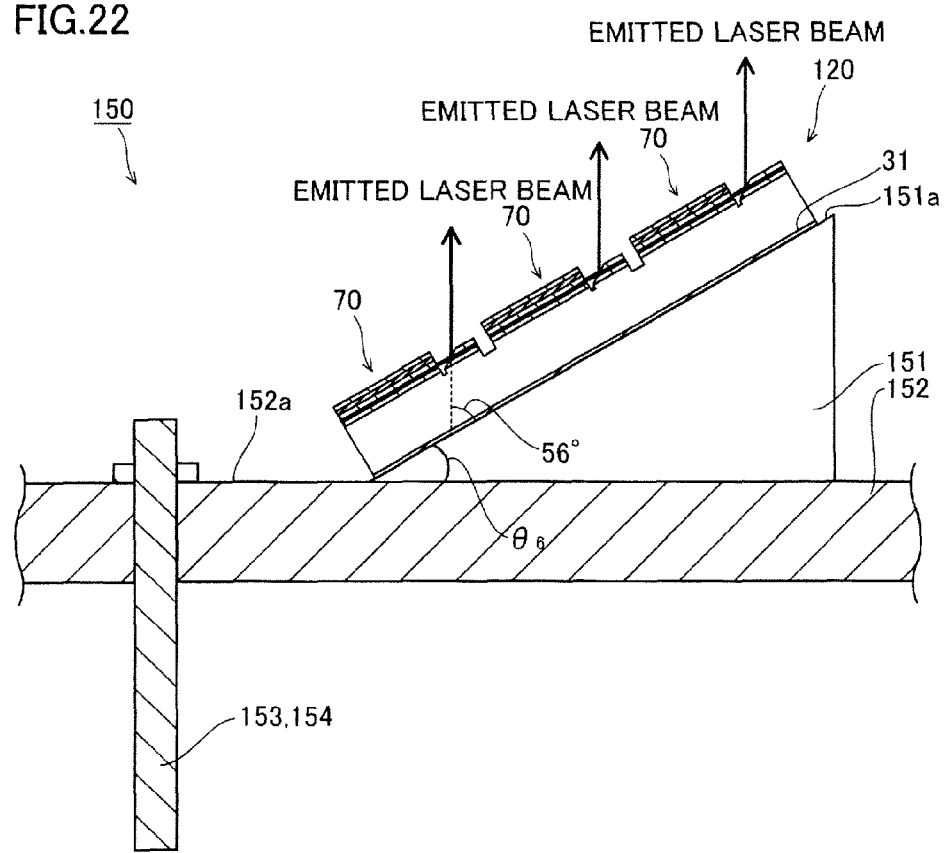
FIG. 22 A sectional view showing a structure of the surface-emitting laser apparatus employing the two-dimensional surface-emitting device according to the fourth embodiment shown in FIG. 20.

Each of FIGS. 21 and 22 shows a surface-emitting laser apparatus 150 employing the two-dimensional surface-emitting device 120. In this surface-emitting laser apparatus 150, the two-dimensional surface-emitting device 120 fixed to a block portion 151 made of iron or copper formed with an inclined plane 151a with an angle $\theta_6$ (=$\theta_2$=about 34°) through a conductive adhesive layer (not shown) such as AuSn is fixed to a base portion 152 such as iron or copper. Two lead terminals 153 and 154 are provided on the base portion 152.

Thus, in the surface-emitting laser apparatus 150 shown in FIG. 22, the nine laser beams emitted from the facets 120a (see FIG. 20) of the two-dimensional surface-emitting device 120 can be emitted so as to change emission directions to directions substantially perpendicular to an upper surface 301a of the block portion 151 by reflecting the beams on the reflection surfaces 120c (see FIG. 20).

As shown in FIG. 21, p-side electrodes 30 of the upper surfaces of the upper surfaces of the respective nitride-based semiconductor laser devices 70 of the two-dimensional surface-emitting device 120 are wire-bonded onto the lead terminal 153 of the base portion 152 with Au wires 160. The inclined plane 151a of the block portion 151 is wire-bonded onto the lead terminal 154 of the base portion 152 with an Au wire 161. In other words, the n-side electrodes 31 formed on a lower surface of the nitride-based semiconductor laser devices 70 are rendered conductive to the lead terminal 154 through the conductive adhesive layer (not shown), the block portion 151 and the Au wire 161.

According to the fourth embodiment, as hereinabove described, the two-dimensional surface-emitting device 120 is fixed onto the inclined plane 151a of the block portion 151, and the nine laser beams emitted from the facets 120a (see FIG. 20), formed by the (000-1) planes, of the respective nitride-based semiconductor laser device 70 are emitted so as to change the emission directions to the direction substantially perpendicular to the inclined plane 151a of the base portion 152 by reflecting the beams on the reflection surfaces 120c (see FIG. 20), formed by the (1-101) planes which are growth surfaces in crystal growth of the semiconductor laser device layer 23, whereby the beams are employed as light sources of the surface-emitting laser apparatus 150. Thus, a plurality of laser beams (nine) where light scattering is suppressed by a plurality of the reflection surfaces 120c (nine portions) having excellent flatness as crystal growth surfaces are emitted, and hence the surface-emitting laser apparatus 150 improving luminous efficiency can be formed.

Fifth Embodiment

A structure of a nitride-based semiconductor laser device 200 according to a fifth embodiment will be described with reference to FIGS. 23 to 26.

Figure 23:
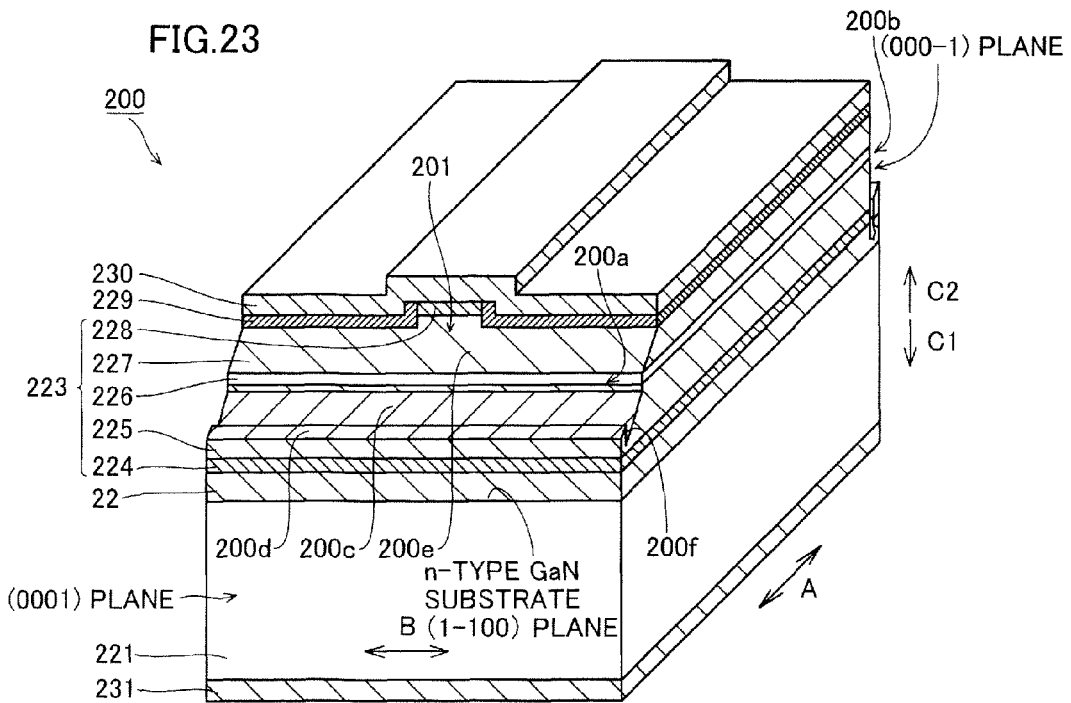
FIG. 23 A perspective view showing a structure of a nitride-based semiconductor laser device according to a fifth embodiment of the present invention.
Figure 24:
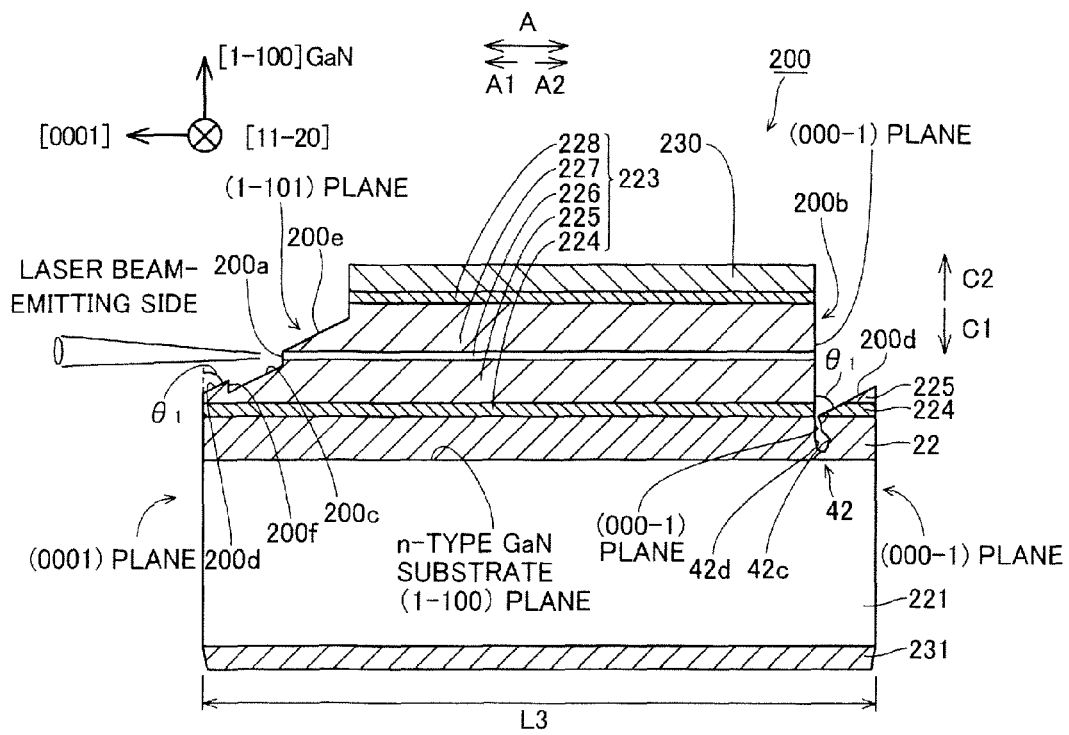
FIG. 24 A sectional view taken along a cavity direction of the semiconductor laser device, for illustrating the structure of the nitride-based semiconductor laser device according to the fifth embodiment shown in FIG. 23.

In the nitride-based semiconductor laser device 200 according to the fifth embodiment, a semiconductor laser device layer 223 having a thickness of about 3.1 μm is formed on an underlayer 22 made of AlGaN having a thickness of about 3 μm to about 4 μm formed on an n-type GaN substrate 221 having a thickness of about 100 μm, as shown in FIGS. 23 and 24. The n-type GaN substrate 221 and the semiconductor laser device layer 223 are examples of the "substrate" and the "nitride-based semiconductor device layer" in the present invention, respectively. As shown in FIG. 24, the semiconductor laser device layer 223 is formed to have a length L3 between laser device ends (in a direction A) of about 1560 μm.

According to the fifth embodiment, the semiconductor laser device layer 223 is formed on a main surface, formed by an m-plane ((1-100) plane), of the n-type GaN substrate 221 through the underlayer 22, as shown in FIG. 24. The semiconductor laser device layer 223 is formed with a light-emitting surface 200a and a light-reflecting surface 200b substantially perpendicular to the main surface of the n-type GaN substrate 221. The light-emitting surface 200a and the light-reflecting surface 200b are examples of the "first facet" and the "second facet" in the present invention, respectively.

According to the fifth embodiment, the semiconductor laser device layer 223 is formed with inclined planes 200c and 200d inclined by an angle $\theta_1$ (=about 62°) with respect to a direction ([1-100] direction (along arrow C2)) perpendicular to the main surface of the n-type GaN substrate 221 from a lower end of the light-emitting surface 200a and extending in an emission direction (along arrow A1 (direction away from the light-emitting surface 200a to the outside of the laser device)) of a laser beam emitted from a region in the vicinity of a light-emitting layer 226 described later, as shown in FIG. 24. Additionally, the semiconductor laser device layer 223 is formed with an inclined plane 200e inclined by the angle $\theta_1$ (=about 62°) with respect to the direction ([1-100] direction (along arrow C2)) perpendicular to the main surface of the n-type GaN substrate 221 from an upper end of the light-emitting surface 200a and extending along arrow A1. Therefore, the inclined planes 200c, 200d and 200e and the main surface of the n-type GaN substrate 221 form acute angles, as shown in FIG. 24. The inclined planes 200c, 200d and 200e are each an example of the "first facet" in the present invention.

Figure 25:
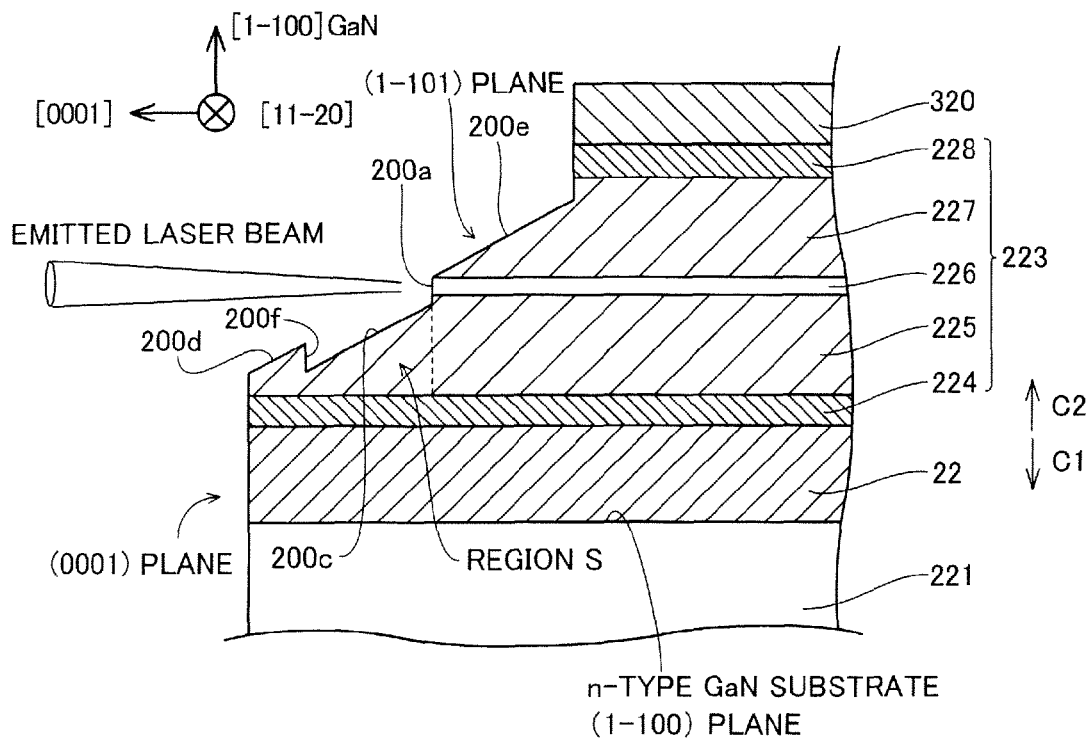
FIG. 25 An enlarged sectional view showing details of the vicinity of a light-emitting surface of the nitride-based semiconductor laser device according to the fifth embodiment shown in FIG. 23.

According to the fifth embodiment, the inclined plane 200c is formed to obliquely extend from an n-type cladding layer 225, described later, located on a lower portion of the light-emitting surface 200a toward the n-type GaN substrate 221, and be connected to the inclined plane 200d through a facet 200f extending substantially perpendicular to the main surface of the n-type GaN substrate 221, as shown in FIG. 25. The n-type cladding layer 225 is examples of the "nitride-based semiconductor device layer" and the "first conductive type first cladding layer" in the present invention. Therefore, the n-type cladding layer 225 formed on a laser beam-emitting side is connected to the underlayer 22 on the n-type GaN substrate 221 side through a buffer layer 224 on a position farther than the light-emitting surface 200a in a laser beam-emission direction (along arrow A1), as shown in FIG. 23.

According to the fifth embodiment, a crack 42 formed in crystal growth of the underlayer 22 and extending in a [11-20] direction of the n-type GaN substrate 221 in a striped manner is formed on the underlayer 22, as shown in FIG. 24. The inclined planes 200d and 200e of the semiconductor laser device layer 223 are formed by facets (growth surfaces) formed by (1-101) planes crystal-grown while starting from an upper end of an inner side surface 42c of the crack 42 of the underlayer 22. The crack 42 and the inner side surface 42c are examples of the "recess portion" and the "first side surface of the recess portion" in the present invention, respectively.

According to the fifth embodiment, the light-reflecting surface 200b of the semiconductor laser device layer 223 is constituted by a facet extending in the direction ([1-100] direction (along arrow C2)) perpendicular to the main surface of the n-type GaN substrate 221 and formed by a (000-1) plane crystal-grown to start from an inner side surface 42d formed by the (000-1) plane of the crack 42, as shown in FIG. 24. The inner side surface 42d is an example of the "second side surface of the recess portion" in the present invention.

Figure 26:
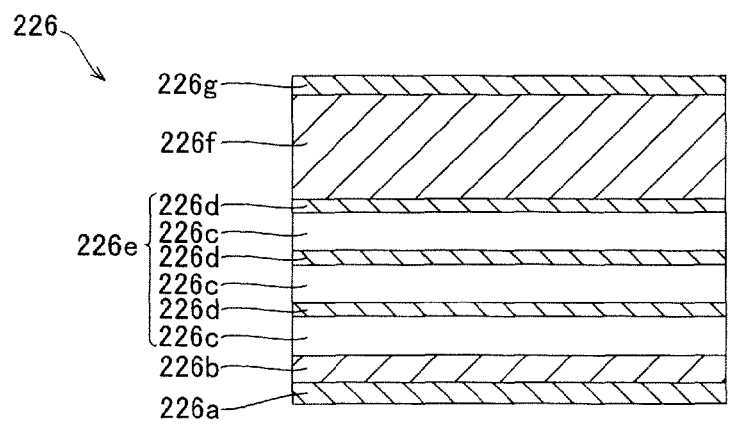
FIG. 26 An enlarged sectional view showing details of a light-emitting layer of the nitride-based semiconductor laser device according to the fifth embodiment shown in FIG. 23.

The semiconductor laser device layer 223 includes the buffer layer 224, the n-type cladding layer 225, the light-emitting layer 226, a p-type cladding layer 227 and a p-type contact layer 228, as shown in FIGS. 23 and 24. The light-emitting layer 226 formed on the n-type cladding layer 225 is constituted by an n-side carrier blocking layer 226a made of $Al_{0.2}Ga_{0.8}N$ having a thickness of about 20 nm, an n-side optical guide layer 226b made of undoped $In_{0.02}Ga_{0.98}N$ having a thickness of about 20 nm, an multiple quantum well (MQW) active layer 226e, a p-side optical guide layer 226f made of undoped $In_{0.01}Ga_{0.99}N$ having a thickness of about 0.08 μm and a carrier blocking layer 226g made of $Al_{0.25}Ga_{0.75}N$ having a thickness of about 20 nm successively from a side closer to the n-type cladding layer 225 (see FIG. 24) as shown in FIG. 26. In the MQW active layer 226e, three quantum well layers 226c made of undoped $In_{0.15}Ga_{0.85}N$ having a thickness of about 2.5 nm and three quantum barrier layers 226d made of undoped $In_{0.02}Ga_{0.98}N$ having a thickness of about 20 nm are alternately stacked.

As shown in FIGS. 23 and 24, the p-type cladding layer 227 having a planar portion and a projecting portion formed to protrude upward (along arrow C2) from a substantially central portion of the planar portion and having a thickness of about 1 μm is formed on the light-emitting layer 226. The p-type contact layer 228 having a thickness of about 3 nm is formed on the projecting portion of the p-type cladding layer 227. A ridge portion 201 for forming an optical waveguide of the nitride-based semiconductor laser device 200 is formed by the projecting portion of the p-type cladding layer 227 and the p-type contact layer 228. This ridge portion 201 is formed to extend along a cavity direction (in the direction A in FIG. 23) in a striped (slender) manner. The buffer layer 224, the light-emitting layer 226 and the p-type contact layer 228 are each an example of the "nitride-based semiconductor device layer" in the present invention. The p-type cladding layer 227 is examples of the "nitride-based semiconductor device layer" and the "second conductive type second cladding layer" in the present invention.

As shown in FIG. 23, a current blocking layer 229 made of $SiO_2$ having a thickness of about 200 nm is formed to cover an upper surface of the planar portion other than the projecting portion of the p-type cladding layer 227 of the semiconductor laser device layer 223 and both side surfaces of the ridge portion 201. The remaining structure of the fifth embodiment is similar to that of the aforementioned first embodiment.

A manufacturing process of the nitride-based semiconductor laser device 200 according to the fifth embodiment will be now described with reference to FIGS. 7 to 10, 23, 24, 26, and 27 to 31.

The underlayer 22 (see FIG. 7) is grown on the n-type GaN substrate 221 and the cracks 42 are formed on the underlayer 22, similarly to the manufacturing process of the aforementioned first embodiment.

As shown in FIG. 9, the buffer layer 224, the n-type cladding layer 225, the light-emitting layer 226 (see FIG. 26 for details), the p-type cladding layer 227 and the p-type contact layer 228 are successively grown on the underlayer 22 formed with the cracks 42 by MOCVD, thereby forming the semiconductor laser device layer 223.

In the manufacturing process according to the fifth embodiment, when the semiconductor laser device layer 223 is grown on the underlayer 22, facets, formed by the (1-101) planes, extending in a direction inclined at the angle $\theta_1$ (=about 62°) with respect to the main surface of the n-type GaN substrate 221, starting from the upper ends of the inner side surfaces 42c of the cracks 42 extending in the striped manner in the direction B (see FIG. 8) are formed, as shown in FIG. 10. Simultaneously, the semiconductor laser device layer 223 is crystal-grown while forming a facet ((000-1) plane) extending in the [1-100] direction (along arrow C2) to start from the (000-1) planes of the cracks 42 employing upper ends of the inner side surfaces 42d of the cracks 42 as staring points. Thus, the light-reflecting surfaces 200b formed by the (000-1) planes are formed on the semiconductor laser device layer 223. Only flatness of the aforementioned (1-101) plane and (000-1) plane but also flatness of the surface (upper surface) of the semiconductor laser device layer 223 can be improved from difference of growth rates of portions formed with the aforementioned (1-101) plane and (000-1) plane and a growth rate of growing the surface (upper surface) of the semiconductor laser device layer 223 along arrow C2 (see FIG. 27) in a process of the crystal growth of the semiconductor laser device layer 223.

Figure 27:
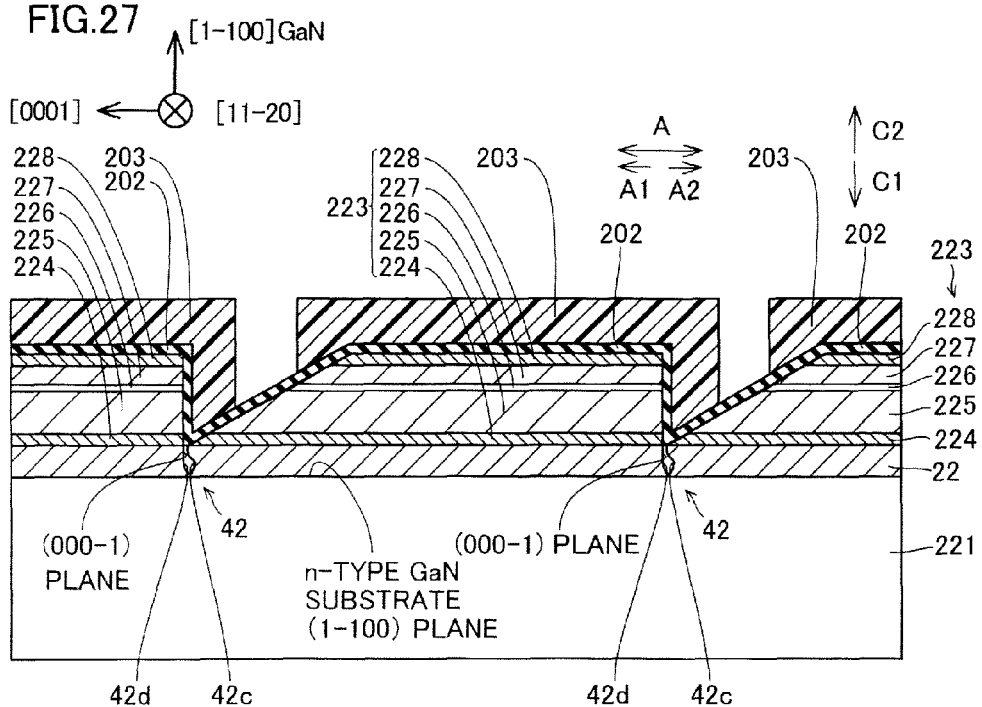
FIG. 27 A sectional view for illustrating a manufacturing process of the nitride-based semiconductor laser device according to the fifth embodiment shown in FIG. 23.
Figure 28:
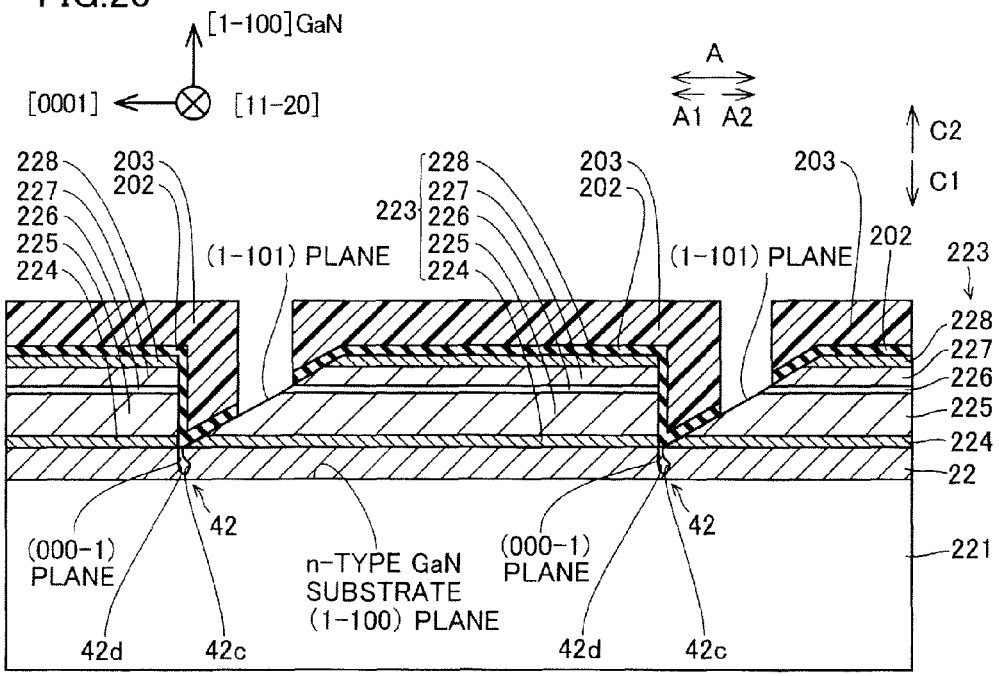
FIG. 28 A sectional view for illustrating the manufacturing process of the nitride-based semiconductor laser device according to the fifth embodiment shown in FIG. 23.
Figure 29:
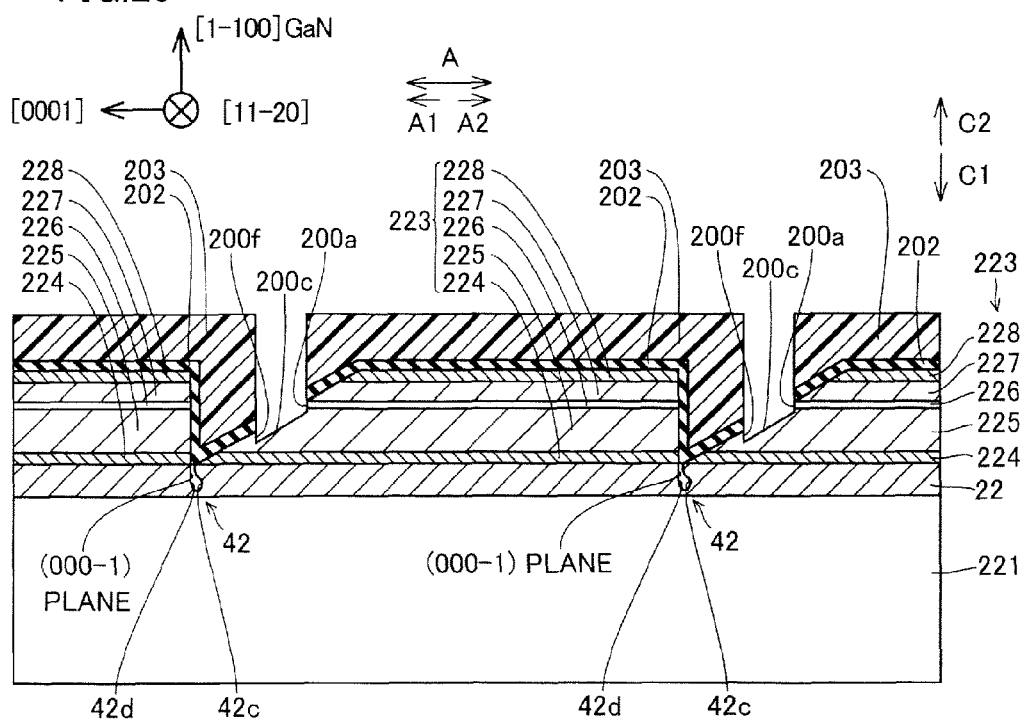
FIG. 29 A sectional view for illustrating the manufacturing process of the nitride-based semiconductor laser device according to the fifth embodiment shown in FIG. 23.

In the manufacturing process according to the fifth embodiment, a mask layer 202 made of $SiO_2$ having a thickness of several 100 nm is formed to cover an upper surface of the semiconductor laser device layer 223, as shown in FIG. 27. Further, resists (resist patterns) 203 are formed on an upper surface of the mask layer 202 by photolithography. Then, the mask layer 202 on portions formed with no resist 203 is removed by wet etching with hydrofluoric acid, as shown in FIG. 28. Thereafter, portions where the facets formed by the (1-101) planes of the semiconductor laser device layer 223 are exposed by removing the mask layer 202 are dry-etched such as reactive ion etching with $Cl_2$, as shown in FIG. 28. Thus, the light-emitting surfaces 200a extending in the [1-100] direction (along arrow C2) and including a part of the n-type cladding layer 225 and the light-emitting layer 226 are formed on the semiconductor laser device layer 223, as shown in FIG. 29. In this case, the inclined planes 200c obliquely extending from the vicinity of an upper end of the n-type cladding layer 225 toward the n-type GaN substrate 221 and the facets 200f substantially parallel to the light-emitting surfaces 200a are formed as shown in FIG. 29.

Figure 30:
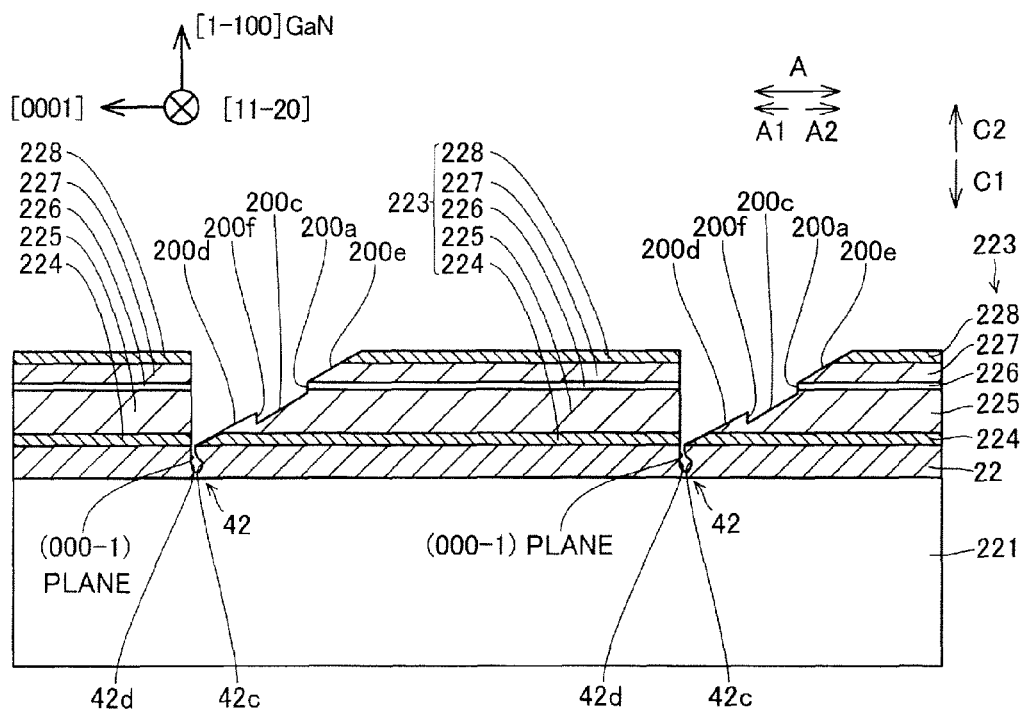
FIG. 30 A sectional view for illustrating the manufacturing process of the nitride-based semiconductor laser device according to the fifth embodiment shown in FIG. 23.

As shown in FIG. 30, the mask layer 202 and the resists 203 are removed from the semiconductor laser device layer 223 by wet etching with hydrofluoric acid. Thus, the inclined planes 200d and 200e formed by the (1-101) planes, and the light-emitting surfaces 200a and the inclined planes 200c by the aforementioned etching are formed on the laser beam-emitting side facets of the semiconductor laser device layer 223.

As shown in FIG. 23, resist patterns are formed on the upper surface of the p-type contact layer 228 by photolithography and the resist patterns are thereafter employed as masks for dry etching, thereby forming the ridge portions 201. Thereafter, the current blocking layer 229 is formed to cover the upper surfaces of the planar portions other then the projecting portions of the p-type cladding layer 227 and the both side surfaces of the ridge portions 201. As shown in FIGS. 23 and 31, the p-side electrodes 230 are formed on the current blocking layer 229 and the p-type contact layer 228 formed with no current blocking layer 229 by vacuum evaporation. FIG. 31 shows a sectional structure taken along the cavity direction (direction A) of the semiconductor laser device located on the position formed with the p-type contact layer 228 (in the vicinity of the ridge portions 201).

As shown in FIG. 31, a lower surface of the n-type GaN substrate 221 is so polished that a thickness of the n-type GaN substrate 221 reaches a thickness of about 100 μm, and an n-side electrode 231 is thereafter formed on the lower surface of the n-type GaN substrate 221 by vacuum evaporation.

As shown in FIG. 31, linear scribing grooves 41 are so formed on positions to be formed with prescribed (0001) planes on the lower side of the n-side electrode 231 as to extend in a direction (direction B in FIG. 23) orthogonal to the [0001] direction (in the direction A) of the n-type GaN substrate 221 by laser scribing or mechanical scribing. In this state, the wafer is cleaved on the position (cleavage line 1000) of each scribing groove 41 by applying a load while fulcruming the lower side of the n-type GaN substrate 221 so that the surface (upper side) of the wafer opens, as shown in FIG. 31.

Thereafter, the device is separated into chips by division along the cavity direction (direction A), thereby forming the nitride-based semiconductor laser device 200 according to the fifth embodiment shown in FIGS. 23 and 24.

According to the fifth embodiment, as hereinabove described, the light-emitting surface 200a and the inclined planes 200c and 200d extending to be inclined by the angle $\theta_1$ (=about 62°) with respect to the [1-100] direction perpendicular to the main surface of the n-type GaN substrate 221 while forming the acute angles with the main surface (m-plane (1-100) plane) of the n-type GaN substrate 221 in the vicinity of the light-emitting surface 200a are provided on the semiconductor laser device layer 223, whereby the semiconductor laser device layer 223 is connected to the n-type GaN substrate 221 side through a plane area larger than a plane area in the vicinity of the light-emitting layer 226, and hence a sectional area (region S enclosed with the inclined planes 200c and 200d, the facet 200f, the main surface ((1-100) plane) of the n-type cladding layer 225 and a visual surface (broken lines) extending the light-emitting surface 200a to the main surface of the n-type cladding layer 225 along arrow C1 (see FIG. 23))) of a path through which heat is radiated to the n-type GaN substrate 221 can be increased by the increased plane area. Thus, heat generated from a laser beam emitted in the vicinity of the light-emitting surface 200a are suitably diffused to the n-type GaN substrate 221 side through the inside of the semiconductor laser device layer 223 formed with the inclined planes 200c and 200d extending in the emission direction of the laser beam beyond the light-emitting surface 200a also when output of the nitride-based semiconductor laser device 200 is increased. Therefore, generation of excess heat of the cavity facet (light-emitting surface 200a) due to the emitted laser beam is suppressed. Thus, deterioration of the cavity facet (light-emitting surface 200a)

following higher output of the semiconductor laser can be suppressed. The life of the nitride-based semiconductor laser device 200 can be improved by suppressing the deterioration of the cavity facet (light-emitting surface 200a).

According to the fifth embodiment, the inclined planes 200c and 200d are formed to obliquely extend from the n-type cladding layer 225 located on the lower portion of the light-emitting surface 200a toward the emission direction (along arrow A1) of the laser beam emitted from the light-emitting layer 226 and the n-type GaN substrate 221, whereby the inclined planes 200c and 200d are formed toward the emission direction (along arrow A1) of the laser beam and the n-type GaN substrate 221 while starting from the n-type cladding layer 225 located in the vicinity of the lower portion of the light-emitting layer 226 of the light-emitting surface 200a, and hence heat of the laser beam (emitted light) generated in the vicinity of the light-emitting layer 226 can be more effectively diffused to the n-type GaN substrate 221 side.

According to the fifth embodiment, the light-emitting surface 200a and the inclined planes 200c, 200d and 200e are formed on the emitting side of the laser beam emitted from the light-emitting layer 226, whereby deterioration of the light-emitting surface 200a on the light-emitting side following larger heat generation in a laser operation can be easily suppressed.

According to the fifth embodiment, the inclined planes 200c and 200e are formed by the growth surfaces (facets) of the semiconductor laser device layer 223 formed by the (1-101) plane, starting from the inner side surface 42c of the crack 42 formed on the n-type GaN substrate 221 so as to extend in the [11-20] direction in the main surface (m-plane (1-100) plane) of the n-type GaN substrate 221 in the striped, whereby the inclined planes 200c and 200e formed by the growth surfaces having the (1-101) planes can be formed simultaneously with the crystal growth of the semiconductor laser device layer 223.

According to the fifth embodiment, the nitride-based semiconductor laser device 200 comprises the light-reflecting surface 200b formed on a side opposite to a side formed with the light-emitting surface 200a and the inclined planes 200c and 200e of the semiconductor laser device layer 223 and extending in the [1-100] direction which is the direction substantially perpendicular to the main surface (m-plane (1-100) plane) of the n-type GaN substrate 221, whereby the semiconductor laser device layer 223 employing the light-emitting surface 200a and the light-reflecting surface 200b on the side opposite to the light-emitting surface 200a as a pair of cavity facets can be formed.

According to the fifth embodiment, the light-reflecting surface 200b of the semiconductor laser device layer 223 is formed substantially perpendicular to the main surface of the n-type GaN substrate 221 while staring from the inner side surface 42d of the crack 42 formed on the n-type GaN substrate 221 to extend in the [11-20] direction (direction B in FIG. 26) in the main surface (m-plane (1-100) plane) of the n-type GaN substrate 221 in the striped manner, whereby the semiconductor laser device layer 223 having the cavity facet (light-reflecting surface 200b) formed by the (000-1) plane substantially perpendicular to the main surface of the n-type GaN substrate 221 without performing a cleavage step can be easily formed by utilizing the inner side surface 42d of the crack 40 formed in the [11-20] direction substantially orthogonal to a c-axis direction ([0001] direction) in the m-plane ((000-1) plane) of the n-type GaN substrate 221 when forming the nitride-based semiconductor layer 223 on the main surface of the n-type GaN substrate 221.

According to the fifth embodiment, the semiconductor laser device layer 223 is formed on the n-type GaN substrate 221 having the main surface formed by the nonpolar face (m-plane ((1-100) plane)), whereby a piezoelectric field caused in the semiconductor device layer (light-emitting layer 226) or an internal electric field of spontaneous polarization or the like can be reduced. Thus, heat generation of the semiconductor laser device layer 223 (light-emitting layer 226) including the vicinity of the cavity facet (light-emitting surface 200a) can be suppressed, and hence the life of the nitride-based semiconductor laser device 200 can be improved.

First Modification of Fifth Embodiment

A case where a nitride-based semiconductor laser device 210 according to a first modification of the fifth embodiment has a terrace 210e between a light-emitting surface 210a and an inclined plane 210c of a semiconductor laser device layer 223 dissimilarly to the aforementioned fifth embodiment will be described with reference to FIGS. 32 to 34.

Figure 33:
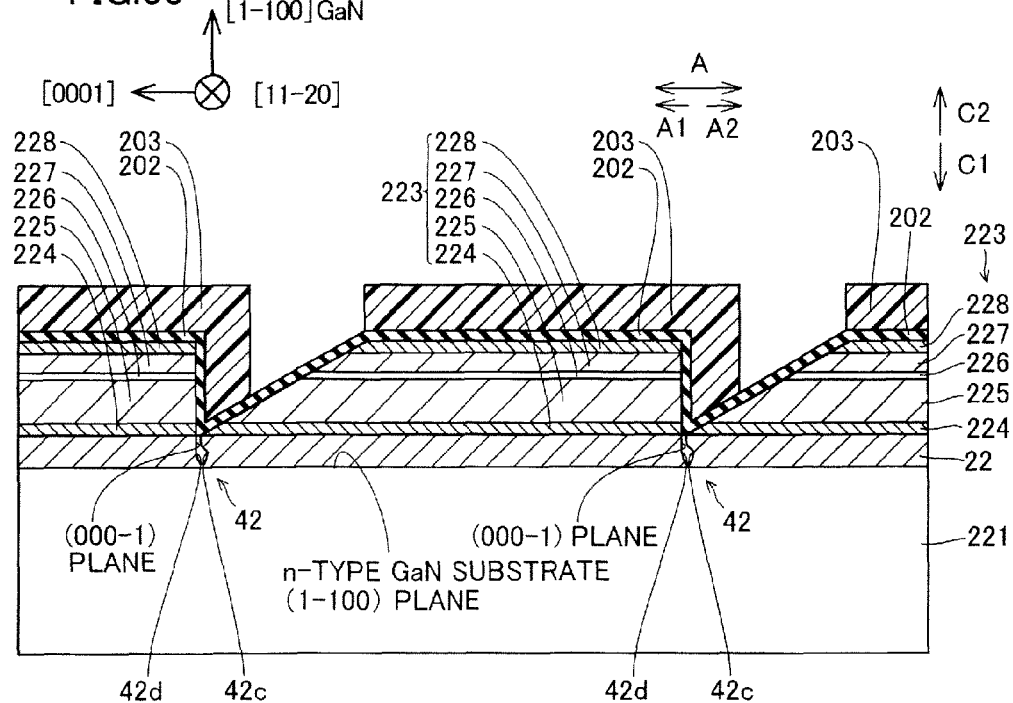
FIG. 33 A sectional view for illustrating a manufacturing process of the nitride-based semiconductor laser device according to the first modification of the fifth embodiment shown in FIG. 32.

According to the first modification of the fifth embodiment, a mask layer 202 and resists 203 by photolithography similar to the aforementioned fifth embodiment are formed to cover an upper surface of the semiconductor laser device layer 223 formed by crystal growth in a manufacturing process of the nitride-based semiconductor laser device 210, as shown in FIG. 33. As shown in FIG. 34, each light-emitting surface 210a extending in a [1-100] direction (along arrow C2) and including a part of an n-type cladding layer 225 and a light-emitting layer 226 is formed on the semiconductor laser device layer 223 by etching similar to that of the aforementioned fifth embodiment. The light-emitting surface 210a is an example of the "first facet" in the present invention.

Figure 34:
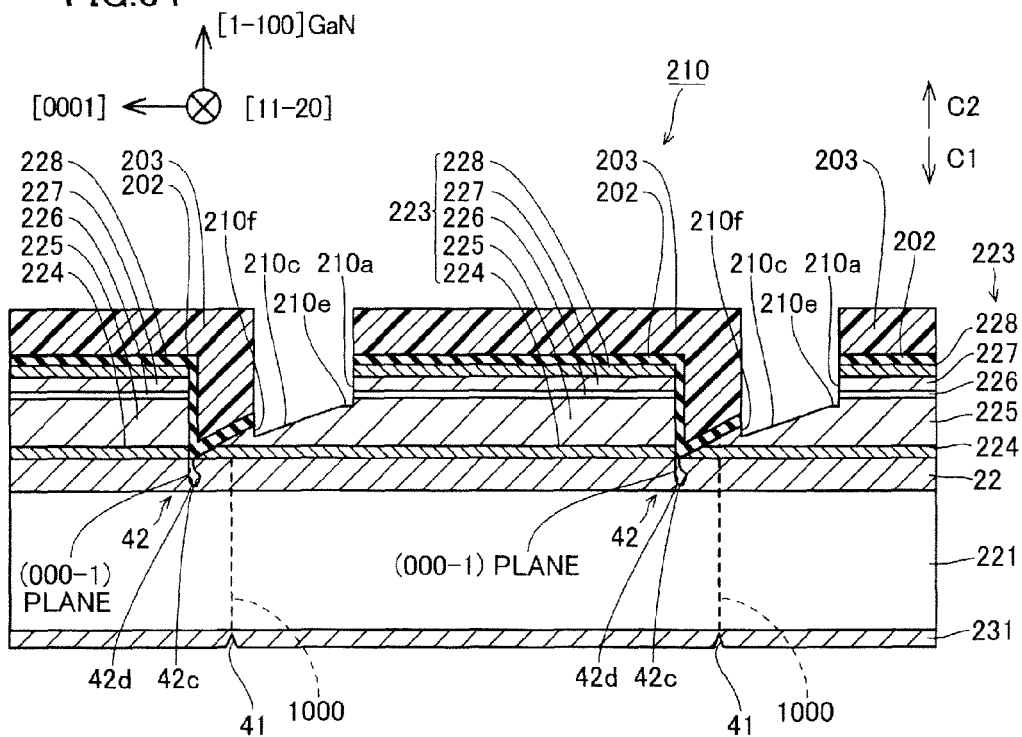
FIG. 34 A sectional view for illustrating the manufacturing process of the nitride-based semiconductor laser device according to the first modification of the fifth embodiment shown in FIG. 32.

According to the first modification of the fifth embodiment, the inclined plane 210c obliquely extending toward an n-type GaN substrate 221 and the terraces 210e linking the inclined planes 210c and the light-emitting surfaces 210a are formed on the n-type cladding layer 225 below the light-emitting surfaces 210a by controlling an etching condition for forming the light-emitting surfaces 210a, as shown in FIG. 34. Thus, an inclined plane 210d formed by a (1-101) plane and the light-emitting surface 210a by etching, the inclined plane 210c and the terrace 210e are formed on each laser beam-emitting side facet of the semiconductor laser device layer 223, as shown in FIG. 32. The inclined planes 210c and 210d and the terrace 210e are each an example of the "first facet" in the present invention.

As shown in FIG. 32, a light-reflecting surface 210b is formed while forming a facet ((000-1) plane) extending in a [1-100] direction (along arrow C2) to start from the (000-1) plane of a crack 42 employing an upper end of an inner side surface 42d of the crack 42 as a starting point is formed when forming the semiconductor laser device layer 223. The light-reflecting surface 210b is an example of the "second facet" in the present invention.

The remaining structure and manufacturing process of the nitride-based semiconductor laser device 210 according to the first modification of the fifth embodiment are similar to those of the aforementioned fifth embodiment. The remaining effects of the nitride-based semiconductor laser device 210 according to the first modification of the fifth embodiment are similar to those of the aforementioned fifth embodiment.

Second Modification of Fifth Embodiment

Figure 35:
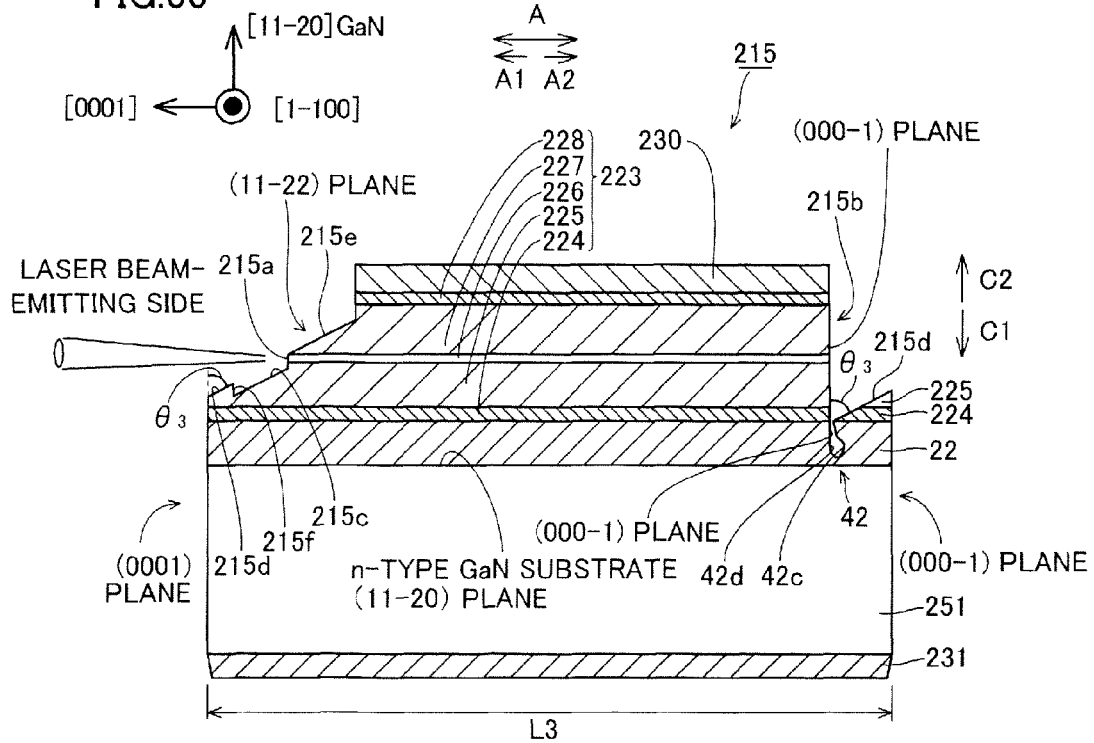
FIG. 35 A sectional view showing a structure of a nitride-based semiconductor laser device according to a second modification of the fifth embodiment of the present invention.

In a nitride-based semiconductor laser device 215 according to a second modification of the fifth embodiment, a case where a semiconductor laser device layer 223 is formed on a main surface formed by an a-plane ((11-20) plane) which is a nonpolar face of an n-type GaN substrate 251 through an underlayer 22 dissimilarly to the aforementioned fifth embodiment will be described with reference to FIG. 35. The n-type GaN substrate 251 is an example of the "substrate" in the present invention. According to the second modification of the fifth embodiment, the semiconductor laser device layer 223 is formed with inclined planes 215c and 215d each inclined at an angle $\theta_3$ (=about 58°) with respect to a direction ([11-20] direction (along arrow C2)) perpendicular to a main surface of the n-type GaN substrate 251 from a lower end of the light-emitting surface 215a and extending in an emission direction (along arrow A1 (direction away from a light-emitting surface 215a to the outside of the laser device)) of a laser beam emitted from a region in the vicinity of a light-emitting layer 226. Additionally, the semiconductor laser device layer 223 is formed with an inclined plane 215e inclined by the angle $\theta_3$ (=about 58°) with respect to the direction ([11-20] direction (along arrow C2)) perpendicular to the main surface of the n-type GaN substrate 251 from an upper end of the light-emitting surface 215a and extending along arrow A2. Therefore, the inclined planes 215c, 215d and 215e and the main surface of the n-type GaN substrate 251 form acute angles, as shown in FIG. 35. The light-emitting surface 215a, and the inclined planes 215c, 215d and 215e are each an example of the "first facet" in the present invention.

According to the second modification of the fifth embodiment, the inclined plane 215c of the semiconductor laser device layer 223 is formed to obliquely extend from an n-type cladding layer 225 located on a lower portion of the light-emitting surface 215a toward the n-type GaN substrate 251, and be connected to the inclined plane 215d through a facet 215f extending substantially perpendicular to the main surface of the n-type GaN substrate 251. The inclined planes 215d and 215e of the semiconductor laser device layer 223 is formed by facets (growth surfaces) formed by the (11-22) planes crystal-grown while starting from an upper end of an inner side surface 42c of a crack 42 of the underlayer 22.

According to the second modification of the fifth embodiment, a light-reflecting surface 215b of the semiconductor laser device layer 223 is constituted by a facet extending in the direction ([11-20] direction (along arrow C2)) perpendicular to the main surface of the n-type GaN substrate 251 and formed by a (000-1) plane crystal-grown to start from an inner side surface 42d formed by the (000-1) plane of the crack 42. The light-reflecting surface 215b is an example of the "second facet" in the present invention.

The remaining structure and manufacturing process of the nitride-based semiconductor laser device 215 according to the second modification of the fifth embodiment are similar to those of the aforementioned fifth embodiment. The remaining effects of the nitride-based semiconductor laser device 215 according to the second modification of the fifth embodiment are similar to those of the aforementioned fifth embodiment.

Sixth Embodiment

In a nitride-based semiconductor laser device 220 according to a sixth embodiment, a case where cracks 42 extending in a [1-100] direction (direction perpendicular to the plane of FIG. 36) of an n-type GaN substrate 261 are formed on an underlayer 22 on a main surface by employing the n-type GaN substrate 261 having the main surface formed by a (11-2-5) plane and a semiconductor laser device layer 223 is thereafter formed dissimilarly to the aforementioned fifth embodiment will be described with reference to FIG. 36. The n-type GaN substrate 261 is an example of the "substrate" in the present invention.

Figure 36:
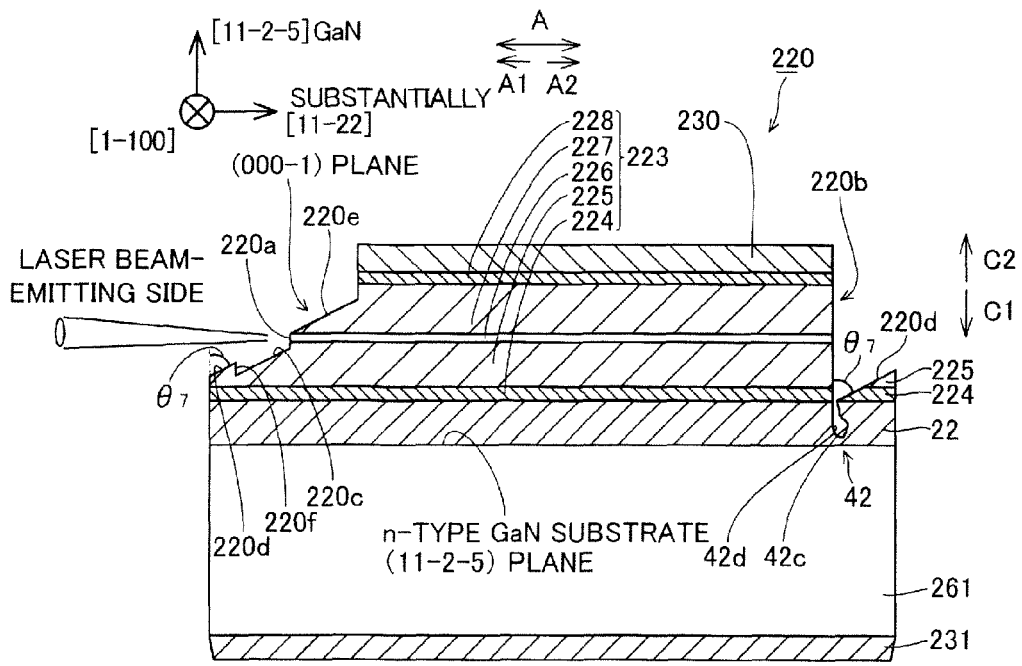
FIG. 36 A sectional view showing a structure of a nitride-based semiconductor laser device according to a sixth embodiment of the present invention.

According to the sixth embodiment, the semiconductor laser device layer 223 is formed on the main surface, formed by a (11-2-5) plane, of the n-type GaN substrate 261 through the underlayer 22, as shown in FIG. 36. At this time, the semiconductor laser device layer 223 is formed with a light-emitting surface 220a extending in a direction substantially equal to a direction ([11-2-5] direction (along arrow C2)) perpendicular to the main surface of the n-type GaN substrate 261, an inclined plane 220c inclined at an angle $\theta_7$ (=about 57°) with respect to the [11-2-5] direction from the vicinity of a lower portion of the light-emitting surface 220a and extending in an emission direction (along arrow A1) of a laser beam emitted from a region in the vicinity of a light-emitting layer 226, and an inclined plane 220d through a facet 220f. Additionally, the semiconductor laser device layer 223 is formed with an inclined plane 220e inclined by the angle $\theta_7$ (=about 57°) with respect to the [11-2-5] direction of the n-type GaN substrate 261 from an upper end of the light-emitting surface 220a and extending along arrow A2. Therefore, the inclined planes 220c, 220d and 220e and the main surface of the n-type GaN substrate 261 form acute angles, as shown in FIG. 36. The light-emitting surface 220a, and the inclined planes 220c, 220d and 220e are each an example of the "first facet" in the present invention. The semiconductor laser device layer 223 is formed with a light-reflecting surface 220b perpendicular to the main surface of the n-type GaN substrate 261. The light-reflecting surface 220b is an example of the "second facet" in the present invention.

The remaining structure and manufacturing process of the nitride-based semiconductor laser device 220 according to the sixth embodiment are similar to those of the aforementioned fifth embodiment. The remaining effects of the nitride-based semiconductor laser device 220 according to the sixth embodiment are similar to those of the aforementioned fifth embodiment.

Seventh Embodiment

In a nitride-based semiconductor laser device 235 according to a seventh embodiment, a case where cracks 42 extending in a [1-100] direction (direction perpendicular to the plane of FIG. 37) of an n-type GaN substrate 271 are formed on an underlayer 22 on a main surface by employing the n-type GaN substrate 271 having the main surface of a semipolar plane formed by a (11-2-2) plane and a semiconductor laser device layer 223 is thereafter formed dissimilarly to the aforementioned fifth embodiment will be described with reference to FIG. 37. The n-type GaN substrate 271 is an example of the "substrate" in the present invention.

Figure 37:
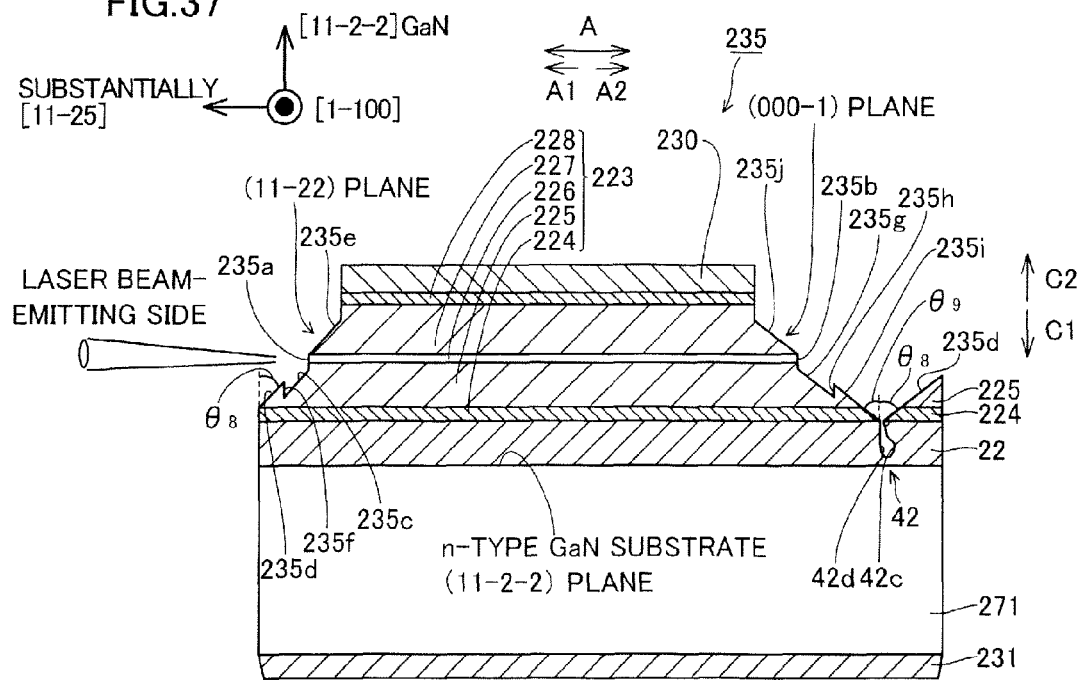
FIG. 37 A sectional view showing a structure of a nitride-based semiconductor laser device according to a seventh embodiment of the present invention.

According to the seventh embodiment, the semiconductor laser device layer 223 having a multilayer structure similar to that of the aforementioned fifth embodiment is formed on the main surface, formed by the (11-2-2) plane, of the n-type GaN substrate 271 through the underlayer 22, as shown in FIG. 37. At this time, the semiconductor laser device layer 223 is formed with a light-emitting surface 235a extending in a direction substantially equal to a direction ([11-2-2] direction (along arrow C2)) perpendicular to the main surface of the n-type GaN substrate 271, an inclined plane 235c inclined by an angle $\theta_8$ (=about 27°) with respect to the [11-2-2] direction from the vicinity of a lower portion of the light-emitting surface 235a and extending in an emission direction (along arrow A1) of a laser beam emitted from a region in the vicinity of a light-emitting layer 226, and an inclined plane 235d through a facet 235f. Additionally, the semiconductor laser device layer 223 is formed with an inclined plane 235e inclined by the angle $\theta_8$ (=about 27°) with respect to the [11-2-2] direction of the n-type GaN substrate 271 from an upper end of the light-emitting surface 235a and extending along arrow A2. Therefore, the inclined planes 235c, 235d and 235e and the main surface of the n-type GaN substrate 271 form acute angles, as shown in FIG. 37. The light-emitting surface 235a, and the inclined planes 235c, 235d and 235e are each an example of the "first facet" in the present invention.

According to the seventh embodiment, the semiconductor laser device layer 223 is formed with a light-reflecting surface 235b extending in a direction substantially equal to the direction ([11-2-2] direction (along arrow C2)) perpendicular to the main surface of the n-type GaN substrate 271, an inclined plane 235g inclined by an angle $\theta_9$ (=about 32°) with respect to the [11-2-2] direction from the vicinity of a lower portion of the light-reflecting surface 235b and extending along arrow A2, and an inclined plane 235i through a facet 235h, as shown in FIG. 37. Additionally, the semiconductor laser device layer 223 is formed with an inclined plane 235j inclined by the angle $\theta_9$ (=about 32°) with respect to the [11-2-2] direction of the n-type GaN substrate 271 from an upper end of the light-emitting surface 235a and extending along arrow A1. The light-reflecting surface 235b is an example of the "second facet" in the present invention. The remaining structure of the nitride-based semiconductor laser device 235 according to the seventh embodiment is similar to that of the aforementioned first embodiment.

A manufacturing process of the nitride-based semiconductor laser device 235 according to the seventh embodiment will be now described with reference to FIGS. 23 and 37 to 40.

Figure 38:
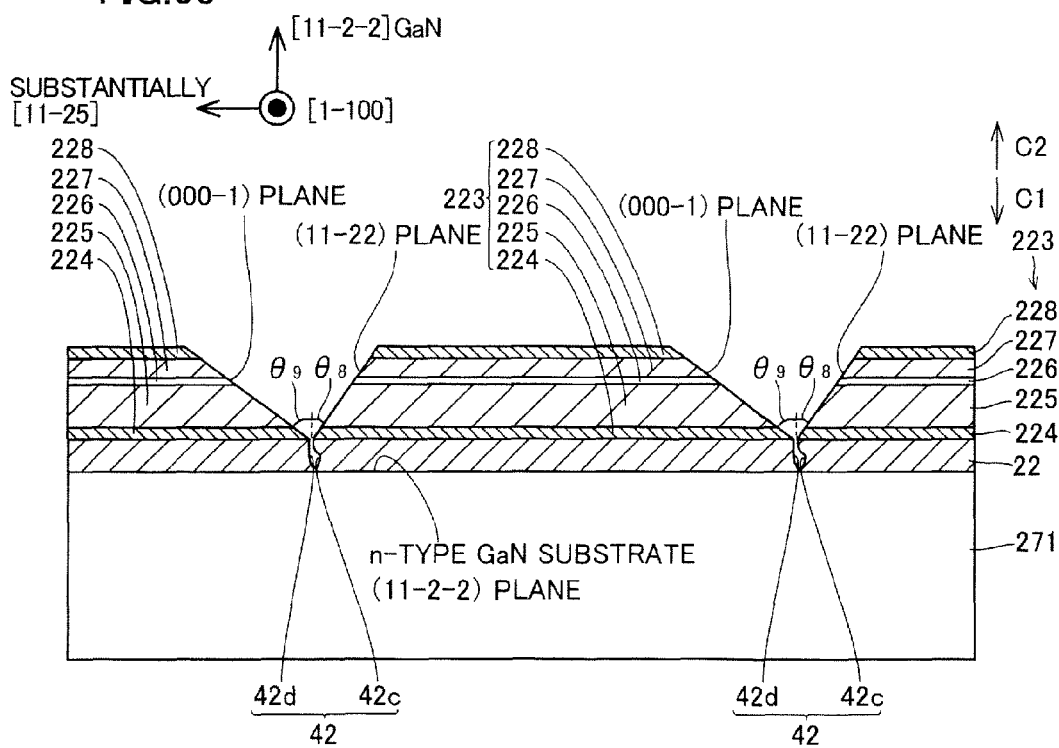
FIG. 38 A sectional view for illustrating a manufacturing process of the nitride-based semiconductor laser device according to the seventh embodiment shown in FIG. 37.

According to the seventh embodiment, the underlayer 22 and the semiconductor laser device layer 223 are successively formed on the main surface, formed by the (11-2-2) plane, of the n-type GaN substrate 271 through a manufacturing process similar to that of the aforementioned fifth embodiment. In this case, facets formed by (11-22) planes extending in a direction inclined at the angle $\theta_8$ (=about 27°) with respect to the main surface of the n-type GaN substrate 271 while staring from upper portions of inner side surfaces 42c of the cracks 42 previously formed on the underlayer 22 is formed, as shown in FIG. 38. Simultaneously, the semiconductor laser device layer 223 is crystal-grown while forming facets formed by (000-1) planes extending in a direction inclined at the angle $\theta_9$ (=about 32°) with respect to the main surface of the n-type GaN substrate 271 employing upper ends of inner side surfaces 42d of the crack 42 as starting points.

Figure 39:
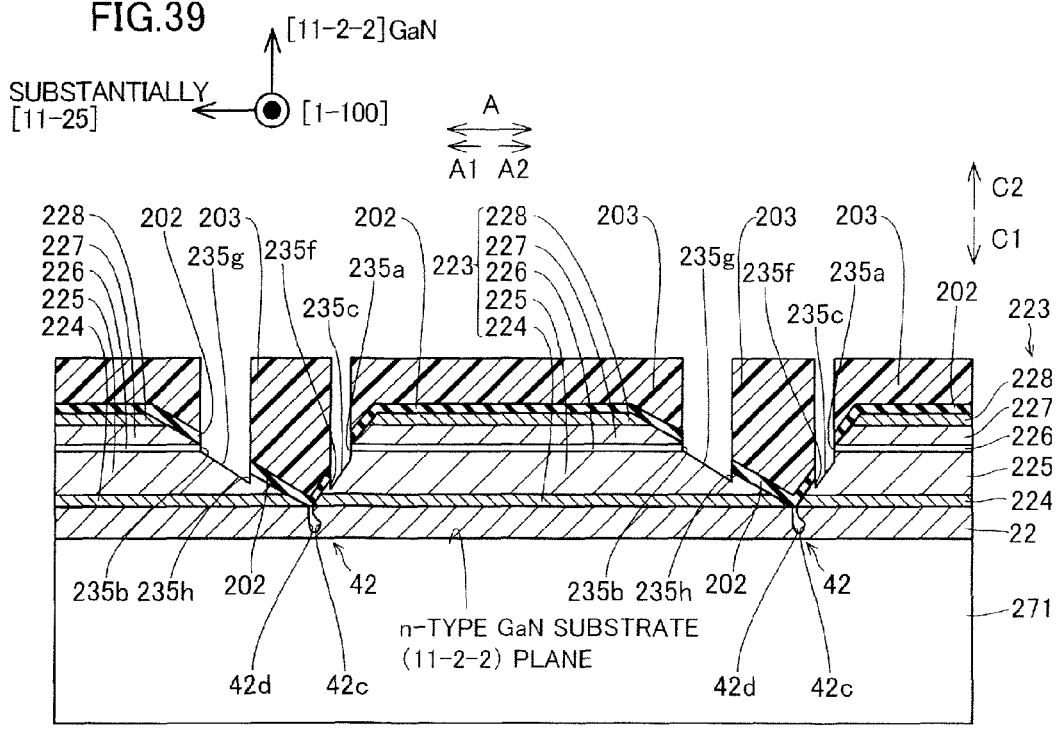
FIG. 39 A sectional view for illustrating the manufacturing process of the nitride-based semiconductor laser device according to the seventh embodiment shown in FIG. 37.

As shown in FIG. 39, a mask layer 202 and resists 203 are formed on the semiconductor laser device layer 223, and the mask layer 202 is partly removed by wet etching with hydrofluoric acid. Further, portions where the facets (the (11-22) plane and the (000-1) plane) are exposed are dry etched with $Cl_2$. Thus, the light-emitting surfaces 235a and the light-reflecting surfaces 235b each including a part of the n-type cladding layer 225 and the light-emitting layer 226 are formed on the semiconductor laser device layer 223, as shown in FIG. 39. As shown in FIG. 39, the light-emitting surfaces 235a have substantially (11-25) planes, and the light-reflecting surfaces 235b have substantially (1-12-5) planes by dry etching.

Thereafter, the mask layer 202 and the resists 203 are completely removed from the semiconductor laser device layer 223 by wet etching with hydrofluoric acid. Thus, the inclined planes 235d and 235e formed by the (11-22) planes, and the light-emitting surfaces 235a and the inclined planes 235c, the facets 235f by the aforementioned etching are formed on the laser beam-emitting side facets of the semiconductor laser device layer 223. The inclined planes 235i and 235j formed by the (000-1) planes, and the light-reflecting surfaces 235b, the inclined planes 235g and the facets 235h by the aforementioned etching are formed on the laser beam-reflecting side facets of the semiconductor laser device layer 223.

Ridge portions 201 (see FIG. 23), a current blocking layer 229 (see FIG. 23) and p-side electrodes 230 are formed through a manufacturing process similar to that of the aforementioned fifth embodiment. In the seventh embodiment, the ridge portions 201 are formed to extend in a substantially [11-25] direction (along arrow A1).

Figure 40:
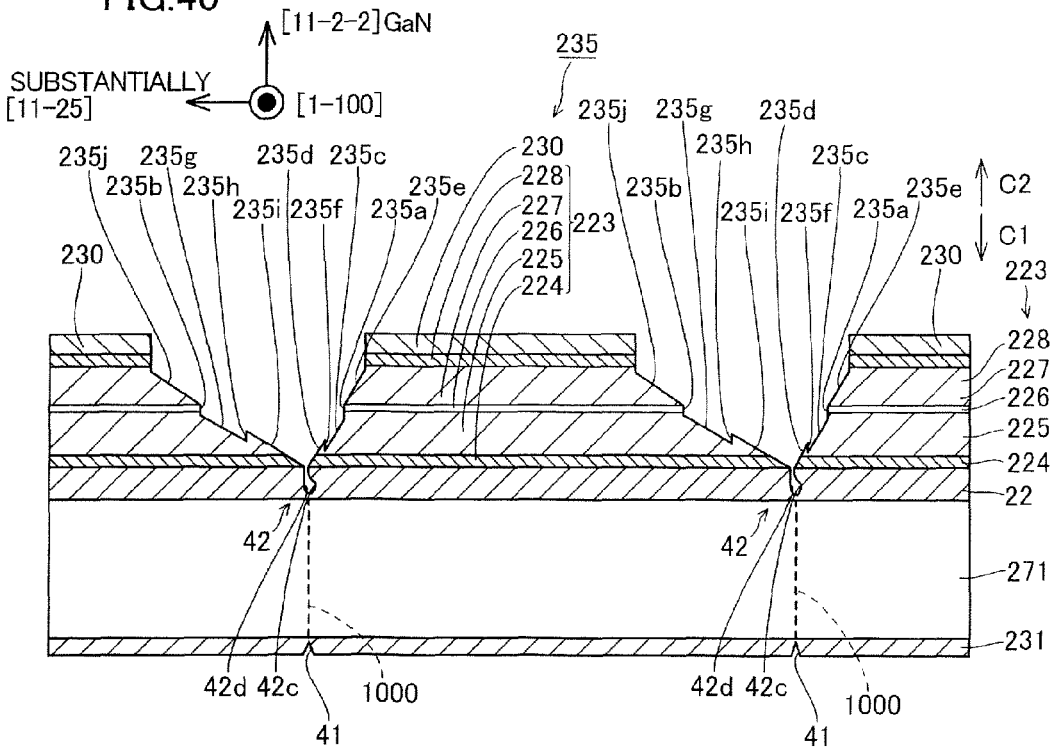
FIG. 40 A sectional view for illustrating the manufacturing process of the nitride-based semiconductor laser device according to the seventh embodiment shown in FIG. 37.

As shown in FIG. 40, a back surface of the n-type GaN substrate 271 is so polished that a thickness of the n-type GaN substrate 271 reaches a thickness of about 100 µm, and an n-side electrode 231 is thereafter formed on the back surface of the n-type GaN substrate 271 by vacuum evaporation to be in contact with the n-type GaN substrate 271.

As shown in FIG. 40, linear scribing grooves 41 are so formed on the back surface side of the n-side electrode 231 located substantially directly under the cracks 42 as to extend in a direction (direction B in FIG. 23) orthogonal to the direction A of the n-type GaN substrate 271 by laser scribing or mechanical scribing. In this state, the wafer is cleaved on the position (cleavage line 1000) of each scribing groove 41 by applying a load while fulcruming the back surface side of the n-type GaN substrate 271 so that the surface (upper side) of the wafer opens, as shown in FIG. 40.

Thereafter, the device is separated into chips by division along the cavity direction (direction A), thereby forming the nitride-based semiconductor laser device 235 according to the seventh embodiment shown in FIG. 37. The remaining effects of the nitride-based semiconductor laser device 235 according to the seventh embodiment are similar to those of the aforementioned fifth embodiment.

Eighth Embodiment

In a nitride-based semiconductor laser device 240 according to the eighth embodiment, a case where grooves 82 extending in a [11-20] direction (direction perpendicular to the plane of FIG. 41) are formed on a main surface, formed by an m-plane ((1-100) plane), of an n-type GaN substrate 281 by etching and a semiconductor laser device layer 223 is thereafter formed dissimilarly to the aforementioned fifth embodiment will be described with reference to FIGS. 16, 23, and 41 to 44. The n-type GaN substrate 281 and the groove 82 are examples of the "substrate" and the "recess portion" in the present invention, respectively.

Figure 41:
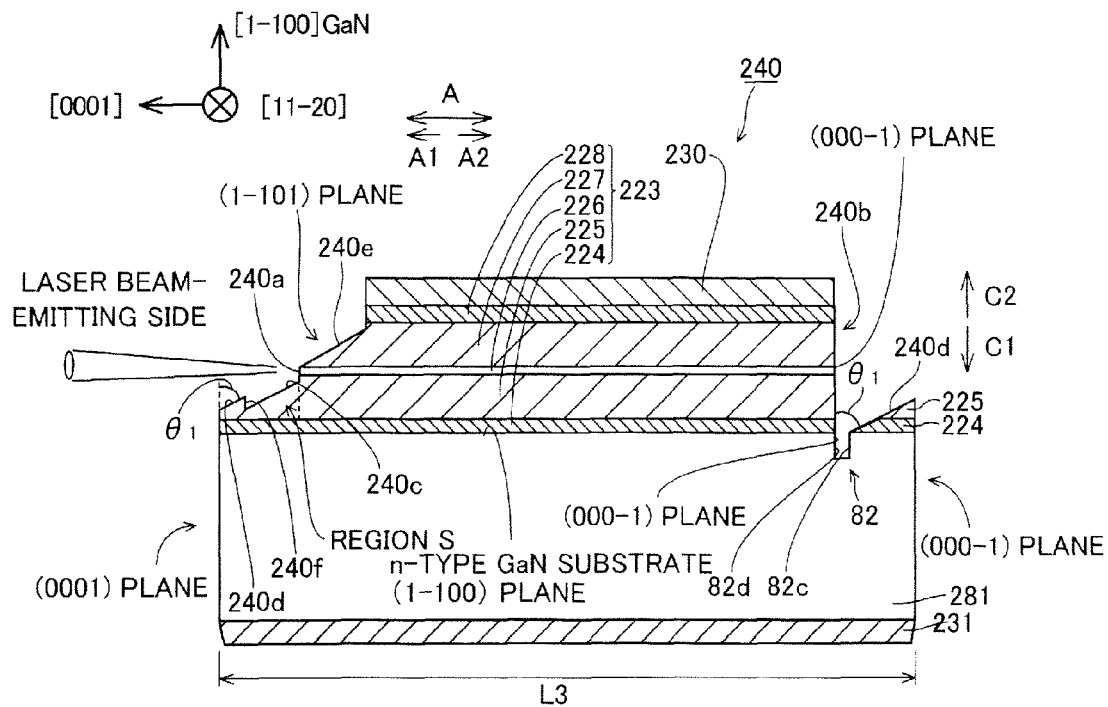
FIG. 41 A sectional view showing a structure of a nitride-based semiconductor laser device according to an eighth embodiment of the present invention.

In the nitride-based semiconductor laser device 240 according to the eighth embodiment of the present invention, the semiconductor laser device layer 223 having a multilayer structure similar to that of the fifth embodiment is formed on the n-type GaN substrate 281, as shown in FIG. 41. In the semiconductor laser device layer 223, a length L3 between laser device ends (direction A) is about 1660 µm, and a light-emitting surface 240a and a light-reflecting surface 240b substantially perpendicular to a main surface of the n-type GaN substrate 281 is formed in a cavity direction which is a [0001] direction. The light-emitting surface 240a and the light-reflecting surface 240b are examples of the "first facet" and the "second facet" in the present invention, respectively.

According to the eighth embodiment, the grooves 82 having a width W1 of about 10 µm in a [0001] direction (direction A) and a depth of about 2 µm and extending in the [11-20]

direction (direction perpendicular to the plane of paper) are formed on the main surface, formed by the m-plane ((1-100) plane), of the n-type GaN substrate 281 by etching, dissimilarly to the manufacturing process of the nitride-based semiconductor laser device 200 according to the aforementioned fifth embodiment, as shown in FIG. 16. The grooves 82 are formed in a striped manner in the direction A in a period of about 1570 μm (=W1+L2). In this case, the groove 82 are formed with inner side surfaces 82c formed by (0001) planes substantially perpendicular to the (1-100) plane of the n-type GaN substrate 281 and inner side surfaces 82d formed by (0001-1) planes substantially perpendicular to the (1-100) plane of the n-type GaN substrate 281. The groove 82 is an example of the "recess portion" in the present invention, and the inner side surfaces 82c and 82d are examples of the "first side surface of the recess portion" and the "second side surface of the recess portion" in the present invention, respectively.

As shown in FIG. 43, a buffer layer 224, an n-type cladding layer 225, a light-emitting layer 226, a p-type cladding layer 227 and a p-type contact layer 228 are successively stacked on the n-type GaN substrate 281 through a manufacturing process similar to that of the fifth embodiment, thereby forming the semiconductor laser device layer 223.

Figure 42:
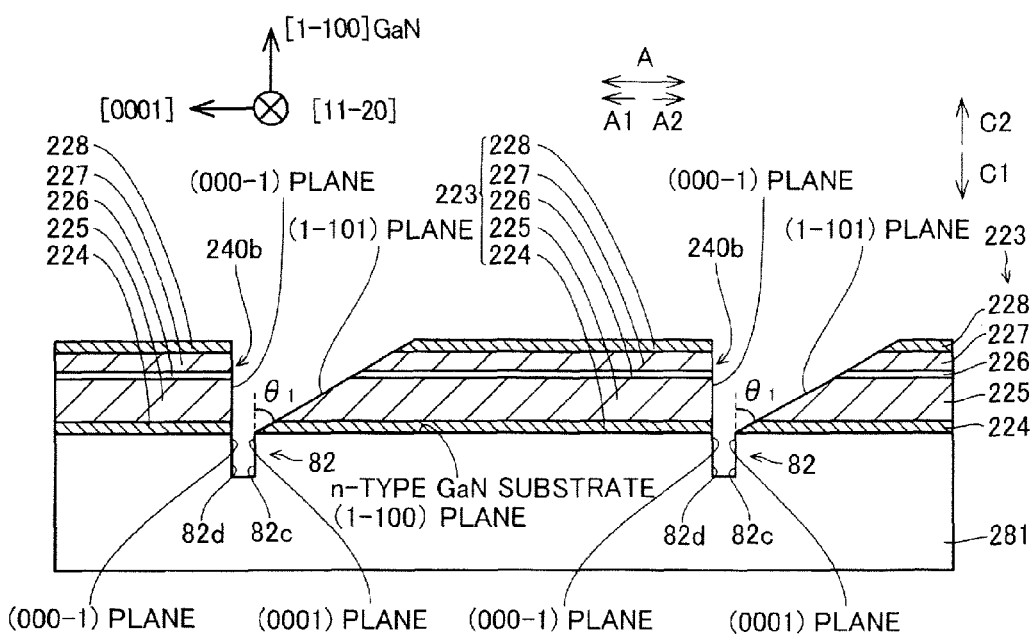
FIG. 42 A sectional view for illustrating the manufacturing process of the nitride-based semiconductor laser device according to the eighth embodiment shown in FIG. 41.

According to the eighth embodiment, facets formed by the (1-101) planes, extending in a direction inclined at an angle $\theta_1$ (=about 62°) with respect to the main surface of the n-type GaN substrate 281 while starting from upper ends of the inner side surfaces 82c, formed by the (0001) planes, of the grooves 80 are formed, as shown in FIG. 42. Simultaneously, the semiconductor laser device layer 223 is crystal-grown, while forming the facets (000-1) planes) extending in a [1-100] direction (along arrow C2) to start from the (000-1) planes of the grooves 82 by employing the upper ends of the inner side surfaces 82d of the grooves 82 as starting points. Thus, the light-reflecting surfaces 240b formed by the (000-1) planes are formed on the semiconductor laser device layer 223.

According to the eighth embodiment, the light-emitting surfaces 240a extending in the [1-100] direction (along arrow C2) and including a part of the n-type cladding layer 225 and the light-emitting layer 226 are formed on the semiconductor laser device layer 223 by etching similar to that of the aforementioned fifth embodiment, as shown in FIG. 43. In this case, the inclined planes 240c obliquely extending from the vicinity of an upper end of the n-type cladding layer 225 toward the n-type GaN substrate 281 and the facets 240f substantially parallel to the light-emitting surfaces 240a are formed as shown in FIG. 43. Thus, inclined planes 240d and 240e formed by the (1-101) planes, and the light-emitting surfaces 240a and the inclined planes 240c by etching are formed on the laser beam-emitting side facets of the semiconductor laser device layer 223 similarly to the aforementioned fifth embodiment, as shown in FIG. 43. The inclined planes 240c, 240d and 240e are each an example of the "first facet" in the present invention.

A current blocking layer 229 (see FIG. 23), p-side electrodes 230 and an n-side electrode 231 are successively formed through a manufacturing process similar to that of the aforementioned fifth embodiment. As shown in FIG. 44, linear scribing grooves 41 are so formed on positions corresponding to the (000-1) semiconductor facets on the lower side of the n-side electrode 231 and positions to be formed with prescribed (0001) planes as to extend parallel to the grooves 82 of the n-type GaN substrate 281 (direction perpendicular to the plane of FIG. 42) by laser scribing or mechanical scribing. In this state, the wafer is cleaved on the position (cleavage line 1000) of each scribing groove 41 by applying a load while fulcruming the lower side of the n-type GaN substrate 281 so that the surface (upper side) of the wafer opens, as shown in FIG. 44.

Thereafter, the device is separated into chips by division along the cavity direction (direction A), thereby forming the nitride-based semiconductor laser device 240 according to the eighth embodiment shown in FIG. 41.

According to the eighth embodiment, as hereinabove described, the light-emitting surface 240a and the inclined planes 240c and 240d extending to be inclined by the angle $\theta_1$ (=about 62°) with respect to the [1-100] direction perpendicular to the main surface of the n-type GaN substrate 281 while forming the acute angles with the main surface (m-plane (1-100) plane) of the n-type GaN substrate 281 in the vicinity of the light-emitting surface 240a are provided on the semiconductor laser device layer 223, whereby the semiconductor laser device layer 223 is connected to the n-type GaN substrate 281 side through a plane area larger than a plane area in the vicinity of the light-emitting layer 226, and hence a sectional area a sectional area (region S enclosed with the inclined planes 240c and 240d, the facet 240f, the main surface ((1-100) plane) of the n-type cladding layer 225 and a visual surface (broken lines) extending the light-emitting surface 240a to the main surface of the n-type cladding layer 225 along arrow C1 (see FIG. 23)) of a path through which heat is radiated to the n-type GaN substrate 281 can be increased by the increased plane area. Thus, heat generated from a laser beam emitted in the vicinity of the light-emitting surface 240a are suitably diffused to the n-type GaN substrate 281 side through the inside of the semiconductor laser device layer 223 formed with the inclined planes 240c and 240d extending in the emission direction of the laser beam beyond the light-emitting surface 240a also when output of the nitride-based semiconductor laser device 240 is increased. Therefore, generation of excess heat of the cavity facet (light-emitting surface 240a) due to the emitted laser beam is suppressed. Thus, deterioration of the cavity facet (light-emitting surface 240a) following higher output of the semiconductor laser can be suppressed. The life of the nitride-based semiconductor laser device 240 can be improved by suppressing the deterioration of the cavity facet (light-emitting surface 240a).

The remaining effects of the nitride-based semiconductor laser device 240 according to the eighth embodiment are similar to those of the aforementioned fifth embodiment.

Modification of Eighth Embodiment

In a nitride-based semiconductor laser device 245 according to a modification of the eighth embodiment, a case where a semiconductor laser device layer 223 is formed on a main surface formed by an a-plane ((11-20) plane) which is a nonpolar face of an n-type GaN substrate 291 dissimilarly to the aforementioned eighth embodiment will be described with reference to FIG. 45. The n-type GaN substrate 291 is an example of the "substrate" in the present invention.

Figure 45:
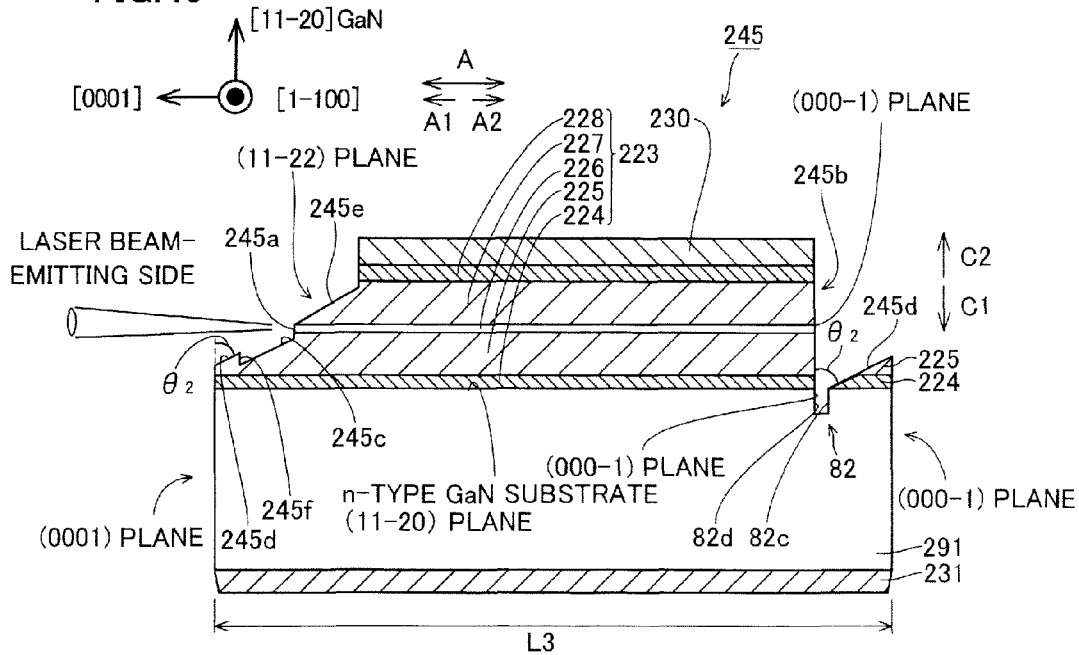
FIG. 45 A sectional view showing a structure of a nitride-based semiconductor laser device according to a modification of the eighth embodiment of the present invention.

According to the modification of the eighth embodiment, the semiconductor laser device layer 223 is formed with inclined planes 245c and 245d inclined by an angle $\theta_3$ (=about 58°) with respect to a direction ([11-20] direction (along arrow C2)) perpendicular to the main surface of the n-type GaN substrate 291 from a lower end of the light-emitting surface 245a and extending in an emission direction (along arrow A1 (direction away from the light-emitting surface 245a to the outside of the laser device)) of a laser beam emitted from a region in the vicinity of a light-emitting layer 226, as shown in FIG. 45. Additionally, the semiconductor laser device layer 223 is formed with an inclined plane 245e inclined by the angle $\theta_3$ (=about 58°) with respect to the direction ([11-20] direction (along arrow C2)) perpendicular to the main surface of the n-type GaN substrate 291 from an upper end of the light-emitting surface 245a and extending along arrow A2. Therefore, the inclined planes 245c, 245d and 245e and the main surface of the n-type GaN substrate 291 form acute angles, as shown in FIG. 45. The light-emitting surface 245a, the inclined planes 245c, 245d and 245e are each an example of the "first facet" in the present invention.

According to the modification of the eighth embodiment, the inclined plane 245c of the semiconductor laser device layer 223 is formed to obliquely extend from an n-type cladding layer 225b located on a lower portion of the light-emitting surface 245a toward the n-type GaN substrate 291, and be connected to the inclined plane 245d through a facet 245f extending substantially perpendicular to the main surface of the n-type GaN substrate 291. The inclined planes 245d and 245e of the semiconductor laser device layer 223 are formed by facets formed by (11-22) planes crystal-grown while starting from an upper end of an inner side surface 82c, formed by a (0001) plane, of the groove 82.

According to the modification of the eighth embodiment, a light-reflecting surface 245b of the semiconductor laser device layer 223 is constituted by a facet extending in the direction ([11-20] direction (along arrow C2)) perpendicular to the main surface of the n-type GaN substrate 291 and formed by a (000-1) plane crystal-grown to start from an inner side surface 82d formed by the (000-1) plane of the groove 82. The light-reflecting surface 245b is an example of the "second facet" in the present invention.

According to the modification of the eighth embodiment, the semiconductor laser device layer 223 is formed on the nonpolar face ((11-20) plane) of the n-type GaN substrate 291, whereby a piezoelectric field caused in the semiconductor device layer (light-emitting layer 226) or an internal electric field of spontaneous polarization or the like can be reduced. Thus, heat generation of the semiconductor laser device layer 223 (light-emitting layer 226) including the vicinity of the cavity facet (light-emitting surface 245a) can be suppressed, and hence the life of the nitride-based semiconductor laser device 245 can be improved.

The remaining structure and manufacturing process of the nitride-based semiconductor laser device 245 according to the modification of the eighth embodiment are similar to those of the aforementioned eighth embodiment. The remaining effects of the nitride-based semiconductor laser device 245 according to the modification of the eighth embodiment are similar to those of the aforementioned eighth embodiment.

Ninth Embodiment

A structure of a light-emitting diode chip 300 according to a ninth embodiment will be now described with reference to FIG. 46.

The light-emitting diode chip 300 according to the ninth embodiment is constituted by a wurtzite structure nitride-based semiconductor having an a-plane ((11-20) plane) as a main surface. The shape of the light-emitting diode chip 300 is a square shape, a rectangular shape, a rhombus shape, a parallelogram shape or the like in plan view (as viewed from an upper side of the light-emitting diode chip 300).

Figure 46:
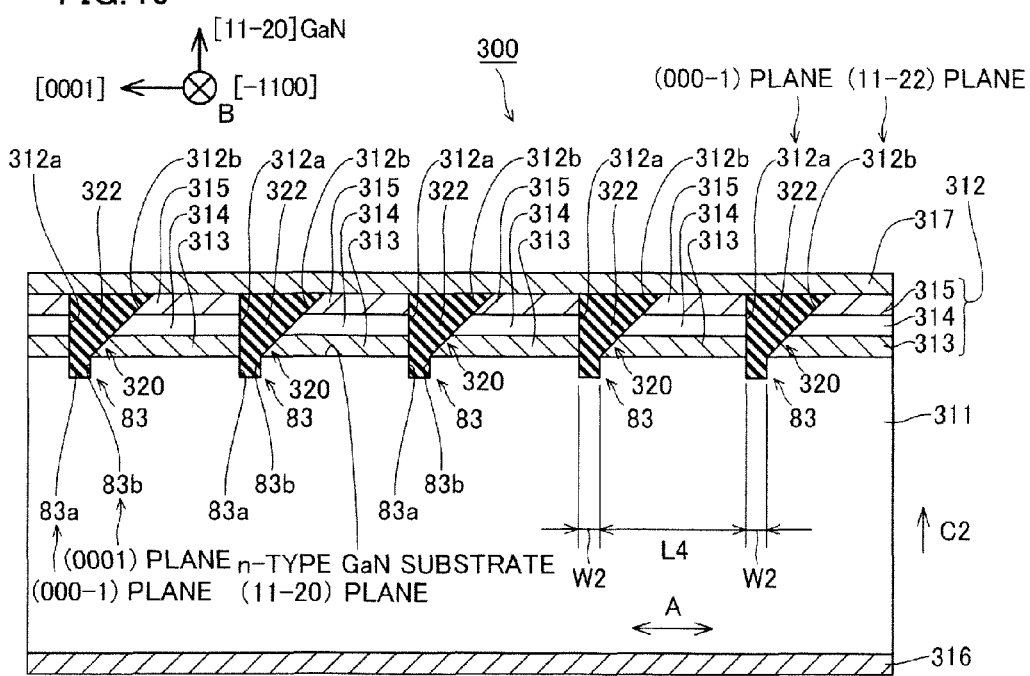
FIG. 46 A sectional view showing a structure of a light-emitting diode chip according to a ninth embodiment of the present invention.

As shown in FIG. 46, in the light-emitting diode chip 300, a light-emitting device layer 312 is formed on an n-type GaN substrate 311 having a thickness of about 100 μm. A light-emitting layer 314 consisting of an MQW structure formed by stacking an n-type cladding layer 313 made of n-type $Al_{0.03}Ga_{0.97}N$ having a thickness of about 0.5 μm, a well layer (not shown) of $Ga_{0.7}In_{0.3}N$ having a thickness of about 2 nm and a barrier layer (not shown) made of $Ga_{0.9}In_{0.1}N$ is formed in the light-emitting device layer 312. A p-type cladding layer 315 doubling as a p-type contact layer made of p-type GaN having a thickness of about 0.2 μm is formed on the light-emitting layer 314. The n-type GaN substrate 311 is an example of the "substrate" in the present invention, and the light-emitting device layer 312, the n-type cladding layer 313, the light-emitting layer 314 and the p-type cladding layer 315 are each an example of the "nitride-based semiconductor layer" in the present invention.

According to the ninth embodiment, recess portions 320 are formed from the n-type cladding layer 313 to the p-type cladding layer 315 by crystal growth surfaces 312a and 312b, formed by (000-1) and (11-22) planes, of the light-emitting device layer 312. The crystal growth surfaces 312a and 312b are examples of the "first side surface" and the "second side surface" in the present invention, respectively. The crystal growth surfaces 312a are formed to extend in a direction ([11-20] direction) substantially perpendicular to a main surface of the n-type GaN substrate 311 so as to start from inner side surfaces 83a formed by (000-1) planes of grooves 83 previously formed on the main surface of the n-type GaN substrate 311 in a manufacturing process described later. The crystal growth surfaces 312b are formed by inclined planes starting from inner side surfaces 83b of the grooves 83, and form obtuse angles with respect to an upper surface (main surface) of the light-emitting device layer 312. The groove 83 and the inner side surface 83a are examples of the "recess portion" and the "first inner side surface of the recess portion" in the present invention, respectively. In FIG. 46, only some of the grooves 83 are denoted by reference characters of the inner side surfaces 83a and 83b in the drawing because of illustration.

An n-side electrode 316 is formed on a lower surface of the n-type GaN substrate 311. The recess portions 320 are formed with insulating films 322 of $SiO_2$ transparent for an emission wavelength and also formed with a translucent p-side electrode 317 to cover the insulating films 322 and the p-type cladding layer 315.

The manufacturing process of the light-emitting diode chip 300 according to the ninth embodiment will be now described with reference to FIGS. 46 and 47.

A plurality of the grooves 83 (see FIG. 47) having a width W1 of about 5 μm in a [0001] direction (direction A) and a depth of about 2 μm and extending in a [1-100] direction (direction B) are formed on the main surface, formed by the a-plane ((11-20) plane), of the n-type GaN substrate 311 through a manufacturing process similar to the aforementioned second embodiment. As shown in FIG. 47, the grooves 83 are formed in a striped manner in the direction A in a period of about 50 μm (=W2+L4 (L4=about 45 μm).

In the manufacturing process of the ninth embodiment, each groove 83 is formed with the inner side surface 83a formed by the (000-1) plane substantially perpendicular to the (11-20) plane of the n-type GaN substrate 311 and the inner side surface 83b formed by the (0001) plane substantially perpendicular to the (11-20) plane of the n-type GaN substrate 311. The inner side surface 83b is an example of the "second inner side surface of the recess portion" in the present invention.

The n-type cladding layer 313, the light-emitting layer 314 and the p-type cladding layer 315 are successively stacked on the n-type GaN substrate 311 having the grooves 83 by MOCVD, thereby forming the light-emitting device layer 312.

Figure 47:
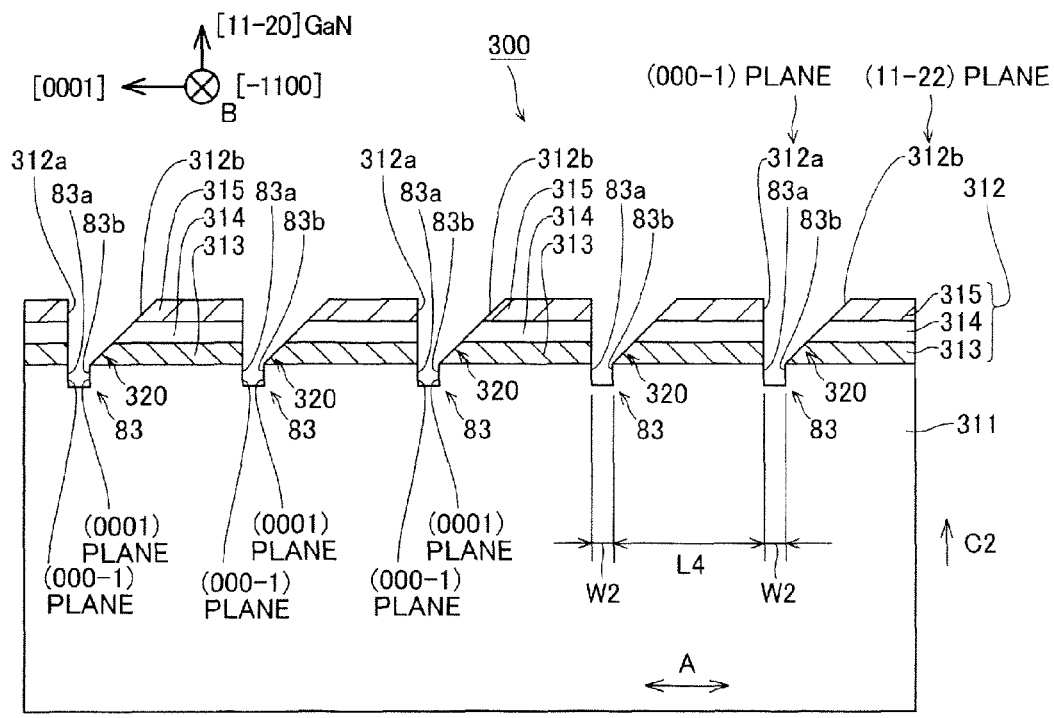
FIG. 47 A sectional view for illustrating a manufacturing process of the light-emitting diode chip according to the ninth embodiment shown in FIG. 46.

According to the ninth embodiment, when the light-emitting device layer 312 is grown on the n-type GaN substrate 311, the light-emitting device layer 312 is crystal-grown on the inner side surfaces 80a formed by the (000-1) planes of the grooves 83 extending in the [1-100] direction, while forming the crystal growth surfaces 312a formed by the (000-1) planes extending in the [11-20] direction (along arrow C2) to start from the (000-1) planes of the grooves 83, as shown in FIG. 47. On the (0001) plane (inner side surface 83b) side opposed to the (000-1) planes of the grooves 83, the light-emitting device layer 312 is crystal-grown while forming crystal growth surfaces (facets) 312b formed by the (11-22) planes extending in a direction inclined at a prescribed angle with respect to the [11-20] direction (along arrow C2). Thus, the crystal growth surfaces 312b form the obtuse angles with respect to the upper surface (main surface) of the light-emitting device layer 312.

As shown in FIG. 46, the insulating films 322 are formed to fill up the recess portions 320 (regions above the grooves 83 including the grooves 83) held between the crystal growth surfaces 312a ((000-1) planes) and 312b ((11-22) planes) of the light-emitting device layer 312. Then, the p-side electrode 317 is formed on the upper surfaces of the insulating films 322 and the light-emitting device layer 312, and the n-side electrode 316 is formed on the lower surface of the n-type GaN substrate 311. Thus, the light-emitting diode chip 300 according to the ninth embodiment shown in FIG. 46 is formed.

According to the ninth embodiment, as hereinabove described, the light-emitting diode 300 comprises the light-emitting device layer 312 including the n-type GaN substrate 311 formed with the grooves 83 on the main surface, the crystal growth surfaces 312a formed by the (000-1) plane formed to start from the inner side surfaces 83a of the grooves 83 on the main surface of the n-type GaN substrate 311 and the crystal growth surfaces 312b formed to start from the inner side surfaces 83b of the grooves 83. Thus, the light-emitting device layer 312 is formed with the crystal growth surfaces 312a and 312b starting from the inner side surfaces 83a and 83b of the grooves 83 previously formed on the n-type GaN substrate 311. In other words, no etching is required in the manufacturing process dissimilarly to a case of forming the aforementioned crystal growth surfaces 312a or 312b by etching the nitride-based semiconductor layer stacked on a flat substrate with no recess portion, and hence the manufacturing process of the light-emitting diode 300 can be inhibited from complication. The crystal growth surfaces 312a and 312b of the light-emitting device layer 312 are not formed by dry etching or the like, and hence the light-emitting layer 314 and the like are difficult to be damaged in the manufacturing process. Thus, light extraction efficiency from the light-emitting layer 314 can be improved.

According to the ninth embodiment, the light-emitting diode 300 comprises the light-emitting device layer 312 including the n-type GaN substrate 311 formed with the grooves 83 on the main surface, the crystal growth surfaces 312a formed by the (000-1) plane formed to start from the inner side surfaces 83a of the grooves 83 on the main surface of the n-type GaN substrate 311 and the crystal growth surfaces 312b formed to start from the inner side surfaces 83b of the grooves 83. Thus, when the light-emitting device layer 312 is crystal-grown on the n-type GaN substrate 311, the growth rate of forming the crystal growth surfaces 312a and 312b starting from the inner side surface 83a and 83b respectively is slower than the growth rate of growing the upper surface (main surface of the light-emitting device layer 312) of the growth layer, and hence the upper surface (main surface) of the growth layer is grown while maintaining flatness. Thus, flatness of the surface (upper surface) of the light-emitting device layer 312 having the light-emitting layer 314 can be further improved as compared with surfaces of a growth layer of a light-emitting device layer with no facet formed by the aforementioned crystal growth surfaces 312a and 312b.

According to the ninth embodiment, the inner side surfaces 83a of the grooves 83 are formed by the (000-1) planes, whereby the (000-1) plane of the light-emitting device layer 312 is formed to start from the (000-1) planes of the inner side surfaces 83a of the grooves 83 when forming the light-emitting device layer 312 having the crystal growth surfaces 312a formed by the (000-1) plane on the main surface of the n-type GaN substrate 311, and hence the crystal growth surfaces 312a formed by the (000-1) planes can be easily formed on the n-type GaN substrate 311.

According to the ninth embodiment, the crystal growth surfaces 312a and 312b of the light-emitting device layer 312 is formed by the crystal growth surface of the light-emitting device layer 312, whereby two types of the crystal growth surfaces (facets) of the aforementioned crystal growth surfaces 312a and 312b can be formed simultaneously with the crystal growth of the light-emitting device layer 312.

According to the ninth embodiment, the crystal growth surfaces 312b are formed by the (11-22) plane, whereby the surface (upper surface) of the growth layer can be reliably formed to have flatness in forming the facets (crystal growth surfaces 312b) formed by the (11-22) plane on the n-type GaN substrate 311 as compared with surfaces (main surfaces) of a growth layer of the light-emitting device layer in forming side surfaces (facets) which are not the facets as the (11-22) planes on the n-type GaN substrate 311. The growth rate of the crystal growth surfaces 312b is slower than the growth rate of the main surface of the light-emitting device layer 312, and hence the crystal growth surfaces 312b can be easily formed by crystal growth.

According to the ninth embodiment, the substrate is formed to be the n-type GaN substrate 311 made of a nitride-based semiconductor such as GaN, whereby the light-emitting device layer 312 having the crystal growth surfaces 312a and 312b formed by the (000-1) and (11-22) planes can be easily formed by utilizing crystal growth of the light-emitting device layer 312 on the n-type GaN substrate 311 made of a nitride-based semiconductor.

According to the ninth embodiment, the crystal growth surfaces 312b of the light-emitting device layer 312 form obtuse angles with respect to the main surface ((11-20) plane)) of the light-emitting device layer 312, whereby a plurality of the recess portions 320 (upper regions of the grooves 83, including the grooves 83 of the n-type GaN substrate 311) opposed to the crystal growth surfaces 312a and 312b of the light-emitting device layer 312 are formed to broaden from the n-type GaN substrate 311 toward the upper surface of the light-emitting device layer 312, and hence light from the light-emitting layer 314 can be easily extracted not only through the upper surface of the light-emitting device layer 312 but also through the crystal growth surfaces 312b inclined with respect to the main surface of n-type GaN substrate 311. Thus, luminous efficiency of the light-emitting diode chip 300 can be further improved.

Tenth Embodiment

In a manufacturing process of a light-emitting diode chip 350 according to a tenth embodiment, a case where a light-emitting device layer 342 is formed after forming an underlayer 355 made of AlGaN on an n-type GaN substrate 311 dissimilarly to the aforementioned ninth embodiment will be described with reference to FIGS. 48 and 49. The n-type GaN substrate 311 is an example of the "base substrate" in the present invention.

The light-emitting diode chip 350 according to the tenth embodiment is constituted by a wurtzite structure nitride-based semiconductor having a (11-2-2) plane as a main surface. The shape of the light-emitting diode chip 350 is a square shape, a rectangular shape, a rhombus shape, a parallelogram shape or the like in plan view (as viewed from an upper side of the light-emitting diode chip 350).

In the manufacturing process of the light-emitting diode chip 350 according to the tenth embodiment, the underlayer 355 made of $Al_{0.05}Ga_{0.95}N$ having a thickness of about 3 μm to about 4 μm is grown on the n-type GaN substrate 311 having a thickness of about 100 μm and cracks 43 are formed on the underlayer 355 through a manufacturing process similar to that of the aforementioned first embodiment. Difference between c-axial lattice constants of GaN and AlGaN is larger than difference between a-axial lattice constants of GaN and AlGaN, and hence the cracks 43 are likely to be formed in a [1-100] direction (direction B) parallel to a (000-1) plane of the underlayer 355 and a (11-2-2) plane of the main surface of the n-type GaN substrate 311.

Figure 49:
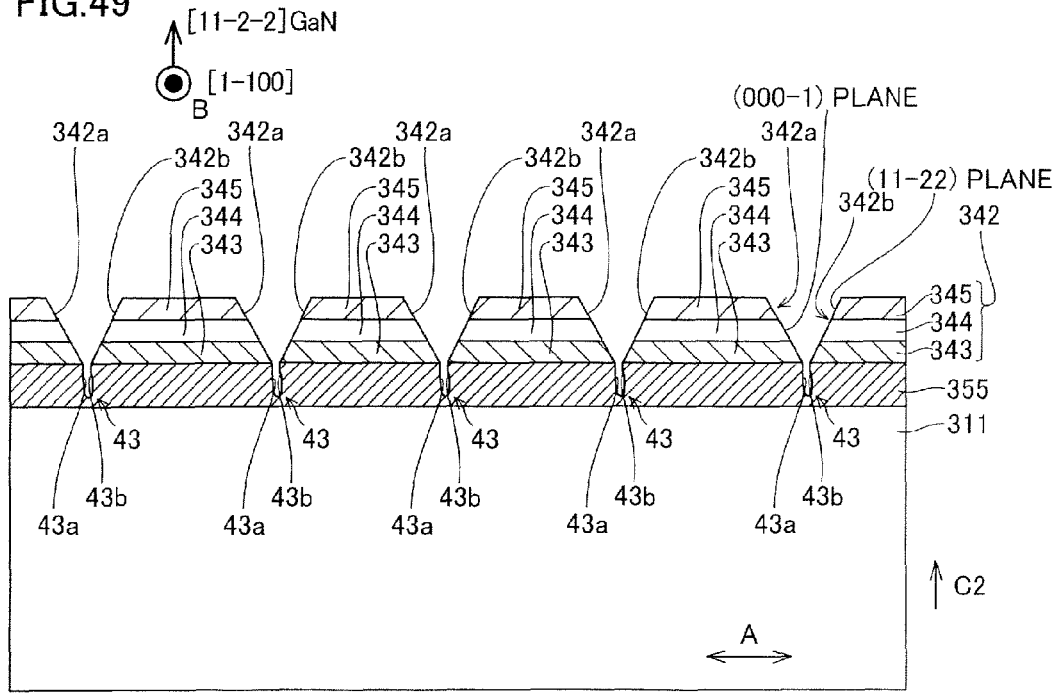
FIG. 49 A sectional view for illustrating a manufacturing process of the light-emitting diode chip according to the tenth embodiment shown in FIG. 48.

When the n-type GaN substrate 311 formed with the cracks 43 is viewed in a planar manner, the cracks 43 are formed in a striped manner along the [1-100] direction (direction B) substantially orthogonal to the direction A of the n-type GaN substrate 311, as shown in FIG. 49. The crack 43 is an example of the "recess portion" in the present invention.

As shown in FIG. 49, an n-type cladding layer 343 made of n-type GaN having a thickness of about 0.5 μm, a light-emitting layer 344 of MQW formed by stacking a well layer (not shown) made of $Ga_{0.7}In_{0.3}N$ having a thickness of about 2 nm and a barrier layer (not shown) of $Ga_{0.9}In_{0.1}N$, and a p-type cladding layer 345 doubling as a p-type contact layer made of p-type GaN having a thickness of about 0.2 μm are successively stacked on the underlayer 355 through a manufacturing process similar to the aforementioned ninth embodiment, thereby forming the light-emitting device layer 342. The light-emitting device layer 342, the n-type cladding layer 343, the light-emitting layer 344 and the p-type cladding layer 345 are each an example of the "nitride-based semiconductor layer" in the present invention.

According to the tenth embodiment, when the light-emitting device layer 342 is grown on the n-type GaN substrate 311, the light-emitting device layer 312 is crystal-grown on inner side surfaces 43a of the cracks 43 extending in the [1-100] direction in a striped manner while forming crystal growth surfaces 342a formed by the (000-1) plane extending in a direction inclined by a prescribed angle with respect to a [11-2-2] direction (along arrow C2) of the n-type GaN substrate 311. The light-emitting device layer 342 is crystal-grown on inner side surfaces 43b opposed to the inner side surfaces 43a of the cracks 43 while forming crystal growth surfaces 342b formed by the (11-22) plane extending in a direction inclined by a prescribed angle with respect to the [11-2-2] direction (along arrow C2) of the n-type GaN substrate 311. The inner side surfaces 43a and 43b are examples of the "first inner side surface of the recess portion" and the "second inner side surface of the recess portion" in the present invention, respectively, and the crystal growth surfaces 342a and 342b are examples of the "first side surface" and the "second side surface" in the present invention, respectively. Thus, the crystal growth surfaces 342a and 342b form respective obtuse angles with respect to the upper surface (main surface) of the light-emitting device layer 312.

Figure 48:
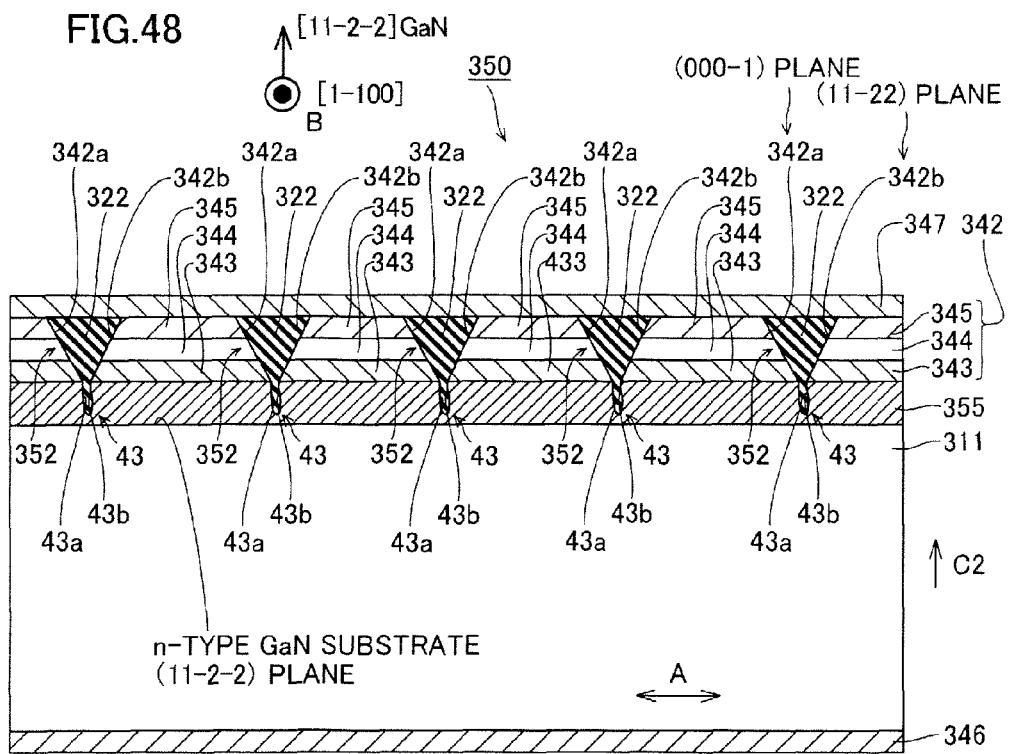
FIG. 48 A sectional view showing a structure of a light-emitting diode chip according to a tenth embodiment of the present invention.

As shown in FIG. 48, insulating films 322 of as $SiO_2$ or the like transparent for an emission wavelength are formed to fill up recess portions 352 (regions on the upper portions of the cracks 43) held between the crystal growth surfaces 342a and 342b formed by the (000-1) and (11-22) planes of the light-emitting device layer 342. Then, a p-side electrode 347 is formed on upper surfaces of the insulating films 322 and the light-emitting device layer 342, and an n-side electrode 346 is formed on a lower surface of the n-type GaN substrate 311. Thus, the light-emitting diode chip 350 according to the tenth embodiment shown in FIG. 48 is formed.

According to the tenth embodiment, as hereinabove described, the n-type GaN substrate 311 formed with the cracks 43 on the underlayer 355 and the light-emitting device layer 342 including the crystal growth surfaces 342a formed by the (000-1) planes to start from the inner side surfaces 43a of the cracks 43 on the main surface of the n-type GaN substrate 311 and the crystal growth surfaces 342b formed to start from the inner side surfaces 43b of the cracks 43 are provided. Thus, the crystal growth surfaces 342a and 342b starting from the inner side surfaces 43a and 43b of the cracks 43 of the underlayer 355 previously are formed on the light-emitting device layer 342. In other words, no etching is required dissimilarly to a case of forming the aforementioned crystal growth surfaces 342a or 342b by etching the nitride-based semiconductor layer stacked on a flat substrate with no recess portion in the manufacturing process, and hence the manufacturing process of the light-emitting diode 350 can be inhibited from complication. The crystal growth surfaces 342a and 342b of the light-emitting device layer 342 are not formed by dry etching or the like, and hence the light-emitting layer 344 and the like are difficult to be damaged in the manufacturing process. Thus, light extraction efficiency from the light-emitting layer 344 can be improved.

According to the tenth embodiment, the n-type GaN substrate 311 formed with the cracks 43 on the underlayer 355 and the light-emitting device layer 342 including the crystal growth surfaces 342a formed by the (000-1) planes to start from the inner side surfaces 43a of the cracks 43 on the main surface of the n-type GaN substrate 311 and the crystal growth surfaces 342b formed to start from the inner side surfaces 43b of the cracks 43 are provided. Thus, when the light-emitting device layer 342 is crystal-grown on the n-type GaN substrate 311, the growth rate of forming the crystal growth surfaces 342a and 342b starting from the inner side surfaces 43a and 43b of the cracks 43 respectively is slower than the growth rate of growing the upper surface (main surface of the light-emitting device layer 342) of the growth layer, and hence the upper surface (main surface) of the growth layer is grown while maintaining flatness. Thus, flatness of the surface (upper surface) of the light-emitting device layer 342 having the light-emitting layer 344 can be further improved as compared with surfaces of a growth layer of a light-emitting device layer with no facet formed by the aforementioned crystal growth surfaces 342a and 342b.

According to the tenth embodiment, the underlayer 355 made of AlGaN is formed on the n-type GaN substrate 311, and a lattice constant $c_1$ of the n-type GaN substrate 311 and a lattice constant $c_2$ of the underlayer 355 have the relation of $c_1 > c_2$, and the crystal growth surfaces 342a and 342b of the light-emitting device layer 342 are formed to start from the inner side surfaces 43a and 43b of the cracks 43, respectively, whereby the lattice constant $c_2$ of the underlayer 355 is smaller than the lattice constant $c_1$ of the n-type GaN substrate 311 ($c_1 > c_2$) when the underlayer 355 made of AlGaN is formed on the n-type GaN substrate 311, and hence tensile stress R is caused inside the underlayer 355 in response to the lattice constant $c_1$ on the n-type GaN substrate 311 side. Consequently, when the thickness of the underlayer 355 is at least a prescribed thickness, the underlayer 355 can not withstand this tensile stress R and hence the cracks 43 are formed on the underlayer 355. Thus, the inner side surfaces 43a and 43b which are the basis for crystal growing the crystal growth surfaces 342a ((000-1) plane) and 343b ((11-22) plane) of the light-emitting device layer 342 can be easily formed on the underlayer 355.

According to the tenth embodiment, the crystal growth surfaces 342a ((000-1) plane) and 342b ((11-22) plane) of the light-emitting device layer 342 is formed by the crystal growth surfaces of the light-emitting device layer 342, whereby two types of the flat crystal growth surfaces (facets) of the aforementioned crystal growth surfaces 342a and 342b can be formed simultaneously with the crystal growth of the light-emitting device layer 342.

According to the tenth embodiment, the crystal growth surfaces 342b and 342b of the light-emitting device layer 342 form obtuse angles with respect to the main surface ((11-2-2) plane)) of the light-emitting device layer 342, whereby a plurality of the recess portions 352 (upper regions of the cracks 43, including the cracks 43 on the n-type GaN substrate 311) opposed to the crystal growth surfaces 342a and 342b of the light-emitting device layer 342 are formed to broaden from the n-type GaN substrate 311 toward the upper surface of the light-emitting device layer 342, and hence light from the light-emitting layer 344 can be easily extracted not only through the upper surface of the light-emitting layer 344 but also through the crystal growth surfaces 342b inclined with respect to the main surface of n-type GaN substrate 311. Thus, luminous efficiency of the light-emitting diode chip 350 can be further improved. The remaining effects of the tenth embodiment are similar to those of the aforementioned ninth embodiment.

Eleventh Embodiment

Figure 52:
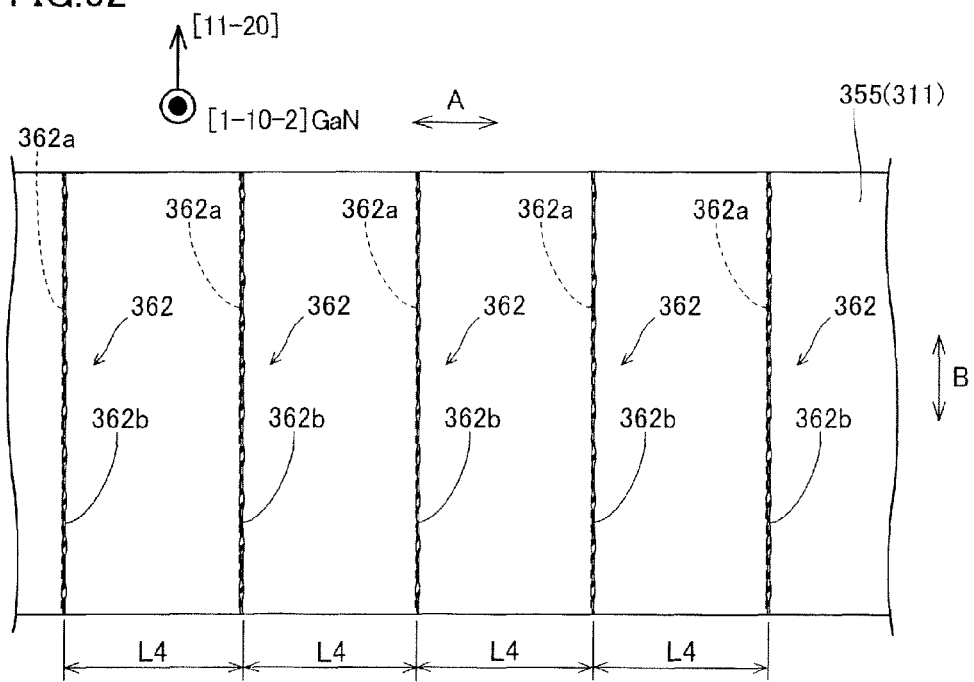
FIG. 52 A plan view for illustrating the manufacturing process of the light-emitting diode chip according to the eleventh embodiment shown in FIG. 50.

In a manufacturing process of a light-emitting diode chip 360 according to an eleventh embodiment, a case where cracks 362, positions of which are controlled by forming skipped shaped scribing cracks 361 on an underlayer 355 on an n-type GaN substrate 311, are formed dissimilarly to the aforementioned tenth embodiment will be described with reference to FIGS. 50 and 52. The n-type GaN substrate 311 is an example of the "base substrate" in the present invention, and the crack 362 is an example of the "recess portion" in the present invention.

The light-emitting diode chip 360 according to the eleventh embodiment is constituted by a wurtzite structure nitride-based semiconductor having a (1-10-2) plane as a main surface. The shape of the light-emitting diode chip 360 is a square shape, a rectangular shape, a rhombus shape, a parallelogram shape or the like in plan view (as viewed from an upper side of the light-emitting diode chip 360).

Figure 50:
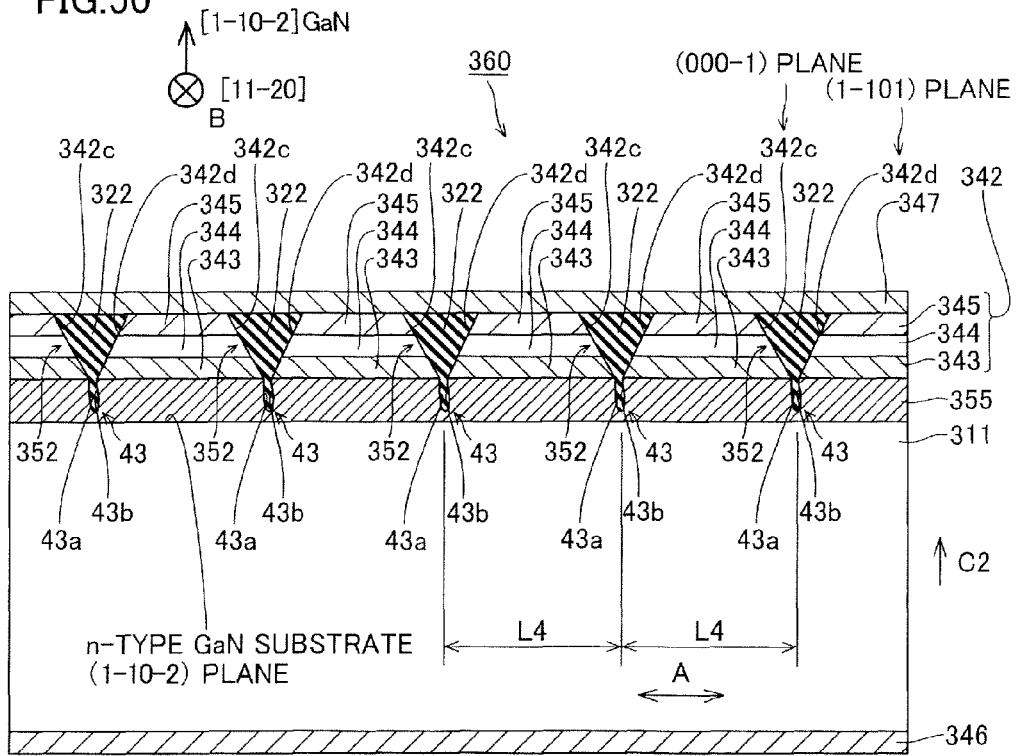
FIG. 50 A sectional view showing a structure of a light-emitting diode chip according to an eleventh embodiment of the present invention.

In the manufacturing process of the light-emitting diode chip 360 according to the eleventh embodiment, the underlayer 355 made of AlGaN having a critical thickness smaller than the thickness (about 3 μm to about 4 μm) described in the aforementioned tenth embodiment is grown on an n-type GaN substrate 311 (see FIG. 50). At this time, tensile stress R is caused inside the underlayer 355 due to action similar to the tenth embodiment. The critical thickness means a minimum thickness of the semiconductor layer in a case where no cracks resulting from difference between lattice constants is caused on the semiconductor layer when staking the semiconductor layer having a lattice constant different from the critical thickness.

Figure 51:
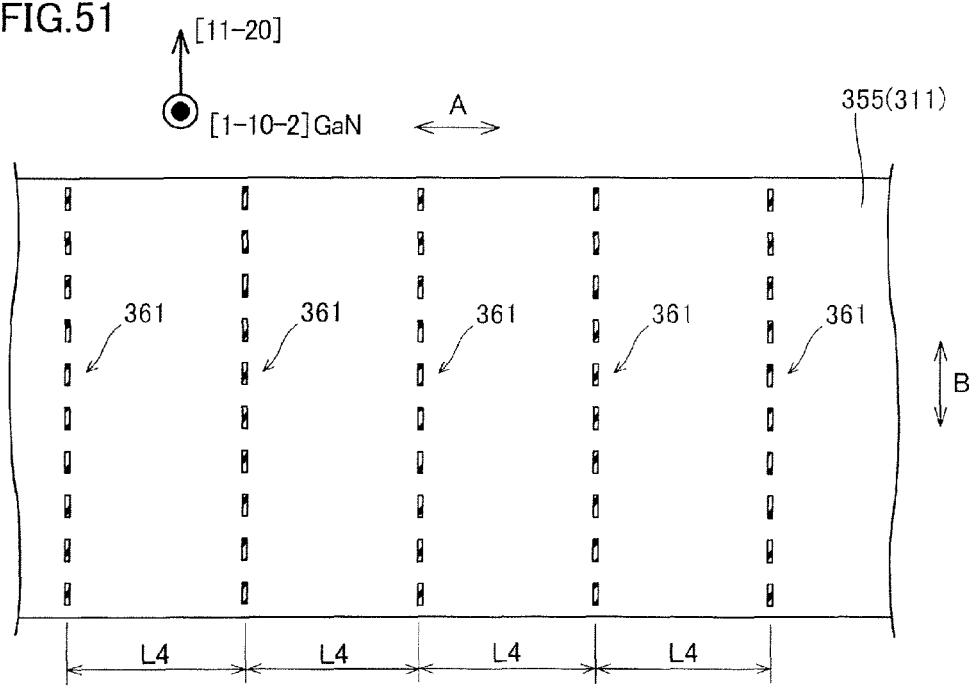
FIG. 51 A plan view for illustrating a manufacturing process of the light-emitting diode chip according to the eleventh embodiment shown in FIG. 50.

Thereafter, the skipped scribing cracks 361 are formed on the underlayer 355 in the [11-20] direction (direction B) orthogonal to the direction A at an interval of about 50 μm by a laser beam or a diamond point, as shown in FIG. 51. A plurality of the scribing cracks 361 are formed in the direction A at an interval L4. Thus, in the underlayer 355, formation of the cracks proceeds on regions of the underlayer 355 formed with no scribing crack 361 to starting from the skipped scribing cracks 361, as shown in FIG. 52. Consequently, substantially linear cracks 362 (see FIG. 52) dividing the underlayer 355 in the direction B are formed.

In this case, division of the scribing cracks 361 in a depth direction (direction perpendicular to the plane of FIG. 52) also proceeds. Thus, inner side surfaces 362a (shown by broken lines) reaching in the vicinity of an interface between the underlayer 355 and the n-type GaN substrate 311 are formed on the cracks 362. The inner side surface 362a is an example of the "first inner side surface of the recess portion" in the present invention.

An n-type cladding layer 343, a light-emitting layer 344 of MQW formed by stacking a well layer (not shown) made of $Ga_{0.7}In_{0.3}N$ having a thickness of about 2 nm and a barrier layer (not shown) of $Ga_{0.9}In_{0.1}N$, and a p-type cladding layer 345 are successively stacked on the underlayer 355 through a manufacturing process similar to the aforementioned tenth embodiment, thereby forming the light-emitting device layer 342.

At this time, crystal growth surfaces 342c formed by the (000-1) plane extending in a direction inclined by a prescribed angle with respect to a [1-10-2] direction (along arrow C2) of the n-type GaN substrate 311 and crystal growth surfaces 342d formed by a (1-101) plane extending in a direction inclined by a prescribed angle with respect to a [1-10-2] direction (along arrow C2) of the n-type GaN substrate 311 are formed on the light-emitting device layer 342 on the n-type GaN substrate 311. The crystal growth surfaces 342c and 342d are examples of the "first side surface" and the "second side surface" in the present invention, respectively.

The remaining manufacturing process of the eleventh embodiment is similar to that of the aforementioned tenth embodiment. Thus, the light-emitting diode chip 360 according to the eleventh embodiment shown in FIG. 50 is formed.

As hereinabove described, the manufacturing process of the eleventh embodiment comprises steps of forming the underlayer 355 on the n-type GaN substrate 311 to have substantially critical thickness when forming the cracks 362 and thereafter forming a plurality of the skipped scribing cracks 361 (with an interval of about 50 μm) extending in the [11-20] direction (direction B) in the direction A at an interval L4 in the underlayer 355. Thus, the cracks 362 with a regular interval are formed parallel to the direction B and along the direction A on the underlayer 355 to start from the skipped scribing cracks 361. In other words, the light-emitting diode chip 360 (see FIG. 50) having the same emission area can be more easily formed as in the aforementioned tenth embodiment, as compared with a case of stacking the semiconductor layer by utilizing voluntarily formed cracks. The remaining effects of the eleventh embodiment are similar to those of the aforementioned tenth embodiment.

Twelfth Embodiment

Figure 53:
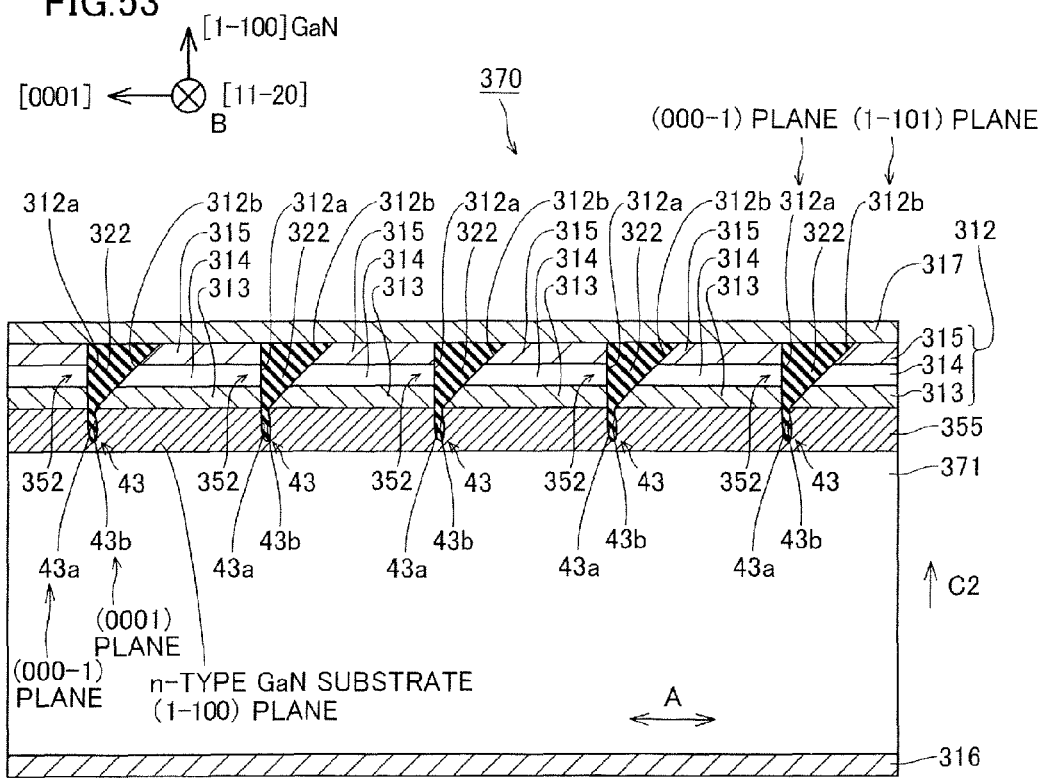
FIG. 53 A sectional view showing a structure of a light-emitting diode chip according to a twelfth embodiment of the present invention.

In a manufacturing process of a light-emitting diode chip 370 according to the twelfth embodiment, a case where a light-emitting device layer 312 is formed after forming an underlayer 355 made of AlGaN on the n-type GaN substrate 371 having a main surface formed by an m-plane ((1-100) plane) dissimilarly to the aforementioned ninth embodiment will be described with reference to FIGS. 10 and 53. The n-type GaN substrate 371 is an example of the "base substrate" in the present invention.

The light-emitting diode chip 370 according to the twelfth embodiment is constituted by a wurtzite structure nitride-based semiconductor having the m-plane ((1-100) plane) as a main surface. The shape of the light-emitting diode chip 370 is a square shape, a rectangular shape, a rhombus shape, a parallelogram shape or the like in plan view (as viewed from an upper side of the light-emitting diode chip 370).

In the manufacturing process of the light-emitting diode chip 370 according to the twelfth embodiment, the underlayer 355 made of $Al_{0.05}Ga_{0.95}N$ having a thickness of about 3 μm to about 4 μm is grown on the n-type GaN substrate 21 having a thickness of about 100 μm, as shown in FIG. 61. In this case, cracks 43 resulting from difference between lattice constants of the n-type GaN substrate 371 and the underlayer 355 are formed on the underlayer 355 similarly to the aforementioned tenth embodiment.

An n-type cladding layer 313 made of n-type $Al_{0.03}Ga_{0.97}N$ having a thickness of about 0.5 μm, a light-emitting layer 314 of MQW formed by stacking a well layer (not shown) made of $Ga_{0.7}In_{0.3}N$ having a thickness of about 2 nm and a barrier layer (not shown) of $Ga_{0.9}In_{0.1}N$, and a p-type cladding layer doubling as a p-type contact layer made of p-type GaN having a thickness of about 0.2 μm are successively stacked on the underlayer 355 through a manufacturing process similar to the aforementioned ninth embodiment, thereby forming the light-emitting device layer 312.

According to the twelfth embodiment, when the light-emitting device layer 312 is grown on the n-type GaN substrate 371, the light-emitting device layer 312 is crystal-grown on inner side surfaces 43a formed by the (000-1) planes of the cracks 43 extending in the [11-20] direction (direction B) while forming crystal growth surfaces 312a formed by the (000-1) plane extending in a [1-100] direction (along arrow C2) to start from the (000-1) planes of the cracks 40, similarly to the case of the crystal growth shown in FIG. 10. The light-emitting device layer 312 is crystal-grown on the (0001) plane (inner side surface 43b) opposed to the (000-1) planes of the cracks 43 while forming crystal growth surfaces (facets) 312d formed by the (1-101) planes extending in a direction inclined by a prescribed angle with respect to the [1-100] direction (along arrow C2). Thus, the crystal growth surfaces 312a form obtuse angles with respect to the upper surface (main surface) of the light-emitting device layer 312. The crystal growth surfaces 312c and 312d are examples of the "first side surface" and the "second side surface" in the present invention, respectively.

Also in the twelfth embodiment, insulating films 322 of $SiO_2$ or the like transparent for an emission wavelength are formed to fill up recess portions 320 (regions on the upper portions of the cracks 43, including the cracks 43) held between the crystal growth surfaces 312c ((000-1) plane) and 312b ((1-101) plane) of the light-emitting device layer 312.

The remaining manufacturing process of the twelfth embodiment is similar to that of the aforementioned ninth embodiment. Thus, the light-emitting diode chip 370 according to the twelfth embodiment shown in FIG. 53 is formed. The remaining effects of the light-emitting diode chip 370 according to the twelfth embodiment is similar to those of the aforementioned first and tenth embodiments.

Thirteenth Embodiment

In a light-emitting diode chip 380 according to a thirteenth embodiment, a case where a light-emitting device layer 392 is formed on an n-type 4H—SiC substrate 391 having a main surface formed by an m-plane ((1-100) plane) dissimilarly to the aforementioned ninth embodiment will be described with reference to FIG. 54. The n-type 4H—SiC substrate 391 and the light-emitting device layer 392 are examples of the "substrate" and the "nitride-based semiconductor layer" in the present invention, respectively.

The light-emitting diode chip 380 according to the thirteenth embodiment is constituted by a wurtzite structure nitride-based semiconductor having the m-plane ((1-100) plane) as a main surface. The shape of the light-emitting diode chip 380 is a square shape, a rectangular shape, a rhombus shape, a parallelogram shape or the like in plan view (as viewed from an upper side of the light-emitting diode chip 380).

Figure 54:
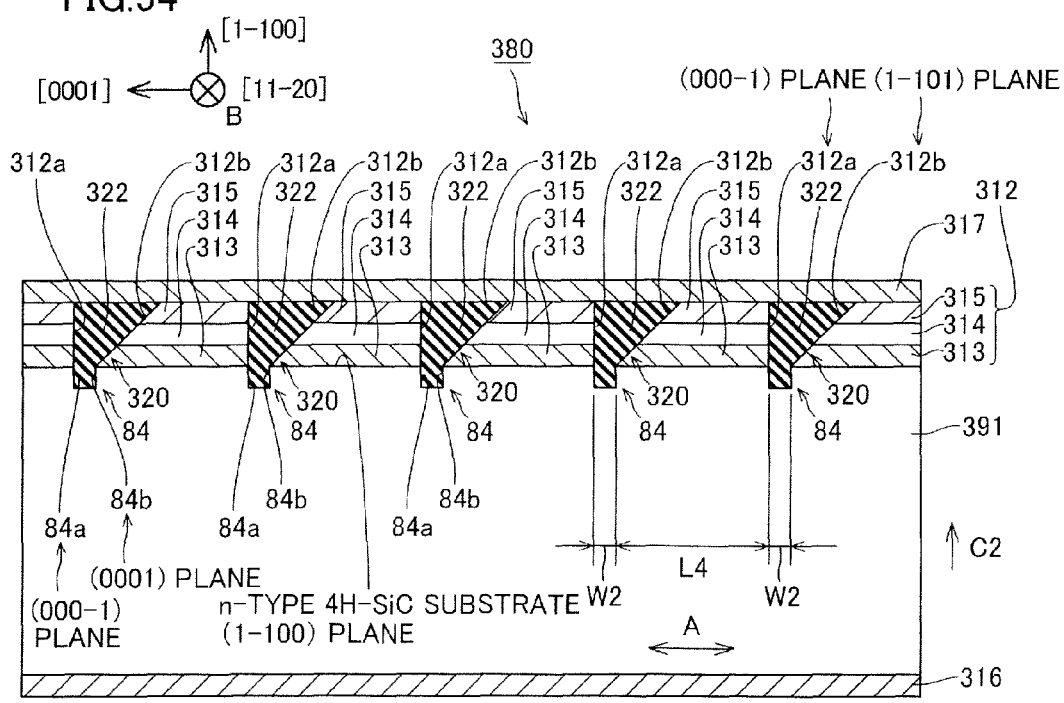
FIG. 54 A sectional view showing a structure of a light-emitting diode chip according to a thirteenth embodiment of the present invention.

The light-emitting diode chip 380 is formed with a light-emitting device layer 392 on the n-type 4H—SiC substrate 391 having a thickness of about 100 μm, as shown in FIG. 54. The light-emitting device layer 392 is formed with an n-type cladding layer 393 made of $Al_{0.03}Ga_{0.97}N$ having a thickness of about 0.5 μm and a light-emitting layer 394 formed by stacking a well layer (not shown) made of $Ga_{0.7}In_{0.3}N$ having a thickness of about 2 nm and a barrier layer (not shown) made of $Ga_{0.9}In_{0.1}N$. A p-type cladding layer 395 doubling as a p-type contact layer made of p-type GaN having a thickness of about 0.2 μm are formed on the light-emitting layer 394. The n-type cladding layer 393, the light-emitting layer 394 and the p-type cladding layer 395 are each an example of the "nitride-based semiconductor layer" in the present invention.

According to the thirteenth embodiment, recess portions 320 are formed from the n-type cladding layer 393 to the p-type cladding layer 395 by crystal growth surfaces 392a and 392b formed by (000-1) and (1-101) planes of the light-emitting device layer 392. The crystal growth surfaces 392a and 392b are examples of the "first side surface" and the "second side surface" in the present invention, respectively. The crystal growth surfaces 392a are formed to extend in a direction ([1-100] direction) substantially perpendicular to a main surface of the n-type 4H—SiC substrate 391 so as to start from inner side surfaces 84a formed by (000-1) planes of grooves 84 previously formed on the main surface of the n-type 4H—SiC substrate 391 in a manufacturing process. The crystal growth surfaces 392b are formed by inclined planes starting from inner side surfaces 84b of the grooves 84, and form obtuse angles with respect to an upper surface (main surface) of the light-emitting device layer 392. The groove 84 and the inner side surfaces 84a and 84b are examples of the "recess portion" and the "first inner side surface of the recess portion" and the "second inner side surface of the recess portion" in the present invention, respectively. In FIG. 54, only some of the grooves 84 are denoted by reference characters of the inner side surfaces 84a and 84b in the drawing because of illustration.

An n-side electrode 316 is formed on a lower surface of the n-type 4H—SiC substrate 391. The recess portions 320 are formed with insulating films 322, a translucent A-side electrode 317 is formed to cover the insulating films 322 of $SiO_2$ transparent for an emission wavelength and the p-type cladding layer 395.

The manufacturing process of the light-emitting diode chip 380 according to the thirteenth embodiment is similar to that of the aforementioned ninth embodiment. The effects of the thirteenth embodiment are also similar to those of the aforementioned ninth embodiment.

Fourteenth Embodiment

A structure of a nitride-based semiconductor laser device 400 formed by a method of forming a nitride-based semiconductor layer according to a fourteenth embodiment will be described with reference to FIGS. 55 and 56.

Figure 55:
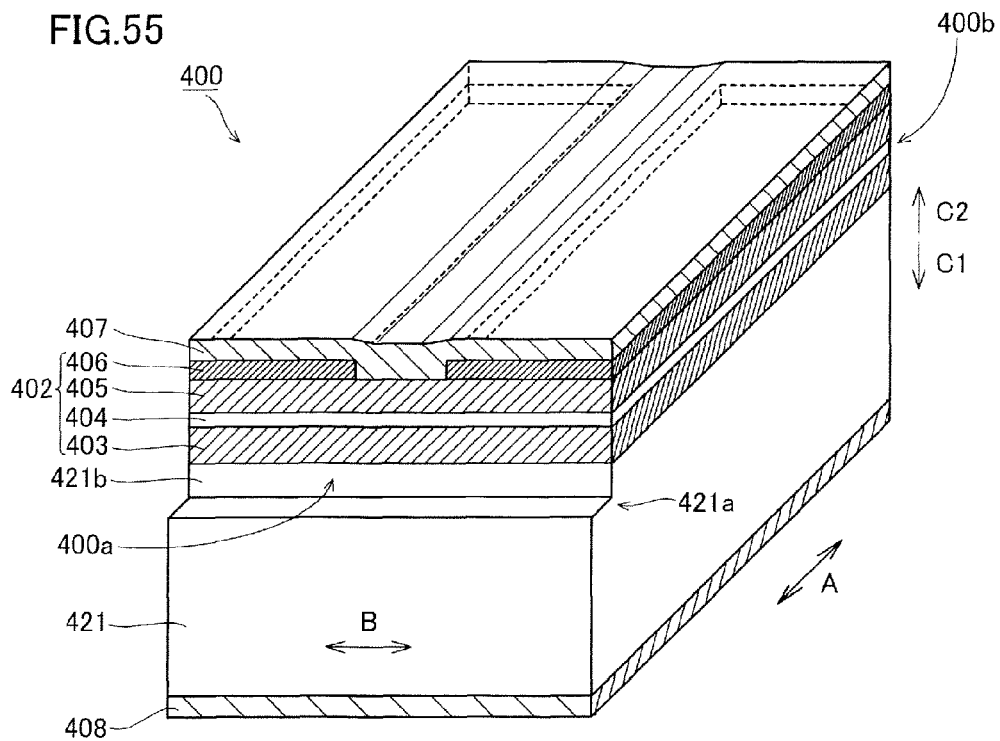
FIG. 55 A perspective view showing a structure of a nitride-based semiconductor laser device formed by a method of forming the nitride-based semiconductor layer according to a fourteenth embodiment of the present invention.
Figure 56:
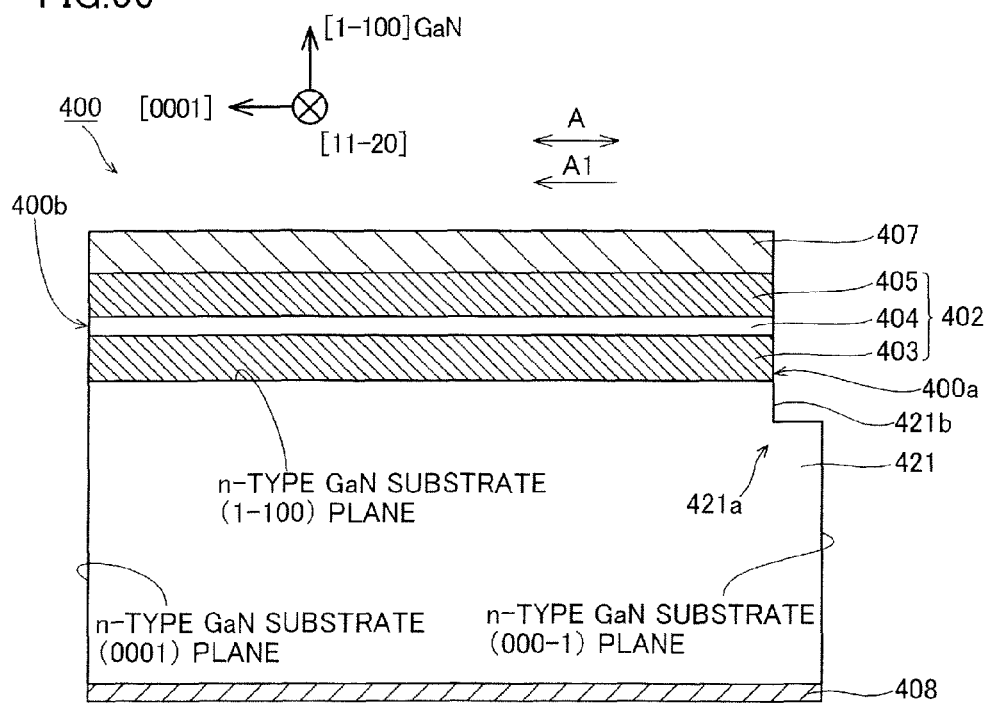
FIG. 56 A sectional view taken along a cavity direction of the semiconductor laser device, for illustrating the structure of the nitride-based semiconductor laser device shown in FIG. 55.

In the nitride-based semiconductor laser device 400 formed by the method of forming the nitride-based semiconductor layer according to the fourteenth embodiment, a step portion 421a is formed on a first end in a cavity direction (direction A) (end on a light-emitting surface 400a side), as shown in FIG. 55. A semiconductor laser device layer 402 having a thickness of about 3.1 μm is formed on an n-type GaN substrate 421 having a thickness of about 100 μm. The semiconductor laser device layer 402 has a cavity length of about 1560 μm and formed with the light-emitting surface 400a and a light-reflecting surface 400b substantially perpendicular to a main surface of the n-type GaN substrate 421 on the both ends in the cavity direction (direction A) which is a [0001] direction, as shown in FIG. 56. The n-type GaN substrate 421 and the semiconductor laser device layer 402 are examples of the "substrate" and the "nitride-based semiconductor layer" in the present invention, respectively, and the light-emitting surface 400a is an example of the "facet formed by a (000-1) plane" in the present invention.

According to the fourteenth embodiment, the semiconductor laser device layer 402 is formed on the main surface formed by the m-plane ((1-100) plane) which is a nonpolar face of the n-type GaN substrate 421. The step portion 421a of the n-type GaN substrate 421 has a facet 421b formed by a facet (growth surface) of the (000-1) plane substantially perpendicular to the main surface of the n-type GaN substrate 421. As shown in FIG. 56, the light-emitting surface 400a of the semiconductor laser device layer 402 is formed by a crystal plane formed by the (000-1) plane which has crystal-grown to start from the facet 421b of the n-type GaN substrate 421. The light-reflecting surface 400b of the semiconductor laser device layer 402 is formed by a c-plane ((0001) plane) which is a facet perpendicular to the [0001] direction (along arrow A1 in FIG. 56). The facet 421b is an example of the "(000-1) facet" in the present invention.

The semiconductor laser device layer 402 includes an n-type cladding layer 403 made of AlGaN having a thickness of about 3 μm and an active layer 404 formed by alternately stacking three quantum well layers made of InGaN having a thickness of about 75 nm and three barrier layers made of GaN, and a p-type cladding layer 405 made of AlGaN having a thickness of about 0.5 μm successively from a side closer to the upper surface of the n-type GaN substrate 421, as shown in FIG. 55. The n-type cladding layer 403, the active layer 404, the quantum well layer, the barrier layer and the p-type cladding layer 405 are each an example of the "nitride-based semiconductor layer" in the present invention.

As shown in FIG. 55, a current blocking layer 406 made of $SiO_2$ having a thickness of about 200 nm is formed on a prescribed region of an upper surface of the p-type cladding layer 405.

A p-side electrode 407 formed by a Pt layer having a thickness of about 5 nm, a Pd layer having a thickness of about 100 nm and an Au layer having a thickness of about 150 nm is formed on a region (vicinity of a central portion in the direction B in FIG. 55) formed with no current blocking layer 406 on the upper surface of the p-type cladding layer 405. The p-side electrode 407 is formed to cover an upper surface of the current blocking layer 406. A contact layer (not shown) preferably having a smaller band gap than the p-type cladding layer 405 may be formed between the p-type cladding layer 405 and the A-side electrode 407.

As shown in FIG. 55, an n-side electrode 408 formed by an A1 layer having a thickness of about 10 nm, a Pt layer having a thickness of about 20 nm and an Au layer having a thickness of about 300 nm is formed on a lower surface of the n-type GaN substrate 421 successively from a side closer to the n-type GaN substrate 421.

A manufacturing process of the nitride-based semiconductor laser device 400 formed by the method of forming the nitride-based semiconductor layer according to the fourteenth embodiment will be now described with reference to FIGS. 16 and 55 to 57.

Figure 57:
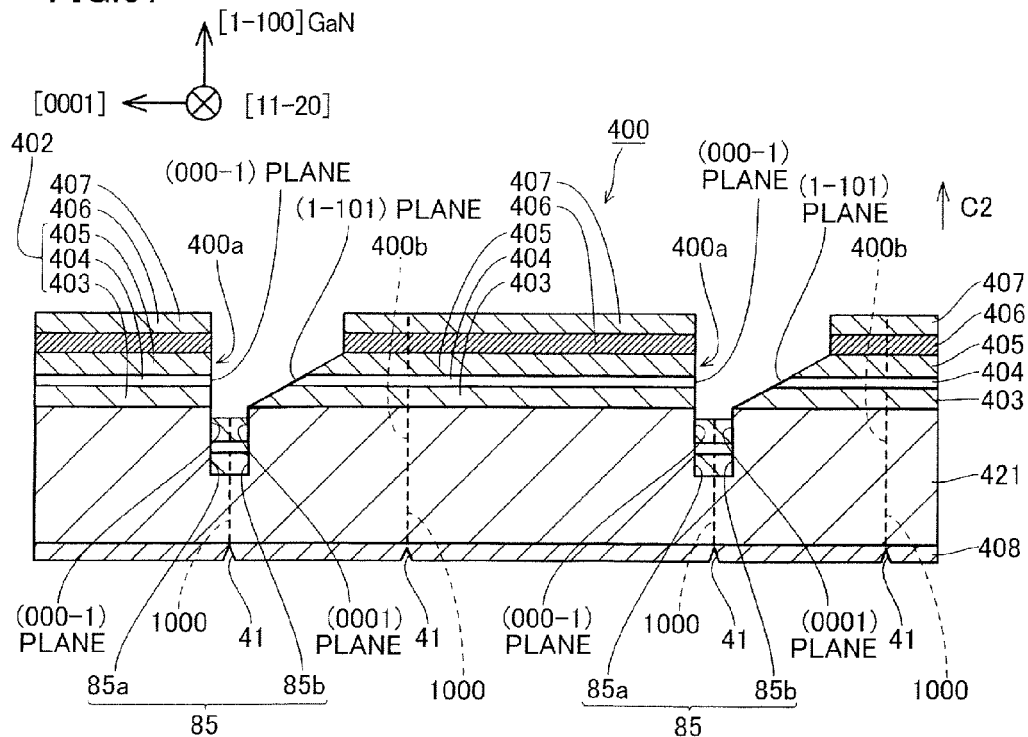
FIG. 57 A sectional view for illustrating a manufacturing process of the nitride-based semiconductor laser device formed by a method of forming a nitride-based semiconductor layer according to the fourteenth embodiment shown in FIG. 55.

As shown in FIG. 57, the grooves 85 having a width W1 (see FIG. 16) of about 40 μm in a [0001] direction (direction A) and a depth of about 2 μm and extending in a [11-20] direction (direction B) are formed on the main surface, formed by the a-plane ((11-20) plane), of the n-type GaN substrate 421 by etching. The grooves 85 are formed in a striped manner in the direction A (see FIG. 16) in a period of about 1600 μm (=W1+L2).

According to the fourteenth embodiment, the grooves 85 are formed with inner side surfaces 85a formed by facets of (000-1) planes substantially perpendicular to the (1-100) plane of the n-type GaN substrate 421 and inner side surfaces 85b formed by (0001) planes substantially perpendicular to the (1-100) plane of the n-type GaN substrate 421, as shown in FIG. 57. The inner side surface 85a is an example of the "(000-1) facet" in the present invention.

The n-type cladding layer 403, the active layer 404 and the p-type cladding layer 405 are successively stacked on the n-type GaN substrate 421 having the grooves 85 by MOCVD, thereby forming the semiconductor laser device layer 402.

According to the fourteenth embodiment, when the semiconductor laser device layer 402 is grown on the n-type GaN substrate 421, the semiconductor laser device layer 402 is crystal-grown on the inner side surfaces 85a of the grooves 80 extending in the direction B, while forming the (000-1) planes extending in a [1-100] direction (along arrow C2) to start from the inner side surfaces 85a, as shown in FIG. 57. Thus, the (000-1) plane of the semiconductor laser device layer 402 is formed as the light-emitting surface 400a of each pair of the cavity facets in the nitride-based semiconductor laser device 400. The semiconductor laser device layer 402 is crystal-grown while forming facets formed by (1-101) planes extending in a direction inclined at a prescribed angle with respect to the [1-100] direction (along arrow C2) on the (0001) planes (inner side surfaces 85b) opposed to the (000-1) planes of the grooves 85.

As shown in FIG. 55, resist patterns are formed on the upper surface of the p-type cladding layer 405 by photolithography and the resist patterns are thereafter employed as masks for dry etching, thereby forming the current blocking layer 406 made of $SiO_2$. As shown in FIGS. 55 and 56, the p-side electrodes 407 are formed on the current blocking layer 406 and the p-type cladding layer 405 formed with no current blocking layer 406 by vacuum evaporation. FIG. 56 shows a sectional structure along in the cavity direction (direction A) of the semiconductor laser device on the position formed with the current blocking layer 406.

As shown in FIG. 57, a lower surface of the n-type GaN substrate 421 is so polished that a thickness of the n-type GaN substrate 421 reaches a thickness of about 100 µm, and an n-side electrode 408 is thereafter formed on the lower surface of the n-type GaN substrate 421 by vacuum evaporation.

Linear scribing grooves 41 are so formed on positions corresponding to (000-1) semiconductor facets and positions to be formed with prescribed (0001) planes to extend parallel (in the direction B in FIG. 55) to the grooves 85 of the n-type GaN substrate 421 by laser scribing or mechanical scribing. In this state, the wafer is cleaved on the position of each scribing groove 41 by applying a load while fulcruming the lower surface side of the n-type GaN substrate 421 so that the surface (upper side) of the wafer opens, as shown in FIG. 57. Thus, the (0001) planes of the semiconductor laser device layer 402 are formed as the light-reflecting surfaces 400*b* of pairs of the cavity facets of the nitride-based semiconductor laser device 400. The n-type GaN substrate 421 on region corresponding to each groove 85 is divided along a cleavage line 1000 (broken lines) connecting the groove 85 and the corresponding to scribing groove 41. The grooves 85 of the n-type GaN substrate 421 become the step portions 421*a* (facets 421*b*) formed on lower portions of the light-emitting surfaces 400*a* after device division, as shown in FIG. 56.

The device is divided along the cavity direction (direction A) into chips, thereby forming the nitride-based semiconductor laser device 400 according to the fourteenth embodiment shown in FIG. 55.

As hereinabove described, the manufacturing process of the nitride-based semiconductor laser device 400 formed by the method of forming the nitride-based semiconductor layer according to the fourteenth embodiment comprises steps of forming the grooves 85 (inner side surfaces 85*a* formed by the facets of the (000-1) planes) substantially perpendicular to the main surface formed by the (1-100) plane of the n-type GaN substrate 421, and forming the semiconductor laser device layer 402 on the (1-100) plane of the n-type GaN substrate 421, whereby the semiconductor laser device layer 402 having the light-emitting surfaces 400*a* formed by the (000-1) planes can be formed to start from the facets (inner side surfaces 85*a*) of the (000-1) planes previously formed substantially perpendicular to the main surface of the n-type GaN substrate 421 when forming the semiconductor laser device layer 402 on the n-type GaN substrate 421. Thus, the semiconductor laser device layer 402 having the light-emitting surface 400*a* can be formed without a cleavage step. Further, flatness on the surface of the semiconductor laser device layer 402 can be improved by comprising the aforementioned step as compared with the growth layer surface of the semiconductor layer with no facets formed by the (000-1) planes.

In the manufacturing process of the nitride-based semiconductor laser device 400 formed by the method of forming the nitride-based semiconductor layer according to the fourteenth embodiment, the step of forming the semiconductor laser device layer 402 includes the step of forming the semiconductor laser device layer 402 having the facets formed by the (000-1) planes on the regions corresponding to the facets (inner side surfaces 85*a*) of the (000-1) planes formed on the n-type GaN substrate 421, whereby the facets (light-emitting surfaces 400*a*) on the (000-1) plane side in the structure of pairs of the cavity facets (combination of the (0001) and (000-1) planes) for improving gains of the semiconductor laser can be easily formed on the light-emitting device layer by utilizing crystal growth of the semiconductor laser device layer 402 when the semiconductor laser device layer 402 is formed on the n-type GaN substrate 421 having the main surface of the m-plane ((1-100) plane).

In the manufacturing process of the nitride-based semiconductor laser device 400 formed by the method of forming the nitride-based semiconductor layer according to the fourteenth embodiment, the n-type GaN substrate 421 is made of a nitride-based semiconductor of GaN, whereby the semiconductor laser device layer 402 having the light-emitting surfaces 400*a* formed by the (000-1) planes can be easily formed on the n-type GaN substrate 421 formed with the inner side surfaces 85*a* (facets 421*b*) formed by the facets of the (000-1) planes by utilizing crystal growth of the semiconductor layer.

In the manufacturing process of the nitride-based semiconductor laser device 400 formed by the method of forming the nitride-based semiconductor layer according to the fourteenth embodiment, the main surface of the n-type GaN substrate 421 is the m-plane ((1-100) plane), whereby the semiconductor laser device layer 402 is formed on the nonpolar face formed by the (1-100) plane, and hence a piezoelectric field caused in the semiconductor laser device layer 402 can be further reduced. Thus, the nitride-based semiconductor laser where luminous efficiency of a laser beam is improved can be formed.

In the manufacturing process of the nitride-based semiconductor laser device 400 formed by the method of forming the nitride-based semiconductor layer according to the fourteenth embodiment, the step of forming the (000-1) planes substantially perpendicular to the main surface of the n-type GaN substrate 421 includes the step of forming the grooves 85 extending in the striped manner in the direction B on the main surface of the n-type GaN substrate 421 and forming the inner side surfaces 85*a* formed by the (000-1) planes in plan view by etching, whereby the light-emitting surfaces 400*a* formed by the (000-1) planes of the semiconductor laser device layer 402 formed on the n-type GaN substrate 421 are formed to extend in the striped manner also in the direction B along the inner side surfaces 85*a* (facets of the (000-1) plane), extending in the striped manner in the direction B, of the n-type GaN substrate 421. Thus, the nitride-based semiconductor laser device 400 where the light-emitting surface 400*a* formed by the (000-1) plane is formed to smoothly extend in the direction B (see FIG. 55) in the wafer can be obtained.

Fifteenth Embodiment

In a manufacturing process of a nitride-based semiconductor laser device 450 formed by a method of forming a nitride-based semiconductor layer according to a fifteenth embodiment, a case where a semiconductor laser device layer 402 is formed after forming an underlayer 422 on an n-type GaN substrate 451 dissimilarly to the aforementioned fourteenth embodiment will be described with reference to FIGS. 58 and 59. The n-type GaN substrate 451 is an example of the "base substrate" in the present invention.

Figure 58:
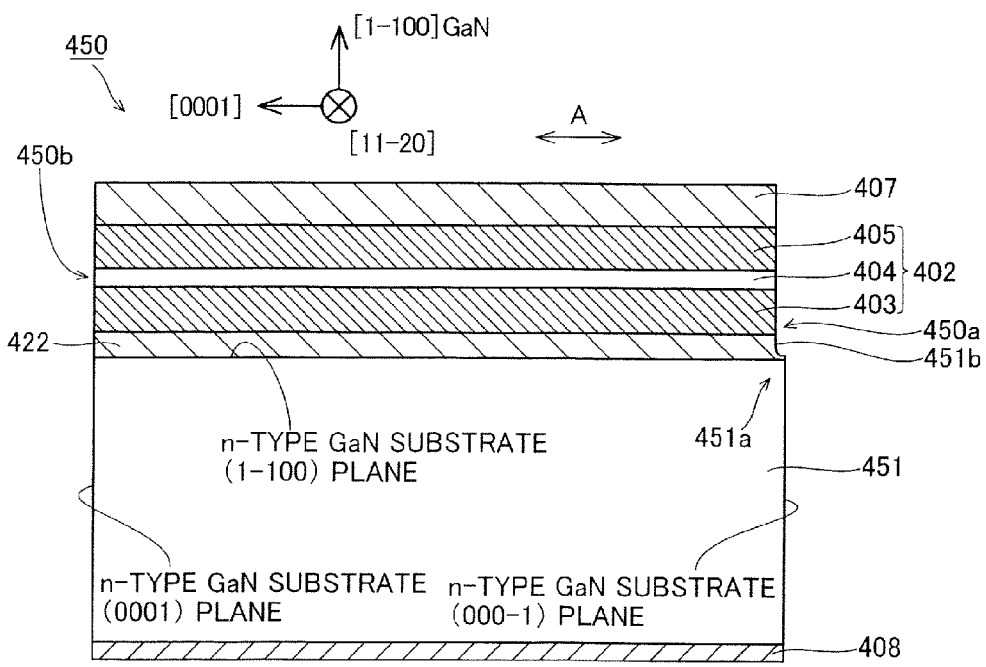
FIG. 58 A sectional view showing a structure of a nitride-based semiconductor laser device formed by a method of forming the nitride-based semiconductor layer according to a fifteenth embodiment of the present invention.

In the nitride-based semiconductor laser device 450 formed by the method of forming the nitride-based semiconductor layer according to the fifteenth embodiment, a step portion 451*a* is formed on a first end in a cavity direction (direction A) (end on a light-emitting surface 450*a* side), as shown in FIG. 58. The semiconductor laser device layer 402 having a structure similar to that of the fourteenth embodiment is formed on the n-type GaN substrate 451 having a main surface formed by a (1-100) plane. The semiconductor laser device layer 402 has a cavity length of about 1560 µm and formed with the light-emitting surface 450*a* and a light-reflecting surface 450*b* substantially perpendicular to the main surface of the n-type GaN substrate 451 on the both ends in the cavity direction (direction A) which is a [0001] direction. The light-emitting surface 450a is an example of the "facet formed by a (000-1) plane" in the present invention.

According to the fifteenth embodiment, the underlayer 422 is formed between the n-type GaN substrate 451 and the semiconductor laser device layer 402 as shown in FIG. 58, dissimilarly to the manufacturing process of the nitride-based semiconductor laser device 400 according to the aforementioned fourteenth embodiment. More specifically, cracks 45 are formed on the underlayer 422 by growing the underlayer 422 made of AlGaN having a thickness of about 3 μm to 4 μm on the n-type GaN substrate 451 by MOCVD, as shown in FIG. 59.

According to the fifteenth embodiment, when the cracks 45 are formed on the underlayer 422, inner side surfaces 45a formed by facets of the (000-1) planes of an AlGaN layer and reaching a (1-100) plane of an upper surface of the n-type GaN substrate 451 are formed on the cracks 45. The inner side surfaces 45a are formed substantially perpendicular to the main surface, formed by the (1-100) plane, of the n-type GaN substrate 451. The inner side surface 45a is an example of the "first surface of a crack" or the "(000-1) facet" in the present invention.

Figure 59:
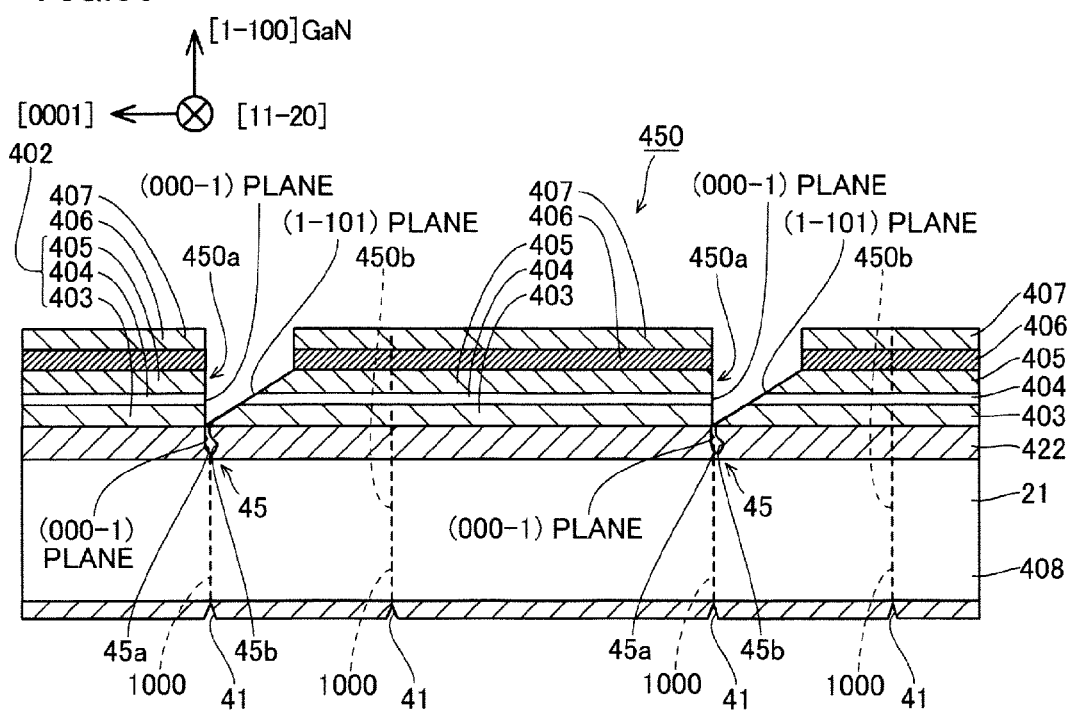
FIG. 59 A sectional view for illustrating a manufacturing process of the nitride-based semiconductor laser device formed by a method of forming the nitride-based semiconductor layer according to the fifteenth embodiment shown in FIG. 58.

As shown in FIG. 59, an n-type cladding layer 403, an active layer 404, a p-type cladding layer 405 and the like are successively stacked on the underlayer 422 through a manufacturing process similar to that of the fourteenth embodiment, thereby forming the semiconductor laser device layer 402.

According to the fifteenth embodiment, when the semiconductor laser device layer 402 is grown on the underlayer 422, the semiconductor laser device layer 402 is crystal-grown on the inner side surfaces 45a formed by the facets of the (000-1) planes of the cracks 45 extending in a striped manner in the direction B, while forming the (000-1) planes extending in a [1-100] direction (along arrow C2) to start from the inner side surfaces 45a, as shown in FIG. 59. Thus, the (000-1) plane of the semiconductor laser device layer 402 is formed as the light-emitting surface 450a of each pair of the cavity facets in the nitride-based semiconductor laser device 450. The semiconductor laser device layer 402 is crystal-grown on the inner side surface 45b opposed to the inner side surfaces 45a of the cracks 45 while forming facets formed by (1-101) planes extending in a direction inclined at a prescribed angle with respect to the [1-100] direction (along arrow C2).

A current blocking layer 406, a p-side electrode 407 and an n-side electrode 408 are successively formed through a manufacturing process similar to that of the fourteenth embodiment. As shown in FIG. 59, linear scribing grooves 41 are so formed on positions corresponding to (000-1) semiconductor facets on the lower surface side of the n-side electrode 408 and positions to be formed with prescribed (0001) planes to extend parallel to the cracks 40 of the n-type GaN substrate 451 by laser scribing or mechanical scribing. In this state, the wafer is cleaved on the position of each scribing groove 41 by applying a load while fulcruming the lower surface side of the n-type GaN substrate 451 so that the surface (upper side) of the wafer opens. Thus, the (0001) planes of the semiconductor laser device layer 402 are formed as the light-reflecting surfaces 450b of pairs of the cavity facets of the nitride-based semiconductor laser device 450. The n-type GaN substrate 451 on region corresponding to each crack 45 is divided along a cleavage line 1000 connecting the crack 45 and the corresponding scribing groove 41. The cracks 45 of the n-type GaN substrate 451 become the step portions 451a (facets 451b) formed on lower portions of the light-emitting surfaces 450a after device division, as shown in FIG. 58.

The device is divided along the cavity direction (direction A) into chips, thereby forming the nitride-based semiconductor laser device 450 according to the fifteenth embodiment shown in FIG. 58.

In the manufacturing process of the nitride-based semiconductor laser device 450 formed by the method of forming the nitride-based semiconductor layer according to the fifteenth embodiment, as hereinabove described, the step of forming the facets of the (000-1) planes substantially perpendicular to the main surface formed by the (1-100) plane of the n-type GaN substrate 451, including the underlayer 422 on the n-type GaN substrate 451 includes the step of forming the cracks 45 (inner side surfaces 45a formed by the (000-1) planes) following difference between lattice constants on the underlayer 422, whereby the semiconductor laser device layer 402 having the light-emitting surfaces 450a formed by the (000-1) planes can be easily formed to start from the inner side surfaces 45a by utilizing the inner side surfaces 45a (facets of the (000-1) planes) of the cracks 45 formed on the underlayer 422 when forming the semiconductor laser device layer 402 on the main surface of the n-type GaN substrate 451.

In the manufacturing process of the nitride-based semiconductor laser device 450 formed by the method of forming the nitride-based semiconductor layer according to the fifteenth embodiment, the underlayer 422 includes the AlGaN layer, and $c_1$ and $c_2$ satisfy the relation of $c_1 > c_2$ when lattice constants of the n-type GaN substrate 451 in the [0001] direction and the underlayer 422 in the [0001] direction are $c_1$ and $c_2$, respectively, whereby the lattice constant $c_2$ of the underlayer 422 in the [0001] direction is smaller than the lattice constant $c_1$ of the n-type GaN substrate 451 in the [0001] direction ($c_1 > c_2$) when the underlayer 422 made of AlGaN is formed on the n-type GaN substrate 451, and hence tensile stress R is caused inside the underlayer 422 in response to the lattice constant $c_1$ on the n-type GaN substrate 451 side. Consequently, when the thickness of the underlayer 422 is at least a prescribed thickness, the underlayer can not withstand this tensile stress R and hence the cracks 45 are formed on the underlayer along the (000-1) plane. Thus, the inner side surfaces 450a (facets of the (000-1) planes) which are the basis for forming the light-emitting surfaces 450a of the semiconductor laser device layer 402 on the underlayer 422 can be easily formed on the underlayer 422.

In the manufacturing process of the nitride-based semiconductor laser device 450 formed by the method of forming the nitride-based semiconductor layer according to the fifteenth embodiment, the step of forming the facets of the (000-1) planes substantially perpendicular to the main surface of the n-type GaN substrate 451 includes the step of forming the inner side surfaces 45a formed by the (000-1) planes formed substantially parallel to the (0001) plane substantially perpendicular to the main surface of the n-type GaN substrate 451 on the underlayer 422, whereby the semiconductor laser device layer 402 having the light-emitting surfaces 450a of the (000-1) planes can be easily formed to start from the facets (inner side surfaces 45a) of the (000-1) planes formed on the underlayer 422 due to difference between lattice constants when forming the semiconductor laser device layer 402 on the n-type GaN substrate 451. The remaining effects of the fifteenth embodiment are similar to those of the aforementioned fourteenth embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the example of forming the semiconductor laser device layer 23 (223) by the nitride-based semiconductor layer made of AlGaN, InGaN or the like has been shown in the nitride-based semiconductor laser device according to each of the aforementioned first to eighth embodiments, the present invention is not restricted to this but the semiconductor device layer 23 (223) may be formed by a wurtzite nitride-based semiconductor layer of AlN, InN, BN, TlN or an alloyed semiconductor of these.

While the example of forming the light-emitting device layer (light-emitting device layer 312, etc.) by the nitride-based semiconductor layer made of AlGaN, InGaN or the like has been shown in the light-emitting diode chip according to each of the aforementioned ninth to thirteenth embodiments, the present invention is not restricted to this but the light-emitting device may be formed by a wurtzite nitride-based semiconductor layer of AlN, InN, BN, TlN or an alloyed semiconductor of these.

While the example of employing the n-type GaN substrate made of GaN as the substrate and forming the underlayer made of AlGaN on the n-type GaN substrate has been shown in the nitride-based semiconductor laser device according to each of the aforementioned first embodiment, the aforementioned modification of the first embodiment, and the aforementioned third to eighth embodiments, the present invention is not restricted to this but an InGaN substrate may be employed as the substrate, and the underlayer made of GaN or AlGaN may be formed on the InGaN substrate.

While the example of employing the n-type GaN substrate as the base substrate and forming the underlayer made of AlGaN on the n-type GaN substrate has been shown in the light-emitting diode chip according to each of the aforementioned tenth to twelfth embodiments, the present invention is not restricted to this but an InGaN substrate may be employed as the base substrate, and the underlayer made of GaN or AlGaN may be formed on the InGaN substrate.

While the example of using the GaN substrate as the substrate has been shown in the nitride-based semiconductor laser device according to each of the aforementioned first to fourth embodiments, the present invention is not restricted to this but an r-plane ((1-102) plane) sapphire substrate formed by previously growing a nitride-based semiconductor having a main surface formed by an a-plane ((11-20) plane) or an a-plane SiC substrate or an m-plane SiC substrate formed by previously growing a nitride-based semiconductor having a main surface formed by an a-plane ((11-20) plane) or an m-plane ((1-100) plane) may be used, for example. Alternatively, a $LiAlO_2$ or $LiGaO_2$ substrate formed by previously growing the aforementioned nonpolar nitride-based semiconductor may be employed.

While the example of using the GaN substrate as the substrate has been shown in the light-emitting diode chip according to each of the aforementioned ninth to thirteenth embodiments, the present invention is not restricted to this but an r-plane ((1-102) plane) sapphire substrate formed by previously growing a nitride-based semiconductor having a main surface formed by an a-plane ((11-20) plane) or an a-plane SiC substrate or an m-plane SiC substrate formed by previously growing a nitride-based semiconductor having a main surface formed by an a-plane ((11-20) plane) or an m-plane ((1-100) plane) may be used, for example. Alternatively, a $LiAlO_2$ or $LiGaO_2$ substrate formed by previously growing the aforementioned nonpolar nitride-based semiconductor may be employed.

While the example of utilizing voluntary formation of the cracks on the underlayer by utilizing difference between the lattice constants of the n-type GaN substrate and the underlayer has been shown in the manufacturing process of the nitride-based semiconductor laser device according to each of the aforementioned first embodiment and the aforementioned modification of the first embodiment, the present invention is not restricted to this but scribing cracks may be formed only on both ends (regions corresponding to ends of the n-type GaN substrate 21 in the direction B) of the underlayer 22 in the direction B (see FIG. 6). Also according to this structure, cracks extending in the direction B can be introduced starting from the scribing cracks on the both ends.

While the example of utilizing voluntary formation of the cracks on the underlayer by utilizing difference between the lattice constants of the n-type GaN substrate and the underlayer has been shown in the light-emitting diode chip according to each of the aforementioned tenth and twelfth embodiments, the present invention is not restricted to this but scribing cracks may be formed only on both ends (regions corresponding to ends of the n-type GaN substrate 311 in the direction B) of the underlayer 355 in the direction B. Also according to this structure, cracks extending in the direction B can be introduced starting from the scribing cracks on the both ends.

While the example of forming the scribing cracks 361 for crack guide on the underlayer 355 in a skipped manner (at intervals of about 50 μm) has been shown in the light-emitting diode chip according to the aforementioned eleventh embodiment, the present invention is not restricted to this but the scribing cracks may be formed on the both ends (regions corresponding to the ends of the n-type GaN substrate 21) in the direction B of the underlayer 355. Also according to this structure, cracks extending in the direction B can be introduced starting from the scribing cracks on the both ends.

While the example of forming the nitride-based semiconductor laser device 100 by forming the semiconductor laser device layer on the n-type GaN substrate having the main surface formed by the m-plane ((1-100) plane) has been formed in the aforementioned third embodiment, the present invention is not restricted to this but the semiconductor laser device layer may be formed on the n-type GaN substrate having a main surface formed by an a-plane ((11-20) plane). In this case, the reflection surface reflecting a laser beam to the PD (optical sensor) is formed by a (11-22) plane. Therefore, the laser beam can be emitted while changing an emission direction to a direction substantially perpendicular to the PD (optical sensor) by fixing the nitride-based semiconductor laser device on the monitor PD-equipped submount having a main surface inclined at about 26° (corresponding to the angle $θ_4$ in FIG. 18).

While the example of forming the two-dimensional surface-emitting device by forming the semiconductor laser device layer on the n-type GaN substrate having the main surface formed by the m-plane ((1-100) plane) has been formed in the aforementioned fourth embodiment, the present invention is not restricted to this but the semiconductor laser device layer may be formed on the n-type GaN substrate having a main surface formed by an a-plane ((11-20) plane). In this case, the reflection surface reflecting a laser beam outward is formed by a (11-22) plane. Therefore, the laser beam can be emitted while changing an emission direction to a direction substantially perpendicular to the upper portion of the block portion by fixing the two-dimensional surface-emitting device on the block portion having an inclined plane inclined at about 26° (corresponding to the angle $θ_6$ in FIG. 22).

While the example of forming the ridge guided semiconductor laser where the upper cladding layer having the ridge portion is formed on the planar active layer and the dielectric blocking layer is formed on the side surfaces of the ridge has been shown in the nitride-based semiconductor laser device according to each of the aforementioned fifth to eighth, fourteenth and fifteenth embodiments, the present invention is not restricted to this but a ridge guided semiconductor laser having a blocking layer of a semiconductor, a semiconductor laser of an embedded heterostructure (BH) or a gain guided semiconductor laser prepared by forming a current blocking layer having an striped opening on planar upper cladding layer may be formed.

While the example of forming the nitride-based semiconductor laser device 220 by forming the semiconductor laser device layer 223 on the n-type GaN substrate 251 having the main surface formed by the (11-2-5) plane has been shown in the aforementioned sixth embodiment, the present invention is not restricted to this but the semiconductor laser device layer may be formed on an n-type GaN substrate having a main surface formed by a (1-10-4) plane. In this case, an inclined plane formed in the vicinity of a cavity facet on a light-emitting side is a facet formed by a (000-1) plane following crystal growth in formation of the semiconductor laser device layer. In this case, a light-reflecting surface is formed by a crystal growth surface formed by a (1-101) plane substantially perpendicular to the main surface of the n-type GaN substrate. An inclined angle of the inclined plane (facet) is about 65° with respect to a direction ([1-10-4] direction) perpendicular to the main surface of the n-type GaN substrate.

While the example of forming the nitride-based semiconductor laser device 235 by forming the semiconductor laser device layer 223 on the n-type GaN substrate 271 having the main surface formed by the (11-2-2) plane has been shown in the aforementioned seventh embodiment, the present invention is not restricted to this but the semiconductor laser device layer may be formed on an n-type GaN substrate having a main surface formed by a (1-10-1) plane. In this case, an inclined plane formed in the vicinity of a cavity facet on a light-emitting side is a facet formed by a (1-101) plane following crystal growth in formation of the semiconductor laser device layer, and an inclined plane formed on a light-reflecting surface side is a facet formed by the (000-1) plane. Inclined angles of the inclined planes (facet) on the light-emitting surface side and the light-reflecting surface side are about 34° and about 28° with respect to a direction ([1-10-1] direction) perpendicular to the main surface of the n-type GaN substrate, respectively.

While the example of employing the inclined planes 235d and 235e having the smaller inclined angles (angle $\theta_8$=about 27°) with respect to the direction ([11-2-2] direction) perpendicular to the main surface of the n-type GaN substrate as the light-emitting surface 235a and forming the light-reflecting surface 235b on the inclined planes 235i and 235j having the relatively larger inclined angles (angle $\theta_9$=about 32°) with respect to the [11-2-2] direction than the inclined planes 235d and 235e has been shown in the aforementioned seventh embodiment, the present invention is not restricted to this but the cavity facet on the sides of the inclined planes 235d and 235e may be employed as the light-reflecting surface and the cavity facet on the sides of the inclined planes 235i and 235j may be employed as the light-emitting surface (the relation of the inclined angles and the relation of the cavity facets are opposite to those described above). According to this structure, the inclined planes on the light-emitting surface side form sharper acute angles with respect to the main surface ((11-2-2) plane) of the n-type GaN substrate than the inclined planes on the light-emitting surface side, and hence a sectional area (region S in FIG. 25) of a heat radiation path from the n-type cladding layer 25 (see FIG. 25) on the light-emitting surface side to the n-type GaN substrate 271 side can be increased. Consequently, heat of an emitted laser beam can be more effectively radiated to the n-type GaN substrate 271 side.

While the example where the inclined planes 235g (etched surfaces) and 235i (facets) are formed to exist (remain) below the light-reflecting surfaces 235b (see FIG. 40) has been shown in the aforementioned seventh embodiment, the present invention is not restricted to this but dry etching in forming the light-reflecting surfaces 235b (see FIG. 40) may be performed so that the light-reflecting surfaces 235b reach inside the n-type GaN substrate 21. Thus, a nitride-based semiconductor laser device having a laser device structure similar to the nitride-based semiconductor laser device 240 (see FIG. 41) shown in the aforementioned fourth embodiment can be formed.

While the example of forming the grooves 321 on the main surface formed by the a-plane ((11-20) plane) of the n-type GaN substrate and crystal growing the light-emitting device layer 312 has been shown in the light-emitting diode chip according to the aforementioned ninth embodiment, the present invention is not restricted to this but the light-emitting device layer may be formed after forming the grooves (recess portions) on a main surface perpendicular to a (000±1) plane of the n-type GaN substrate such as an m-plane ((1-100) plane), for example.

While the example of utilizing voluntary formation of the cracks 40 on the underlayer 355 by utilizing difference between the lattice constants of the n-type GaN substrate 21 and the underlayer 355 has been shown in the light-emitting diode chip according to the aforementioned tenth embodiment, the present invention is not restricted to this but cracks, positions of which are controlled by forming skipped shaped scribing cracks on the underlayer on the n-type GaN substrate, may be formed similarly to the aforementioned third embodiment.

While the example where the (000-1) facet of the semiconductor laser device layer 402 is the light-emitting surface 400a (450a) and the (0001) facet is the light-reflecting surface 400b (450b) in the manufacturing process of the nitride-based semiconductor laser device formed by the method of forming the nitride-based semiconductor layer according to each of the aforementioned fourteenth and fifteenth embodiments, the present invention is not restricted to this but the (0001) facet may be the light-emitting surface and the (000-1) facet may be the light-reflecting surface.

While the example of employing the n-type GaN substrate 451 as the base substrate and forming the underlayer 422 made of AlGaN on the n-type GaN substrate 451 has been shown in the manufacturing process of the nitride-based semiconductor laser device formed by the method of forming the nitride-based semiconductor layer according to the aforementioned fifteenth embodiment, the present invention is not restricted to this but an InGaN substrate may be formed as the base substrate, and an underlayer made of GaN or AlGaN may be formed on the InGaN substrate.

While the example of utilizing voluntary formation of the cracks 45 on the underlayer by utilizing difference between the lattice constants of the n-type GaN substrate 451 and the underlayer 422 has been shown in the manufacturing process of the nitride-based semiconductor laser device formed by the method of forming the nitride-based semiconductor layer according to the aforementioned fifteenth embodiment, the present invention is not restricted to this but scribing cracks for crack guide may be formed on the underlayer 422 in a skipped manner. Also according to this structure, cracks extending in the direction B can be introduced starting from the skipped shaped scribing cracks. Further, the cracks extending in the direction B can be introduced starting from the scribing cracks on the said both ends also when the scribing cracks are formed on the both ends of the underlayer 422 in the direction B (regions corresponding to the ends of the n-type GaN substrate 451).

The invention claimed is:

1. A nitride-based semiconductor light-emitting diode comprising:
   a substrate formed with a recess portion on a main surface, and
   a nitride-based semiconductor layer having a light-emitting layer on said main surface and including a first side surface formed by a (000-1) plane formed to start from a first inner side surface of said recess portion and a second side surface formed on a region opposite to said first side surface with said light-emitting layer therebetween to start from a second inner side surface of said recess portion on said main surface.

2. The nitride-based semiconductor light-emitting diode according to claim 1, wherein
   said first inner side surface includes the (000-1) plane.

3. The nitride-based semiconductor light-emitting diode according to claim 1, wherein
   said first and second side surfaces are formed by crystal growth surfaces of said nitride-based semiconductor layer.

4. The nitride-based semiconductor light-emitting diode according to claim 1, wherein
   said second side surface is formed by a {A+B, A, −2A−B, 2A+B} plane (A and B satisfy A≥0 and B≥0, and at least either one of A and B is a nonzero integer).

5. The nitride-based semiconductor light-emitting diode according to claim 1, wherein
   said substrate is formed by a nitride-based semiconductor.

6. The nitride-based semiconductor light-emitting diode according to claim 1, wherein
   at least either said first or second side surface forms an obtuse angle with respect to said main surface.

7. The nitride-based semiconductor light-emitting diode according to claim 1, wherein
   said substrate includes a base substrate and an underlayer made of AlGaN formed on said base substrate,
   where lattice constants of said base substrate and said underlayer are $c_1$ and $c_2$ respectively, $c_1$ and $c_2$ satisfy relation of $c_1 > c_2$,
   said underlayer includes a crack,
   said crack extends substantially parallel to said main surface and a (0001) plane of said underlayer,
   said crack has a first inner side surface and a second inner side surface, and
   said first and second side surfaces start from said first and second inner side surfaces, respectively.

8. A method of manufacturing a nitride-based semiconductor light-emitting device, comprising steps of:
   forming recess portions on a main surface of a substrate; and
   forming a nitride-based semiconductor device layer having a light-emitting layer by growing facets of a (000-1) plane of a nitride-based semiconductor on regions corresponding to first side surfaces of said recess portions; and by growing reflection surfaces comprising of growth surfaces of said nitride-based semiconductor device layer; wherein said main surface of said substrate comprises of a (H, K, −H−K, 0) plane;
   further wherein said recess portions extend in a striped manner in a [K, −H, −K+H, 0] direction within said main surface of said substrate;
   further wherein said light-emitting layer has a main surface comprising of a (H, K, −H−K, 0) plane;
   further wherein said reflection surfaces are grown on regions opposed to said facets; and extends to form a prescribed angle with said facets.

9. The method of manufacturing a nitride-based semiconductor light-emitting device according to claim 8, wherein
   said first side surfaces of said recess portions are formed by (000-1) planes.

* * * * *